United States Patent
Tokuyama et al.

(10) Patent No.: US 8,634,220 B2
(45) Date of Patent: Jan. 21, 2014

(54) POWER CONVERSION APPARATUS

(71) Applicant: Hitachi, Ltd., Tokyo (JP)

(72) Inventors: Takeshi Tokuyama, Hitachi (JP); Kinya Nakatsu, Hitachinaka (JP); Ryuichi Saito, Hitachi (JP)

(73) Assignee: Hitachi, Ltd., Tokyo (JP)

( * ) Notice: Subject to any disclaimer, the term of this patent is extended or adjusted under 35 U.S.C. 154(b) by 0 days.

(21) Appl. No.: 13/951,959

(22) Filed: Jul. 26, 2013

(65) Prior Publication Data

US 2013/0314963 A1 Nov. 28, 2013

Related U.S. Application Data

(63) Continuation of application No. 13/273,162, filed on Oct. 13, 2011, now Pat. No. 8,503,209, which is a continuation of application No. 12/019,990, filed on Jan. 25, 2008, now Pat. No. 8,064,234.

(30) Foreign Application Priority Data

Feb. 7, 2007 (JP) .................................. 2007-028303

(51) Int. Cl.
*H05K 5/04* (2006.01)
*H05K 7/20* (2006.01)

(52) U.S. Cl.
USPC ............ 363/141; 363/131; 361/676; 361/707

(58) Field of Classification Search
USPC ........... 180/41, 54.1; 361/676, 690, 704, 707, 361/710; 363/133, 132, 141, 307
See application file for complete search history.

(56) References Cited

U.S. PATENT DOCUMENTS

| | | | |
|---|---|---|---|
| 5,901,036 A | 5/1999 | Arz | |
| 7,400,487 B1* | 7/2008 | Bitar | 361/232 |
| 7,456,602 B2* | 11/2008 | Hampo et al. | 318/800 |
| 7,567,446 B2* | 7/2009 | Sugino et al. | 363/37 |
| 7,800,921 B2* | 9/2010 | Zhu et al. | 363/17 |
| 7,839,641 B2 | 11/2010 | Baba et al. | |
| 7,886,811 B2 | 2/2011 | Higashiyama | |
| 8,159,823 B2* | 4/2012 | Murakami | 361/716 |
| 8,203,839 B2 | 6/2012 | Dede | |
| 8,400,775 B2* | 3/2013 | Ward et al. | 361/763 |

(Continued)

FOREIGN PATENT DOCUMENTS

| | | |
|---|---|---|
| JP | 2005-175163 | 6/2005 |
| JP | 2005-237141 | 9/2005 |
| JP | 2006-202899 | 8/2006 |
| JP | 2007-053295 | 3/2007 |

*Primary Examiner* — Adolf Berhane
*Assistant Examiner* — Nusrat Quddus
(74) *Attorney, Agent, or Firm* — Brundidge & Stanger, P.C.

(57) ABSTRACT

Technology leading to a size reduction in a power conversion apparatus comprising a cooling function and technology relating to enhancing productivity and enhancing reliability necessary for commercial production are provided. Series circuits comprising an upper arm and lower arm of an inverter circuit are built in a single semiconductor module 500. The semiconductor module has cooling metal on two sides. An upper arm semiconductor chip and lower arm semiconductor chip are wedged between the cooling metals. The semiconductor module is inserted inside a channel case main unit 214. A DC positive electrode terminal 532, a DC negative electrode terminal 572, and an alternating current terminal 582 of a semiconductor chip are disposed in the semiconductor module. The DC terminals 532 and 572 are electrically connected with a terminal of a capacitor module. The alternating current terminal 582 is electrically connected with a motor generator via an AC connector.

4 Claims, 34 Drawing Sheets

(56) References Cited

U.S. PATENT DOCUMENTS

| | | |
|---|---|---|
| 2005/0270745 A1 | 12/2005 | Chen et al. |
| 2006/0243422 A1 | 11/2006 | Sakai et al. |
| 2007/0096278 A1 | 5/2007 | Nakatsu et al. |
| 2008/0066888 A1 | 3/2008 | Tong et al. |
| 2008/0186751 A1 | 8/2008 | Tokuyama et al. |
| 2010/0108416 A1* | 5/2010 | Lind .......................... 180/65.31 |

* cited by examiner

Inductance-reduction effect / descriptive circuit diagram (Laminate effect, Overcurrent effect)

POWER CONVERSION APPARATUS

This application is a continuation application of U.S. application Ser. No. 13/273,162, filed Oct. 13, 2011, which is a continuation application of U.S. application Ser. No. 12/019,990, filed on Jan. 25, 2008, now U.S. Pat. No. 8,064,234, the entirety of which are incorporated herein by reference.

BACKGROUND OF THE INVENTION

1. Field of the Invention

The present invention relates to a power conversion apparatus comprising an inverter circuit.

2. Background Art

As conventional technology that is designed to improve heat dissipation properties by efficiently conducting heat from a semiconductor module to a cooler, for example, a cooling structure disclosed in JP Patent Publication (Kokai) No. 2005-175163A has been proposed. According to JP Patent Publication (Kokai) No. 2005-175163A, a semiconductor module is inserted into a hole for module insertion that is formed at a cooler to dissipate heat from an abutting surface of the hole for module insertion. The surface that abuts with the hole for module insertion of the semiconductor module is coated with a soft metal layer to dissipate heat to the cooler through the soft metal layer.

Further, as conventional technology designed to achieve compatibility between assemblability and cooling efficiency of a semiconductor device used in an inverter, for example, the inverter device described in JP Patent Publication (Kokai) No. 2005-237141A has been proposed. According to JP Patent Publication (Kokai) No. 2005-237141A, a structure is disclosed in which are formed accommodating portions that accommodate power cards on which both sides of semiconductor devices are sandwiched by heat radiating plates and recycling path portions that recycle coolant around the power cards. In this structure, gaps between the power cards and the accommodating portions are filled with an insulating resin, and the insulating resin is cured to fix the power cards.

Furthermore, an example of the conventional technology for a cooling structure designed to reduce the burden of assembling a semiconductor module and enhance cooling performance is proposed in JP Patent Publication (Kokai) No. 2006-202899A. According to JP Patent Publication (Kokai) No. 2006-202899A, a block is provided that accommodates a semiconductor module therein and that has heat radiating surfaces that release Joule heat that is generated in the semiconductor at a front surface and a rear surface. By inserting the block into a cooling water passage that is formed inside a case, the front surface and the rear surface of the block face the cooling water passage.

SUMMARY OF THE INVENTION

In recent years, for example with respect to automobiles, electric motorization of respective on-vehicle systems of vehicles, beginning with the vehicle drive system, has been progressing. However, for electric motorization of an on-vehicle system it is necessary to newly add electrical equipment that drives a member to be driven and a power conversion apparatus that controls the driving of a dynamo-electric machine by controlling power that is supplied to the dynamo-electric machine from an on-vehicle electrical supply. It is also necessary to replace component parts of the conventional system.

A power conversion apparatus has, for example in a vehicle, a function of converting direct-current power that is supplied from an on-vehicle electrical supply into alternating current power for driving a dynamo-electric machine, or converting alternating current power generated by a dynamo-electric machine into direct-current power for supply to an on-vehicle electrical supply. Although the amounts of electric power to be converted by power conversion apparatuses are tending to increase, since there is a tendency towards making vehicles more compact and lightweight overall, increases in the size and weight of power conversion apparatuses are being suppressed. Further, in comparison to power conversion apparatuses for industrial use, power conversion apparatuses for vehicle use are required to be used in environment with large temperature variations. Power conversion apparatuses for vehicles are thus required that can convert a relatively large amount of power with a comparatively small size and that can maintain high reliability while installed in a high temperature environment.

A power conversion apparatus comprises an inverter circuit. Power conversion between direct-current power and alternating current power is performed by operation of the inverter circuit. To perform this power conversion it is necessary for a power semiconductor that constitutes the inverter circuit to repeat switching operations (changeover operations) between a cutoff state and a conducting state. A large amount of heat is generated at the power semiconductor when performing the changeover operations. The temperature of a semiconductor chip that is a power semiconductor of the inverter circuit increases due to the heat the semiconductor chip generates at the time of a switching operation. Therefore, suppressing this temperature increase is an important issue.

Since the amount of generated heat of a semiconductor chip increases when the power to be converted increases, as a countermeasure it is necessary to increase the semiconductor chip size or the number of semiconductor chips used, and as a result the size of the power conversion apparatus increases. A configuration in which the cooling efficiency of a semiconductor chip is enhanced may be considered as one method that suppresses this kind of increase in size of the power conversion apparatus. For example, JP Patent Publication (Kokai) Nos. 2005-175163A, 2005-237141A, and 2006-202899A have been proposed as methods to enhance the cooling efficiency of semiconductor chips.

Although it is clear that enhancing the cooling efficiency of semiconductor chips leads to a increased compactness of the semiconductor chips, it is difficult to say that this always leads to suppression of an increase in the size of the overall power conversion apparatus. For example, it can be considered that when an improvement is made to increase the cooling efficiency of semiconductor chips, the overall configuration of the power conversion apparatus becomes complicated as a result, and cases may arise in which although the size of the semiconductor chips can be reduced, it is not really possible to reduce the size of the overall power conversion apparatus.

Accordingly, in order to suppress an increase in the size of the overall power conversion apparatus, it is necessary to enhance the cooling efficiency of the semiconductor chips in a manner that takes the overall power conversion apparatus into consideration, and it is necessary to suppress as much as possible electrical or mechanical complexities in the overall power conversion apparatus. It is hard to say that the inventions disclosed in the above described JP Patent Publication (Kokai) Nos. 2005-175163A, 2005-237141A, and 2006-202899A give adequate consideration to reducing the size of the overall power conversion apparatus.

An object of the present invention is to provide technology that leads to a reduction in the size of power conversion apparatuses. Further, a power conversion apparatus according to an embodiment of the present invention as described hereunder includes improvements relating not only to size-reduction technology but also to enhancing the reliability required for commercial production and enhancing productivity.

One of the fundamental features of the present invention for solving the foregoing problems is that a series circuit comprising an upper arm and a lower arm of an inverter circuit is built inside a single semiconductor module, the semiconductor module has a cooling metal on both sides, an upper arm semiconductor chip and a lower arm semiconductor chip for constituting the series circuit having the upper arm and the lower arm are inserted between the cooling metals, and the semiconductor module is inserted into a cooling channel.

The power conversion apparatus according to the embodiment of the present invention as described hereunder solves many of the problems required for commercial production. These problems and means for solving the problems are described in detail hereunder, and examples of means for solving the problems chiefly include the following configuration examples:

A power conversion apparatus, having:

a channel case having a cooling channel built therein, a two-sided cooling semiconductor module having built therein an upper and lower arm series circuit of an inverter circuit, a capacitor module, a direct-current (DC) connector, and an alternative-current (AC) connector, wherein:

the two-sided cooling semiconductor module has a first and a second heat radiating metal in which an outside surface is a heat radiating surface, the upper and lower arm series circuit being hermetically disposed between the first and second heat radiating metals, and having a direct-current (DC) positive electrode terminal, a direct-current (DC) negative electrode terminal, and an alternating current terminal that protrude externally;

an opening is provided in the channel case, and a plurality of the two-sided cooling semiconductor modules are disposed such that first and a second heat radiating metals of the two-sided cooling semiconductor modules are inserted inside the cooling channel from the opening;

insulating members are respectively disposed on an inside surface side of the first and second heat radiating metals of the two-sided cooling semiconductor module, and a plurality of semiconductor chips for constituting an upper and lower arm series circuit are disposed between the insulating members;

on the inside of the two-sided cooling semiconductor module are respectively disposed a direct-current (DC) positive electrode conductor, a direct-current (DC) negative electrode conductor, and an alternating current conductor that electrically connect, respectively, the plurality of semiconductor chips and the DC positive electrode terminal, the DC negative electrode terminal, and the alternating current terminal; and the DC positive electrode terminal and the DC negative electrode terminal of the two-sided cooling semiconductor module are respectively electrically connected to a terminal of the capacitor module and electrically connected to the DC connector, and the alternating current terminals of the plurality of two-sided cooling semiconductor modules are respectively electrically connected to the AC connector.

Further, a power conversion apparatus, having:

a channel case having a cooling channel built therein, a two-sided cooling semiconductor module having built therein an upper and lower arm series circuit of an inverter circuit, and a capacitor module, wherein:

the two-sided cooling semiconductor module has a first and a second heat radiating metal having heat radiating fins on one surface, the upper and lower arm series circuit being hermetically disposed between the first and second heat radiating metals, and has a DC positive electrode terminal, a DC negative electrode terminal, and an alternating current terminal that protrude externally;

in the two-sided cooling semiconductor module, the first and second heat radiating metals are opposingly disposed such that heat radiating surfaces face outward relative to each other at an interval that is shorter than a length along a cooling channel of the heat radiating metals, the DC positive electrode terminal, the DC negative electrode terminal, and the alternating current terminal protrude from a side that is sandwiched between the first and second heat radiating metals, and the DC positive electrode terminal and the DC negative electrode terminal are opposingly disposed;

a plurality of openings are provided in the channel case, and a plurality of the two-sided cooling semiconductor modules are disposed such that the heat radiating metals of the two-sided cooling semiconductor modules are respectively inserted inside the cooling channel from the plurality of openings;

in the two-sided cooling semiconductor module, insulating members are respectively disposed on another surface of the opposing first and second heat radiating metals, a plurality of semiconductor chips for constituting the upper and lower arm series circuit are disposed on the inside of the insulating members, and a semiconductor chip acting as the upper arm and a semiconductor chip acting as the lower arm are disposed in a staggered fashion with respect to each other in an insertion direction from the opening of the two-sided cooling semiconductor module;

on the inside of the two-sided cooling semiconductor module are further disposed a DC positive electrode conductor, a DC negative electrode conductor, and an alternating current conductor that electrically connect, respectively, the upper and lower arm series circuit and the DC positive electrode terminal, the DC negative electrode terminal, and the alternating current terminal; and the DC positive electrode terminal and the DC negative electrode terminal of the two-sided cooling semiconductor module are respectively electrical connect with a terminal of the capacitor module.

Further, a power conversion apparatus, having:

a channel case having a cooling channel built therein, a two-sided cooling semiconductor module having built therein an upper and lower arm series circuit of an inverter circuit, and a capacitor module, wherein:

the two-sided cooling semiconductor module has a first and a second heat radiating metal having heat radiating fins on one surface, has respective insulating members on another surface of the first and second heat radiating metals, the upper and lower arm series circuit being disposed between the respective insulating members, and has a DC positive electrode terminal, a DC negative electrode terminal, an alternating current terminal, and a signal terminal that protrude externally;

in the two-sided cooling semiconductor module, the first and second heat radiating metals are disposed such that the respective insulating members face each other at an interval that is shorter than a length along a cooling channel of the heat radiating metals, the DC positive electrode terminal, the DC negative electrode terminal, the alternating current terminal, and the signal terminal protrude from a side that is perpendicular with a plane of the respective insulating members, and the DC positive electrode terminal and the DC negative electrode terminal are opposingly disposed;

a plurality of openings are provided in the channel case, and the two-sided cooling semiconductor modules are respectively inserted inside the cooling channel from the plurality of openings such that a plurality of the two-sided cooling semiconductor module are retained in the channel case;

a plurality of semiconductor chips for constituting an upper and lower arm series circuit are disposed between the insulating members that are respectively provided on the other surface of the first and second heat radiating metals of the two-sided cooling semiconductor module;

a heat conduction path is formed through the insulating members between surfaces of the semiconductor chip acting as the upper arm and the semiconductor chip acting as the lower arm of the upper and lower arms and respectively opposing other surfaces of the first and second heat radiating metals;

inside the two-sided cooling semiconductor module are further disposed a DC positive electrode conductor, a DC negative electrode conductor, an alternating current conductor, and a signal conductor that electrically connect the plurality of semiconductor chips acting as the upper and lower arms and the DC positive electrode terminal, the DC negative electrode terminal, the alternating current terminal, and the signal terminal, respectively; and the DC positive electrode terminal and the DC negative electrode terminal of the two-sided cooling semiconductor module are respectively electrically connected with a terminal of the capacitor module.

Further, a power conversion apparatus, having:

a channel case having built therein a cooling channel having a plurality of insertion openings, a semiconductor module having built therein an upper and lower arm series circuit of an inverter circuit and which is inserted into the cooling channel from the insertion opening, and a capacitor module; wherein:

the plurality of insertion openings are formed in a parallelly disposed condition in the cooling channel;

a plurality of the semiconductor modules are parallelly disposed and retained in the channel case such that each of the semiconductor modules is inserted into the cooling channel from the parallelly disposed insertion openings;

the semiconductor module has a first and a second heat radiating metal having a heat radiating surface provided at one surface and an insulating member provided at another surface in a state in which the respective heat radiating surfaces are parallelly disposed so as to face outward with respect to each other, has an upper arm semiconductor chip and a lower arm semiconductor chip that constitute the upper and lower arm series circuit in a hermetically sealed state between the respective insulating members that are provided in the first and second heat radiating metals and, further, has a control terminal for controlling the lower arm semiconductor chip, a control terminal for controlling the upper arm semiconductor chip, an alternating current terminal, a DC negative electrode terminal, and a DC positive electrode terminal that protrude externally;

in the insulating member of the first heat radiating metal are provided a first conductor for serial connection and a positive electrode side conductor electrically connecting to the DC positive electrode terminal, in the insulating member of the second heat radiating metal are provided a second conductor for serial connection and a negative electrode side conductor electrically connecting to the DC negative electrode terminal, the positive electrode side conductor and the second conductor being opposingly disposed, and the negative electrode side conductor and the first conductor being opposingly disposed; and one of the semiconductor chips for the upper and lower arms is disposed between the positive electrode side conductor and the second conductor, and an other of the semiconductor chips for the upper and lower arms is disposed between the negative electrode side conductor and the first conductor, with the first conductor, the second conductor, and the alternating current terminal being electrically connected.

Further, a power conversion apparatus, having:

a channel case having cooling channels that are looped back a plurality of times and formed in parallel; and a plurality of semiconductor modules having an upper and lower arm series circuit of an inverter circuit built therein, a DC positive electrode terminal, a DC negative electrode terminal, and an alternating current terminal, and a capacitor module having a capacitor built therein; wherein:

in the channel case, a plurality of openings that respectively communicate with the parallelly formed cooling channels are formed in a parallel positional relationship, the semiconductor modules are respectively inserted into the plurality of openings, the plurality of semiconductor modules are fixed in a parallelly disposed positional relationship, and the capacitor module is fixed in the channel case in a disposition relationship in which the capacitor module is disposed along an axis of parallel disposition of the semiconductor modules; and the DC positive electrode terminal, the DC negative electrode terminal, and the alternating current terminal of the semiconductor module are disposed such that the DC positive electrode terminal and the DC negative electrode terminal of the semiconductor module are disposed between the capacitor module and the alternating current terminal of a plurality of the semiconductor modules that are parallelly disposed, and the DC positive electrode terminal and the DC negative electrode terminal of the semiconductor module are electrically connected, respectively, with a terminal of the capacitor module.

According to the present invention, the cooling efficiency of a semiconductor chip constituting an inverter circuit can be enhanced. This enhancement of cooling capability leads not merely to a reduction in the size of the semiconductor module, but also to a reduction in the size of the overall inverter device.

In addition to a reduction in size that is the above described effect of the present invention, the power conversion apparatus according to the embodiment of the present invention also achieves effects that overcome many problems as required for commercial production. The solution of these many problems and effects produced by solving the problems are described in detail in combination with the description of the embodiment in the section that provides a detailed description of the preferred embodiment below.

DETAILED DESCRIPTION OF THE PREFERRED EMBODIMENTS

Figure 1:
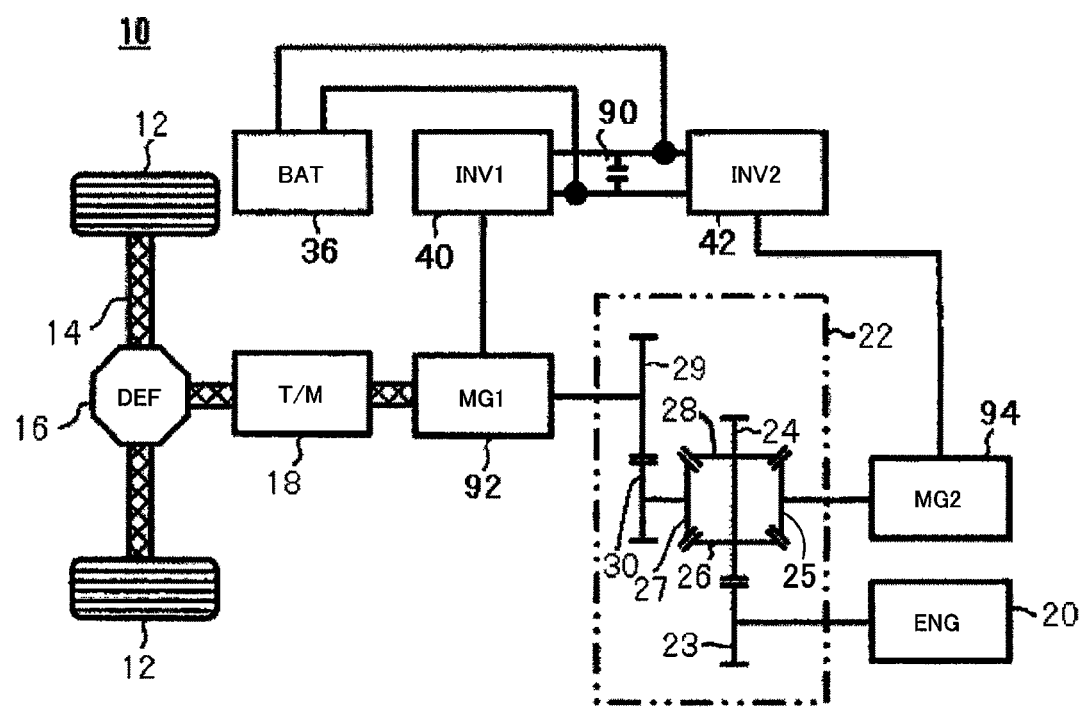
FIG. 1 is a view illustrating a control block of a hybrid vehicle.

The power conversion apparatus according to the embodiment of the present invention is described below in detail while referring to the drawings. However, first, an overview of technical problems to be overcome and improved in regard to the power conversion apparatus according to the embodiment and technology for solving the technical problems are described.

The power conversion apparatus according to the embodiment of the present invention has been made in consideration of the following technical aspects as a product that can respond to the needs of the marketplace. One of those aspects is size-reduction technology, that is, technology that inhibits as much as possible an increase in size of a power conversion apparatus accompanying an increase in the amount of power that is converted. Another aspect is technology that relates to improving the reliability of a power conversion apparatus. A further aspect is technology that relates to improving the productivity of a power conversion apparatus. The power conversion apparatus according to the embodiment of the present invention has been achieved based on the aforementioned three aspects as well as on an aspect that combines these three aspects. The features of the power conversion apparatus according to each of these aspects are reviewed hereunder.

(1) Description Relating to Size-Reduction Technology

The power conversion apparatus according to the present embodiment has a structure in which an upper and lower arm series circuit of an inverter is housed inside a semiconductor module that comprises a cooling metal on both sides, the semiconductor module is inserted inside cooling water, and the cooling metal on both sides is cooled by the cooling water. By adopting this structure, the cooling efficiency is improved and a reduction in the size of the semiconductor module is enabled. As a specific example, respective insulating sheets or insulating plates such as ceramic plates are provided as insulating members on the inside of the cooling metal on both sides, and a semiconductor chip of an upper arm and a lower arm constituting an upper and lower arm series circuit is inserted between conductor metals that are fixed to the respective insulating members. With this structure, favorable heat conduction paths can be made between the two sides of the semiconductor chips of the upper arm and lower arm and the cooling metals, thereby significantly improving the cooling efficiency of the semiconductor module.

Further, in the semiconductor module, since the semiconductor chips of the lower arm and the upper arm are disposed in a condition in which they are staggered in the vertical direction with respect to the axis of the flow of cooling water, the cooling water inside the cooling channel can be utilized more efficiently, thereby enhancing the cooling effect.

By adopting a structure in which, in addition to disposing a semiconductor chip of the upper arm of the semiconductor module and a semiconductor chip of the lower arm of a semiconductor module in a staggered condition in the vertical direction with respect to the axis of the flow of cooling water, a channel at a position corresponding to a semiconductor chip of an upper arm and a channel at a position corresponding to a semiconductor chip of a lower arm are divided and these channels are connected in series, it is possible to narrow the sectional area of the channel to suit the semiconductor chips that are the cooling objects, and as a result the flow rate of cooling water within the channels can be increased. An increase in the flow rate results in an increase in the amount of water contributing to cooling per unit of time. This leads to a significant improvement in cooling efficiency. This structure that divides a channel at a position corresponding to a semiconductor chip of an upper arm or a lower arm does not make the overall cooling structure particularly complex, and has an effect that the cooling efficiency can be significantly enhanced without causing a major increase in the size of the cooling case.

The two surfaces of the semiconductor chips of the upper arm and the lower arm are respectively connected to a conductor metal (conductor plate) on the inside of a cooling metal. The conductor metals are fixed via insulating members to the cooling metals. The insulating members are formed to have a thin thickness, for example, not more than 350 μ-meters in the case of a ceramic plate, and in the case of an insulating sheet the thickness is even less at a level from 50 μ-meters to 200 μ-meters. In this case, for example, a sheet of resin that is bonded by thermocompression is employed as an insulating sheet. Since a conductor metal is disposed in the vicinity of a cooling metal, an eddy current caused by an electric current flowing in the conductor metal flows to the cooling metal, and although the eddy current generates heat, this heat is effectively transferred to the cooling water.

Further, inductance within the semiconductor module is lowered by the eddy current. Lowering the inductance makes it possible to reduce a jump in voltage caused by a switching operation with respect to the semiconductor chips of the upper arm and lower arm, and thus leads to an increase in reliability. Further, suppressing a voltage increase makes it possible to speed up a switching operation for semiconductor chips of the upper arm and lower arm. As a result, the time required for the switching operation can be reduced, leading to a reduction in the amount of heat generated by the switching operation.

According to power conversion apparatus of the present embodiment, since an upper and lower arm series circuit of an inverter is housed inside a semiconductor module, the structure is one in which a direct current (DC) terminal of a semiconductor module connects to a capacitor module, and furthermore the terminal structure of the capacitor module is an extremely simple structure. This contributes significantly to decreasing the size of the inverter device overall, and at the same time leads to improvements in reliability and improvements in productivity.

Further, it is possible to make a structure of a terminal of a capacitor module or a DC terminal of a semiconductor module as well as a structure connecting these into a structure in which terminals on a positive electrode side and a negative electrode side as well as a conductor connecting to these terminals are close to each other and a structure in which they are opposingly disposed, and the inductance between a semiconductor module and a capacitor can be reduced. It is thereby possible to decrease a voltage jump caused by a switching operation for semiconductor chips of an upper and lower arm, leading to an improvement in reliability. Further, suppression of a voltage rise makes it possible to speed up a switching operation for semiconductor chips, leading to a reduction in the amount of heat generated as a result of the decrease in the switching operation time. Reducing the amount of generated heat or inhibiting complication of the connection structure makes it possible to reduce the size of the power conversion apparatus.

Further, according to the power conversion apparatus of the present embodiment, since the cooling efficiency can be significantly improved, engine cooling water can be used as cooling water. In the case of cooling with cooling water that is different to engine cooling water, the vehicle requires a new cooling system, and even if it is possible to decrease the size of the power conversion apparatus, the system of the overall vehicle is complicated. According to the present embodiment, even supposing that the size of the power conversion apparatus were to increase, utilization of engine cooling water enables size reductions with respect to the overall vehicle and also has many other advantages.

According to the power conversion apparatus of the present embodiment, since a configuration is adopted in which a semiconductor module or a capacitor module is fixed in a cooling case, a surface of the cooling case comprising the semiconductor module can be utilized as a surface that fixes a capacitor module, and it is thus possible to reduce the size of the power conversion apparatus. Further, since the cooling efficiency of the capacitor module is enhanced and the capacitor module can be fixingly retained by the cooling case, the structure is also strengthened with respect to vibrations and has the effects of size reduction and reliability enhancement.

(2) Description Relating to Reliability Enhancement

According to the power conversion apparatus of the present embodiment, as described above, the cooling efficiency of a semiconductor module can be significantly improved and, as a result it is possible to inhibit increases in temperature of the semiconductor chips, leading to an improvement in reliability.

Further, it is possible to achieve low inductance in the semiconductor module or low inductance between the semiconductor module and the capacitor module and to reduce a voltage jump caused by switching operations, and this leads to an improvement in reliability. Further, suppression of a voltage rise makes it possible to speed up a switching operation for semiconductor chips, leading to a reduction in the amount of heat generated as a result of the decrease in the switching operation time. This also leads to inhibition of a temperature increase and enhancement of reliability.

The structure connecting the DC terminal of the semiconductor module to a capacitor module and, furthermore, the terminal structure of the capacitor module are simple structures, and this leads not only to increased productivity and size reduction, but also to enhancement of reliability.

According to the present power conversion apparatus, since the cooling efficiency is significantly improved, engine cooling water can be used as cooling water. Therefore, a dedicated cooling water system is not required in the case of a vehicle, and the reliability of the vehicle overall can be significantly improved.

According to the present power conversion apparatus a structure is adopted in which a semiconductor module that houses an upper and lower arm series circuit of an inverter is inserted into a cooling channel from an opening provided in the channel. It is possible to perform a process in which a semiconductor module and a channel case that are separately produced on a production line are inspected separately, and thereafter a step is performed in which the semiconductor module is fixed in the channel case. Since it is possible to separately produce and inspect a semiconductor module that is an electrical component and a channel case that is a mechanical component in this manner, while naturally the productivity is enhanced, this also leads to an improvement in reliability.

Further, for the semiconductor module, a method can be adopted in which the semiconductor module is produced by fixing necessary conductors or semiconductor chips to a first and second heat radiating metal, respectively, and thereafter integrating the first and second heat radiating metals. Since it is possible to perform a step of integrating the heat radiating metals after verifying the production state of the first and second heat radiating metals, respectively, this leads to not just improved productivity but also to enhanced reliability. Further, since the structure is one in which a DC terminal or alternating current terminal or a signal terminal (signal emitter terminal) or gate terminal of the semiconductor module is fixed to either the first or second heat radiating metal within a semiconductor module, the structure has a strong resistance to vibrations and reliability is thereby improved.

According to the present power conversion apparatus, the structure is one in which when a collector surface of a semiconductor chip of the upper arm is fixed to a first heat radiating metal the collector surface of a semiconductor chip of a lower arm is fixed to the same first heat radiating metal, and the collector surface and the emitter surface of semiconductor chips of the upper and lower arms are disposed in the same direction. By adopting this structure reliability is improved along with an improvement in productivity.

The structure is also one in which semiconductor chips of the upper and lower arms and a signal terminal or a gate terminal of the upper and lower arms are fixed by the same heat radiating metal. It is therefore possible to bring together wire bonding connection steps that join semiconductor chips with a signal terminal or a gate terminal on one of the heat radiating metals, which facilitates inspection and the like. This leads to not only improved productivity, but also enhanced reliability.

(3) Description Relating to Productivity Enhancement

According to the power conversion apparatus of the present embodiment, as described above, it is possible to separately produce a semiconductor module and a cooling case and thereafter perform a step of fixing the semiconductor module in the cooling case, thereby enabling production of a semiconductor module with an electrical production line. Productivity and reliability are thereby improved. Further, since a capacitor module can also be similarly produced in another production step and thereafter fixed in the channel case, productivity improves.

It is also possible to fix semiconductor modules and a capacitor module in the channel case and thereafter connect terminals of the semiconductor modules and the capacitor module, and to secure a space for introducing a welding machine for connecting into a welding portion, and this leads to enhanced productivity. Further, in these connection steps, since terminals of the semiconductor module are fixed to respective heat radiating metals of the semiconductor module, heat produced when welding a terminal is diffused to the respective heat radiating metals, enabling the suppression of adverse effect on the semiconductor chips and ultimately leading to improvement in productivity and improvement in reliability.

Further, since semiconductor chips of the upper and lower arms and a signal terminal or a gate terminal of the upper and lower arms can be fixed to one of the heat radiating metals of a semiconductor module, wire bonding can be performed for both the upper arm and lower arm with one of the heat radiating metal production lines, and thus productivity improves.

According to the power conversion apparatus of the present embodiment, it is possible to mass produce semiconductor modules of the same structure, adopt a system in which the number of semiconductor modules required on the basis of the requirement specifications of the power conversion apparatus are used, to carry out planned semiconductor module mass production, and improve productivity while at the same time with lowering prices and enhancing reliability. This completes the description of the structural effects and features of the power conversion apparatus according to the embodiment of the present invention as seen from three technical aspects.

Figure 2:
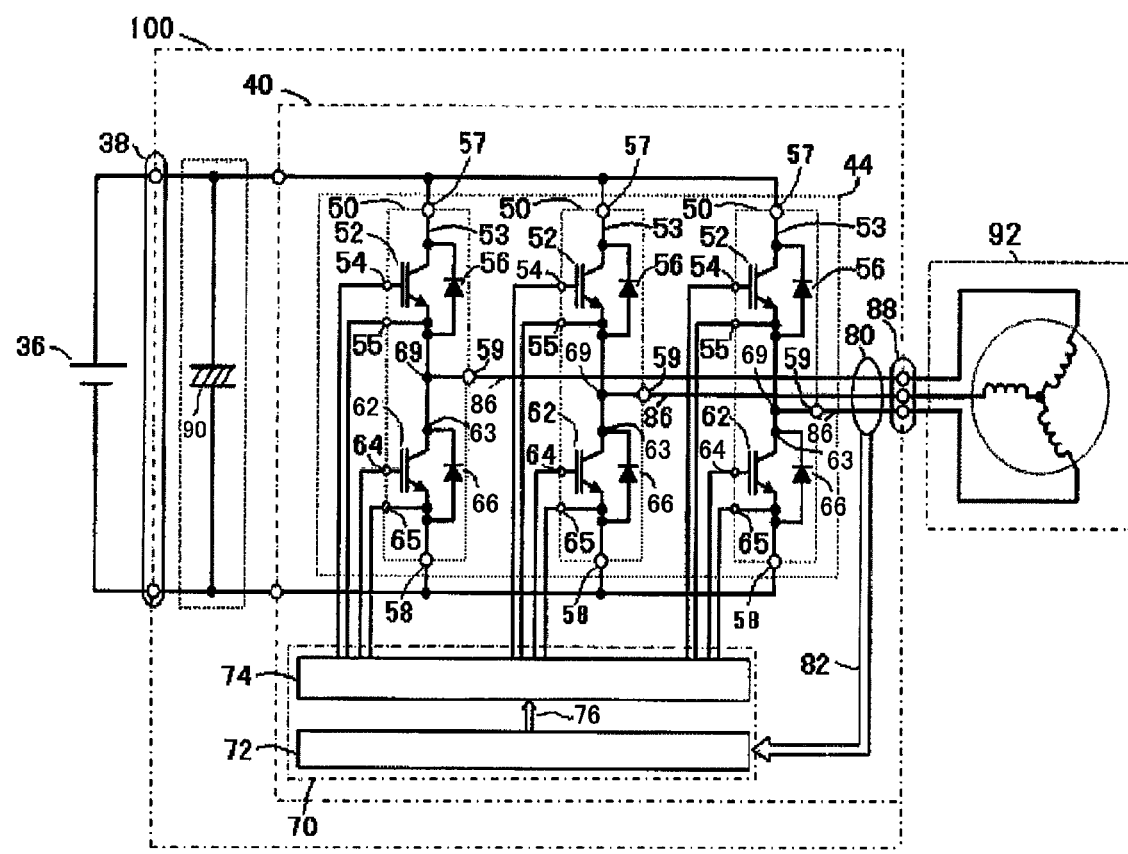
FIG. 2 is a view illustrating the circuit configuration of a vehicle drive electrical equipment system that includes a power conversion apparatus comprising an inverter device including an upper and lower arm series circuit and a control portion, and a capacitor that is connected to a direct current side of the inverter device, as well as a battery and a motor generator.

Next, the power conversion apparatus according to the embodiment of the present invention is described in detail while referring to the drawings. Although the power conversion apparatus according to the embodiment of the present invention can be applied to a hybrid vehicle or a purely electric vehicle, as a representative example, a circuit configuration of the power conversion apparatus and a control structure in a case in which the power conversion apparatus according to the embodiment of the present invention is applied to a hybrid vehicle are described using FIG. 1 and FIG. 2. FIG. 1 is a view that shows a control block of a hybrid vehicle. FIG. 2 is a view that illustrates the circuit configuration of a vehicle drive electrical equipment system that includes a power conversion apparatus comprising an inverter device including an upper and lower arm series circuit and a control portion, and a capacitor that is connected to a direct current side of the inverter device, as well as a battery and a motor generator.

For the power conversion apparatus according to the embodiment of the present invention, a description is made in which a power conversion apparatus for vehicle mounting of an on-vehicle electrical equipment system to be mounted in a vehicle, in particular, a vehicle drive electrical equipment system is used, taking an example of an inverter device for vehicle drive for which a mounting environment and an operational environment are extremely severe. The inverter device for vehicle drive comprises a vehicle drive electrical equipment system as a control device that controls the driving of a vehicle drive motor, converts direct-current power that is supplied from an on-vehicle power generating device or an on-vehicle battery constituting an on-vehicle electrical supply into a predetermined alternating current power, and supplies the obtained alternating current power to the vehicle drive motor to control driving of the vehicle drive motor. Further, since the vehicle drive motor also has a function as a power generator, the inverter device for vehicle drive also has a function that, in accordance with the operation mode, converts alternating current power generated by the vehicle drive motor into direct-current power. The thus-converted direct-current power is supplied to the on-vehicle battery.

In this connection, although the configuration of the present embodiment can also be applied to an inverter device other than that for vehicle drive, for example, to an inverter device used as a control device of an electric powered brake device or an electric power steering device, the most desirable effect is exerted when the configuration of the present embodiment is applied for vehicle drive use. Further although the concept of the present embodiment can also be applied to other power conversion apparatuses for vehicle mounting such as a direct current-direct current power conversion apparatus, such as a DC/DC converter or a DC chopper, or an alternating current-direct current power conversion apparatus, the most desirable effect is exerted when the present embodiment is applied for vehicle drive use. Furthermore, although the present embodiment can also be applied to an industrial power conversion apparatus that is used as a control device of an electric motor that drives equipment of a factory or to a domestic power conversion apparatus used for a control device of an electric motor that drives a domestic solar power generation system or domestic electrical appliances, as described above the most desirable effect is exerted when the present embodiment is applied for vehicle drive use.

A case will now be described in which it is assumed that a vehicle drive electrical equipment system comprising an inverter device for vehicle drive to which the present embodiment is applied is mounted in a hybrid vehicle that is configured to drive either the front or rear wheels by employing as a driving source an engine that is an internal combustion engine and a vehicle drive motor. In some hybrid vehicles either the front or rear wheels are driven by an engine and the other wheels are driven by a vehicle drive motor, and the present embodiment can be applied to any type of hybrid vehicle. Furthermore, as described above, the present embodiment can also be applied to a purely electric vehicle such as a fuel cell electric vehicle, and the power conversion apparatus as described hereunder can perform substantially the same action in a purely electric vehicle and substantially the same effect can be obtained.

In FIG. 1, a hybrid electric vehicle (hereunder, abbreviated as "HEV") 10 is a single motor vehicle that is equipped with two vehicle drive systems. One system is an engine system that is equipped with an engine 20 that is an internal combustion engine as a motive power source. The engine system is principally used as a driving source of the HEV. The other system is an on-vehicle electrical equipment system that employs motor generators 92 and 94 as a motive power source. The on-vehicle electrical equipment system is principally used as a driving source of the HEV and a power generating source of the HEV. Although the motor generators 92 and 94 are, for example, permanent-magnet synchronous motors, since they operate as a motor and also as a power generator depending on the operating method, in this case they are described as "motor generator".

A front wheel axle 14 is pivotally supported in a rotatable manner at a front portion of the vehicle body. A pair of front wheels 12 are provided at the two ends of the front wheel axle 14. A rear wheel axle (omitted from the figure) is pivotally supported in a rotatable manner at a rear portion of the vehicle body. A pair of rear wheels are provided at the two ends of the rear wheel axle. In the HEV of the present embodiment, although a so-called "front wheel drive system" is employed in which the front wheels 12 are taken as the main wheels to be driven by the motive force and the rear wheels are taken as driven wheels that are pulled around, the opposite thereof, that is, a rear wheel drive system may also be employed.

A front wheel side differential gear (hereunder, described as "front wheel side DEF") 16 is provided at the center portion of the front wheel axle 14. The front wheel axle 14 is mechanically connected to the output side of the front wheel side DEF 16. An output shaft of the transmission 18 is mechanically connected to the input side of the front wheel side DEF 16. The front wheel side DEF 16 is a differential power transfer mechanism that distributes a rotational drive force that is subjected to a speed change and transmission by a transmission 18 to the right and left of the front wheel axle 14. The output side of the motor generator 92 is mechanically connected to the input side of the transmission 18. The output side of the engine 20 and the output side of the motor generator 94 are mechanically connected via the power transfer mechanism 22 to the input side of the motor generator 92. In this connection, the motor generators 92 and 94 and the power transfer mechanism 22 are housed inside the case of the transmission 18.

The power transfer mechanism 22 is a differential mechanism constituted by gears 23 to 30. The gears 25 to 28 are bevel gears. The gear 23, 24, 29, and 30 are spur gears. The motive power of the motor generator 92 is transferred directly to the transmission 18. The axis of the motor generator 92 is coaxial with the gear 29. According to this configuration, when there is no supply of a driving electric power with respect to the motor generator 92, a motive power that is conveyed to the gear 29 is conveyed as it is to the input side of the transmission 18.

When the gear 23 is driven by the operation of the engine 20, the motive power of the engine 20 is transferred from the gear 23 to the gear 24, from the gear 24 to the gear 26 and gear 28, then from the gear 26 and gear 28 to the gear 30, and ultimately transferred to the gear 29. When the gear 25 is driven by the operation of the motor generator 94, the rotation of the motor generator 94 is transferred from the gear 25 to the gear 26 and gear 28, then from the gear 26 and gear 28 to the gear 30, and ultimately transferred to the gear 29. In this connection, instead of the above described differential mechanism, another mechanism such as a planetary gear mechanism may be used as the power transfer mechanism 22.

The motor generators 92 and 94 are synchronous machines that comprise a permanent magnet in a rotor. The driving of the motor generators 92 and 94 is controlled by inverter devices 40 and 42 controlling an alternating current power that is supplied to an armature winding of a stator. A battery 36 is electrically connected to the inverter devices 40 and 42, and mutual exchange of power is possible between the battery 36 and the inverter devices 40 and 42.

The present embodiment includes a first electric motor-generator unit comprising the motor generator 92 and the inverter device 40 and a second electric motor-generator unit comprising the motor generator 94 and the inverter device 42, and divides the use of these as appropriate in accordance with the operating state. More specifically, in a case of driving a vehicle with the motive power from the engine 20, when assisting the driving torque of the vehicle the second electric motor-generator unit is operated as a power generation unit by the motive power of the engine 20 to cause it to generate power, and the first electric motor-generator unit is caused to operate as an electric motor unit by the power obtained by that power generation. Further, in a similar case, when assisting the vehicle speed the first electric motor-generator unit is caused to operate as a power generation unit by the motive power of the engine 20 to generate power, and the second electric motor-generator unit is caused to operate as an electric motor unit by the power obtained by that power generation.

Further, according to the present embodiment, by causing the first electric motor-generator unit to operate as an electric motor unit with the power of the battery 36, the vehicle can be driven by only the motive power of the motor generator 92. Furthermore, according to the present embodiment, the battery 36 can be charged by generating power by causing the first electric motor-generator unit or the second electric motor-generator unit to operate as a power generation unit using the motive power from the engine 20 or the motive power from the wheels.

Next, the electrical circuit configuration of the inverter devices 40 and 42 is described using FIG. 2. Although according to the embodiment shown in FIG. 1 and FIG. 2 an example is described of a case in which the inverter devices 40 and 42 are individually configured, a configuration may be adopted in which the inverter devices 40 and 42 are housed in a single apparatus as described later using FIG. 7 and the like. Since the inverter devices 40 and 42 have the same configuration and same action and perform the same function, in this case the inverter device 40 is described as an example.

A power conversion apparatus 100 according to the present embodiment comprises the inverter device 40 and a capacitor 90, and the inverter device 40 has an inverter circuit 44 and a control portion 70. The inverter circuit 44 has a plurality of upper and lower arm series circuits 50 (in the example shown FIG. 2, there are three upper and lower arm series circuits 50, 50, and 50) that comprise a diode 56 and an IGBT 52 (insulated gate bipolar transistor) operating as an upper arm and a diode 66 and an IGBT 62 operating as a lower arm, and has a configuration in which an alternating current power line 86 extends from a midpoint portion (intermediate electrode 69) of each upper and lower arm series circuit 50 through an alternating current terminal 59 to a motor generator 92. The control portion 70 has a driver circuit 74 that drivingly controls the inverter circuit 44, and a control circuit 72 (built into the control board) that supplies a control signal to the driver circuit 74 via a signal wire 76.

The upper arm and lower arm IGBTs 52 and 62 are power semiconductor devices for switching that operate upon receiving a driving signal that is output from the control portion 70 to convert direct current power that is supplied from the battery 36 into three-phase alternating current power. This converted power is supplied to the armature winding of the motor generator 92. As described above, three-phase alternating current power that is generated by the motor generator 92 can also be converted into direct current power.

The power conversion apparatus 100 according to the present embodiment is constituted by a three-phase bridge circuit, and is configured by the upper and lower arm series circuits 50, 50 and 50 for three phases being respectively electrically connected in parallel between a positive electrode side and a negative electrode side of the battery 36. In this case, each upper and lower arm series circuit 50 is referred to as an "arm", and comprises the power semiconductor device for switching 52 and the diode 56 on the upper arm side and the power semiconductor device for switching 62 and the diode 66 on the lower arm side.

According to the present embodiment an example is described in which IGBTs (insulated gate bipolar transistor) 52 and 62 are used as power semiconductor devices for switching. The IGBTs 52 and 62 comprise collector electrodes 53 and 63, emitter electrodes, gate electrodes (gate electrode terminals 54 and 64), and emitter electrodes for signals (emitter electrode terminals for signals 55 and 65). The collector electrodes 53 and 63 of the IGBTs 52 and 62 are electrically connected as shown in the figure between the emitter electrodes and the diodes 56 and 66. The diodes 56 and 66 comprise two electrodes consisting of a cathode electrode and an anode electrode. In order that the direction toward the collector electrodes from the emitter electrodes of the IGBTs 52 and 62 is the forward direction, the cathode electrodes are electrically connected to the collector electrodes of the IGBTs 52 and 62 and the anode electrodes are electrically connected to the emitter electrodes of the IGBTs 52 and 62.

A MOSFET (metal-oxide-semiconductor field-effect transistor) may also be used as a power semiconductor device for switching. A MOSFET comprises a drain electrode, a source electrode, and a gate electrode. In this connection, a MOSFET comprises a parasitic diode between the source electrode and the drain electrode so that the direction toward the source electrode from the drain electrode is the forward direction. For this reason, it is not necessary to separately provide a diode, as with an IGBT.

The upper and lower arm series circuits 50 are provided for three phases in correspondence with the respective phase windings of the armature winding of the motor generator 92. The three upper and lower arm series circuits 50, 50, and 50 form a U phase, a V phase, and a W phase, respectively, to the motor generator 92 through the alternating current terminal 59 and the intermediate electrode 69 that link the emitter electrode of the IGBT 52 and the collector electrode 63 of the IGBT 62. The upper and lower arm series circuits are connected together electrically in parallel. The collector electrode 53 of the upper arm IGBT 52 is electrically connected to a positive-electrode side capacitor electrode of the capacitor 90 through a positive electrode terminal (P terminal) 57. The emitter electrode of the lower arm IGBT 62 is electrically connected to a negative-electrode side capacitor electrode of the capacitor 90 through a negative electrode terminal (N terminal) 58. The intermediate electrode 69 at a midpoint portion (connection portion of the emitter electrode of the upper arm IGBT 52 and the collector electrode of the lower arm IGBT 62) of each arm is electrically connected through an AC connector 88 to a phase winding corresponding to the armature winding of the motor generator 92. As described in detail later, according to the present embodiment a single upper and lower arm series circuit 50 comprising an upper and a lower arm is the principal circuit configuration element of a semiconductor module.

The capacitor 90 is a device for comprising a smoothing circuit that controls fluctuations in a direct-current voltage that is produced by switching operations of the IGBTs 52 and 62. The positive electrode side of the battery 36 is electrically connected through a DC connector 38 to the positive-electrode side capacitor electrode of the capacitor 90, and the negative electrode side of the battery 36 is electrically connected through the DC connector 38 to the negative-electrode side capacitor electrode of the capacitor 90. As a result, the capacitor 90 is connected between the collector electrode 53 of the upper arm IGBT 52 and the positive electrode side of the battery 36 and between the emitter electrode of the lower arm IGBT 62 and the negative electrode side of the battery 36, and is parallelly connected electrically with respect to the battery 36 and the upper and lower arm series circuits 50.

The control portion 70 is a device for causing the IGBTs 52 and 62 to operate. The control portion 70 comprises a control circuit 72 (built into the control board) that generates a timing signal for controlling switching timing of the IGBTs 52 and 62 based on input information from another control device or sensor or the like, and a driving circuit 74 that generates a drive signal for causing the IGBTs 52 and 62 to perform a switching operation based on a timing signal that is output from the control circuit 72.

The control circuit 72 comprises a microcomputer (hereunder, abbreviated as "micon") for processing the switching timing of the IGBTs 52 and 62. Information that is input to the micon includes a required target torque value with respect to the motor generator 92, a current value to be supplied to the armature winding of the motor generator 92 from the upper and lower arm series circuit 50, and a magnetic pole position of the rotor of the motor generator 92. The target torque value is based on a command signal that is output from an unshown high order control device. The current value is detected based on a detection signal that is output from a current sensor 80. The magnetic pole position is detected based on a detection signal that is output from an unshown rotary magnetic pole sensor that is provided in the motor generator 92. Although an example in which a three-phase current value is detected is described according to the present embodiment, a configuration may also be adopted in which a two-phase current value is detected.

The micon inside the control circuit 72 calculates a current command value for the d- and q-axis of the motor generator 92 based on the target torque value, calculates a voltage command value for the d- and q-axis based on a difference between this calculated current command value for the d- and q-axis and a detected current value of the d- and q-axis, and converts this calculated voltage command value for the d- and q-axis into a voltage command value of the U-phase, V-phase, and W-phase based on the detected magnetic pole position. The micon then generates a modulated wave in a pulse shape based on a comparison between a carrier wave (triangular wave) and a fundamental wave (sine wave) based on the U-phase, V-phase, and W-phase voltage command values. The micon outputs the modulated wave that is generated to the driver circuit 74 as a PWM (pulse width modulation) signal. Six PWM signals that correspond to the upper and lower arms of each phase are output to the driver circuit 74 from the micon. Another signal such as a rectangular wave signal may be used as a timing signal that is output from the micon.

The driver circuit 74 is configured by a so-called "driver IC" in which a plurality of electronic circuit components are integrated in a single integrated circuit. Although an example of a case in which one IC is provided for each of the upper and lower arms of each phase (1 arm in 1 module: 1 in 1) is described according to the present embodiment, a configuration may be adopted in which one IC is provided to correspond with each arm (2 in 1) or in which one IC is provided to correspond with all the arms (6 in 1). When driving a lower arm, the driver circuit 74 amplifies a PWM signal and outputs this amplified signal as a drive signal to the gate electrode of the corresponding lower arm IGBT 62. When driving an upper arm, the driver circuit 74 amplifies a PWM signal after shifting the level of the reference potential of the PWM signal to the level of the reference potential of the upper arm and outputs this amplified signal as a drive signal to the gate electrode of the corresponding upper arm IGBT 52. As a result, the respective IGBTs 52 and 62 perform a switching operation based on the input drive signal.

The control portion 70 also performs abnormality detection (an overcurrent, overvoltage, excess temperature or the like) to protect the upper and lower arm series circuit 50. Therefore, sensing information is input into the control portion 70. For example, from the emitter electrode terminal for signals 55 and 65 of each arm, information regarding the current flowing to the emitter electrodes of each of the IGBTs 52 and 62 is input into a corresponding drive portion (IC). As a result, each drive portion (IC) performs overcurrent detection, and when an overcurrent is detected the relevant drive portion (IC) stops the switching operations of the corresponding IGBT 52 and 62 to protect the corresponding IGBT 52 and 62 from the overcurrent. Information regarding the temperature of the upper and lower arm series circuit 50 is input to the micon from an unshown temperature sensor provided in the upper and lower arm series circuit 50. Further, information of the voltage on the direct-current positive electrode side of the upper and lower arm series circuit 50 is input to the micon. The micon performs excess temperature detection and overvoltage detection based on these kinds of information, and when an excess temperature or overvoltage is detected, the micon stops the switching operations of all the IGBTs 52 and 62 to protect the upper and lower arm series circuit 50 (and by extension the semiconductor module that includes the circuit 50) from the excess temperature or overvoltage.

In FIG. 2, the upper and lower arm series circuit 50 is a series circuit of the upper arm IGBT 52 and the upper arm diode 56, and the lower arm IGBT 62 and the lower arm diode 66, and the IGBTs 52 and 62 are semiconductor devices for switching. Conduction and cutoff operations of the IGBTs 52 and 62 of the upper and lower arms of the inverter circuit 44 are switched in a fixed sequence, and the current of the stator winding of the motor generator 92 at the time of such switching flows through a circuit created by the diodes 56 and 66.

As shown in the figure, the upper and lower arm series circuit 50 comprises a positive terminal (P terminal, positive electrode terminal) 57, a negative terminal (N terminal 58, negative electrode terminal), an alternating current terminal 59 from the intermediate electrode 69 between the upper and lower arms, an upper arm signal terminal (emitter electrode terminal for signals) 55, an upper arm gate electrode terminal 54, a lower arm signal terminal (emitter electrode terminal for signals) 65, and a lower arm gate terminal electrode 64. The power conversion apparatus 100 has the DC connector 38 on the input side and the AC connector 88 on the output side, and connects to the battery 36 and the motor generator 92 through the respective connectors 38 and 88.

Figure 3:
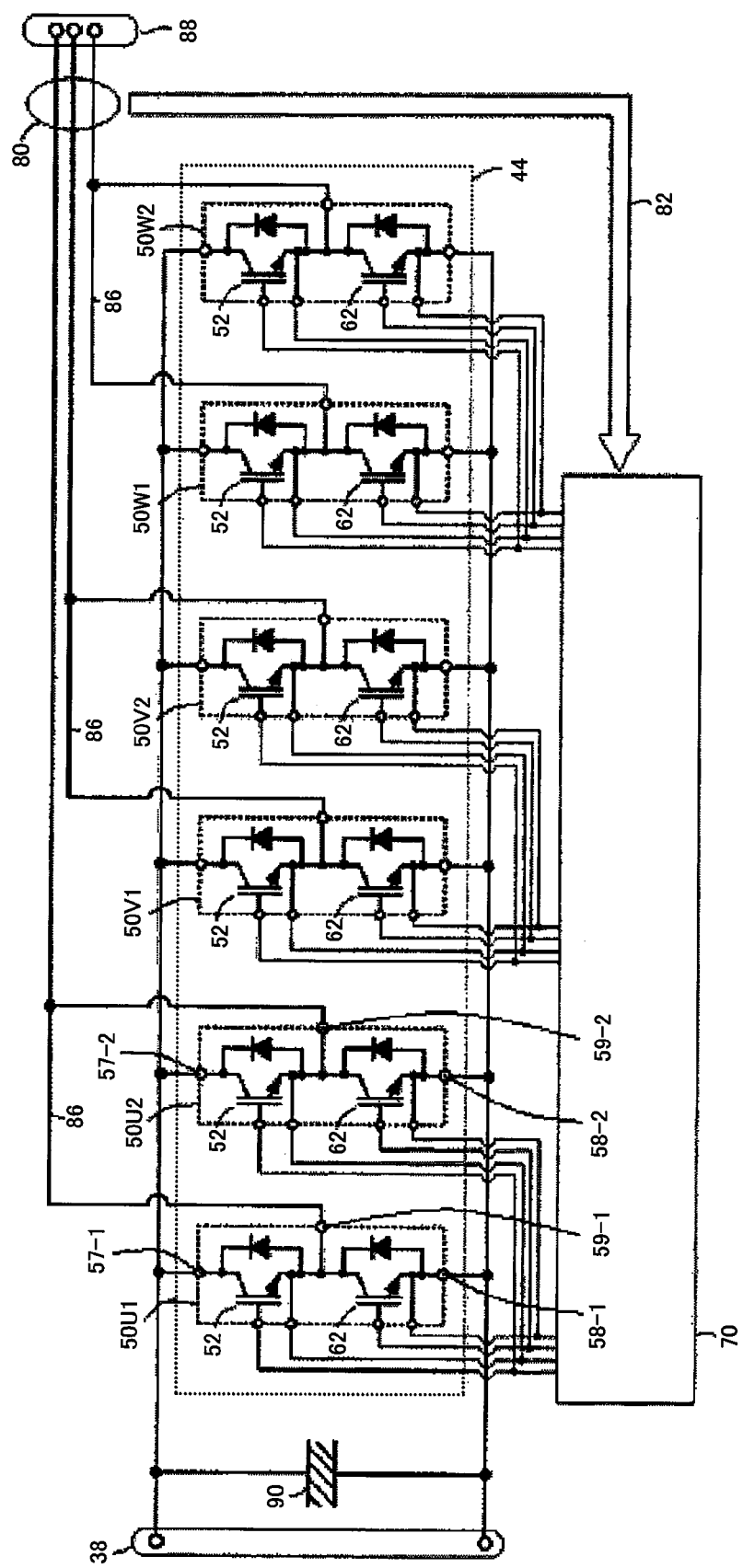
FIG. 3 is a view illustrating the circuit configuration of a power conversion apparatus in which two upper and lower arm series circuits are employed for outputting alternating current of respective phases to a motor generator.

FIG. 3 is a view illustrating the circuit configuration of a power conversion apparatus that uses two upper and lower arm series circuits as circuits that generate an output of each phase of a three-phase alternating current to be output to a motor generator. When the capacity of the motor generator increases, the amount of electric power to be converted by the power conversion apparatus increases and current values that flow through upper and lower arm direct current circuits of each phase of the inverter circuit 44 increase. Although it is possible to deal with an increase in the conversion power by increasing the electrical capacity of the upper and lower arms, it is preferable to increase the amount of production of inverter modules, and in FIG. 3 a configuration is adopted that deals with an increase in the amount of electric power to be converted by increasing the used number of inverter module that are standardized and produced. FIG. 3 is a circuit configuration which increases the capacity of the inverter circuit 44 in accordance with the capacity of the motor generator by parallelly connecting in twos the upper and lower arm direct current circuits of the inverter circuit 44 as one example.

As a specific configuration of the power conversion apparatus, for the U-phase, upper and lower arm series circuits 50U1 and 50U2 are parallelly connected and respective alternating current terminals 59-1 and 59-2 are connected to form a U-phase alternating current power line. For U-phase use to the motor generator, 57-1 (P1 terminal) and 57-2 (P2 terminal) are provided as P terminals, 58-1 (N1 terminal) and 58-2 (N2 terminal) are provided as N terminals, and 59-1 and 59-2 are provided as alternating current terminals. For the V-phase and W-phase also, the respective circuits are parallelly connected in a similar manner.

In this circuit configuration, it is preferable that the voltage is equal between each P terminal and N terminal of the upper and lower arm series circuits of each phase that are parallelly connected, for example, the upper and lower arm series circuits 50U1 and 50U2, and that a current is uniformly distributed to each of the upper and lower arm series circuits 50U1 and 50U2. To achieve this, preferably the distributed inductance between the parallelly connected upper and lower arm series circuits 50U1 and 50U2 and other electrical conditions are made equal as much as possible.

According to a power conversion apparatus of the present embodiment that is described below, since a configuration is adopted so that a semiconductor module 50U1 having the upper and lower arm series circuit 50U1 built therein is disposed adjacent to a semiconductor module 50U2 having the upper and lower arm series circuit 50U2 built therein, intervals between each P terminal and N terminal of these and the terminals of a capacitor module are made equal, and electrical conditions such as connection methods and the like are matched (see FIG. 13), currents flowing to the semiconductor module 50U1 having the upper and lower arm series circuit 50U1 built therein and the semiconductor module 50U2 having the upper and lower arm series circuit 50U2 built therein that constitute each phase, for example the U-phase, are substantially equal, and the terminal voltages of these semiconductor modules 50U1 and 50U2 are also substantially equal. Since the parallelly connected upper and lower arm series circuits constituting each phase of the inverter circuit 44 perform switching operations at the same timing, the same signal for each phase (U-phase, V-phase, and W-phase) is sent from the control portion 70 to each upper and lower arm series circuit constituting these phases.

Further, when a vehicle has two motor generators as shown in FIG. 1, the vehicle will have two sets of the power conversion apparatus shown in FIG. 2 or FIG. 3. Whether the power conversion apparatus in question will be the circuit shown in FIG. 2 or the circuit shown in FIG. 3 will, as described above, be decided according to the specifications of the motor generator. When the circuit shown in FIG. 2 is insufficient with respect to the power of the motor generator, the number of semiconductor modules standardized as in FIG. 3 that are used is increased to deal with the insufficiency. Although a configuration may be adopted in which the respective power converters shown in FIG. 2 and FIG. 3 are provided with respect to two motor generators, providing two inverter circuits in a single power conversion apparatus to provide a semiconductor module comprising two inverter circuits in a single channel case makes the overall size far smaller than when providing two power conversion apparatuses. From a productivity and reliability viewpoint, this is also a superior configuration to providing two power conversion apparatuses. This kind of power conversion apparatus that comprises two inverter circuits is described later using FIG. 7.

Figure 18:
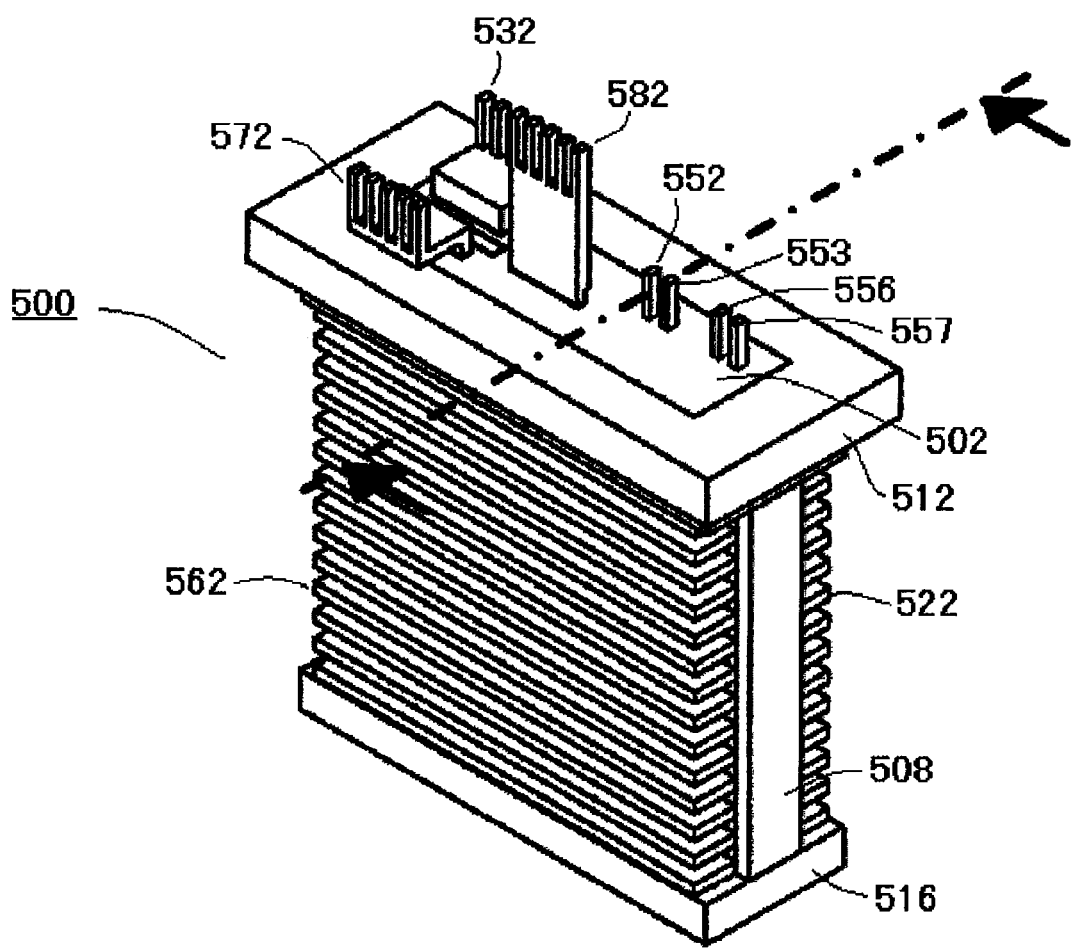
FIG. 18 is a view that shows the external appearance of a semiconductor module with heat radiating fins and a built-in upper and lower arm series circuit in a power conversion apparatus according to the present embodiment.
Figure 19:
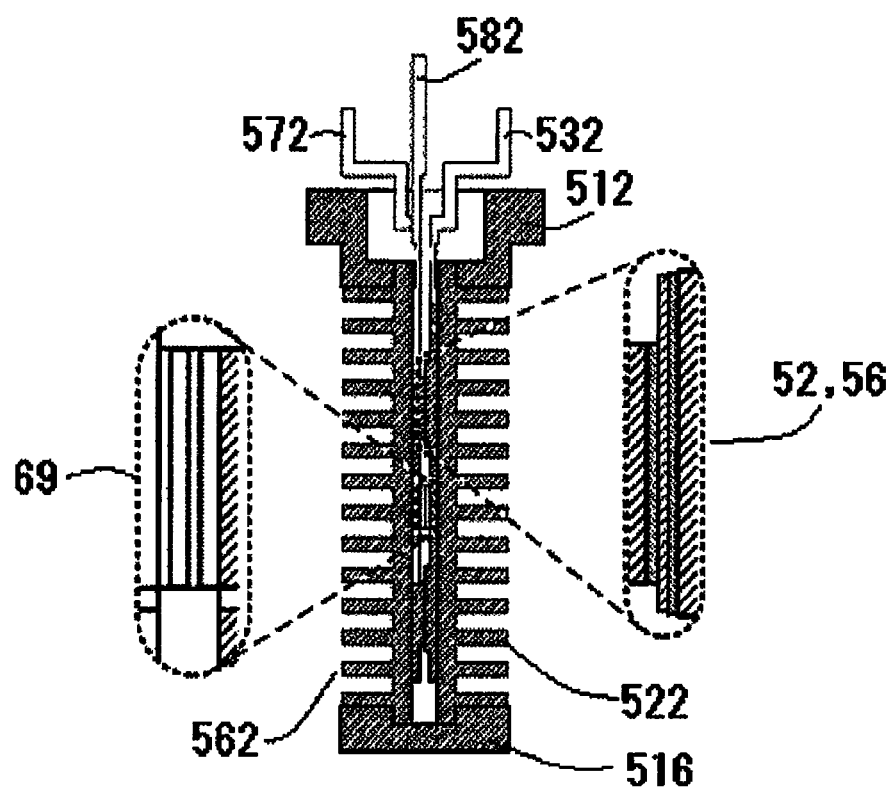
FIG. 19 is a sectional view of the semiconductor module shown in FIG. 18.
Figure 20:
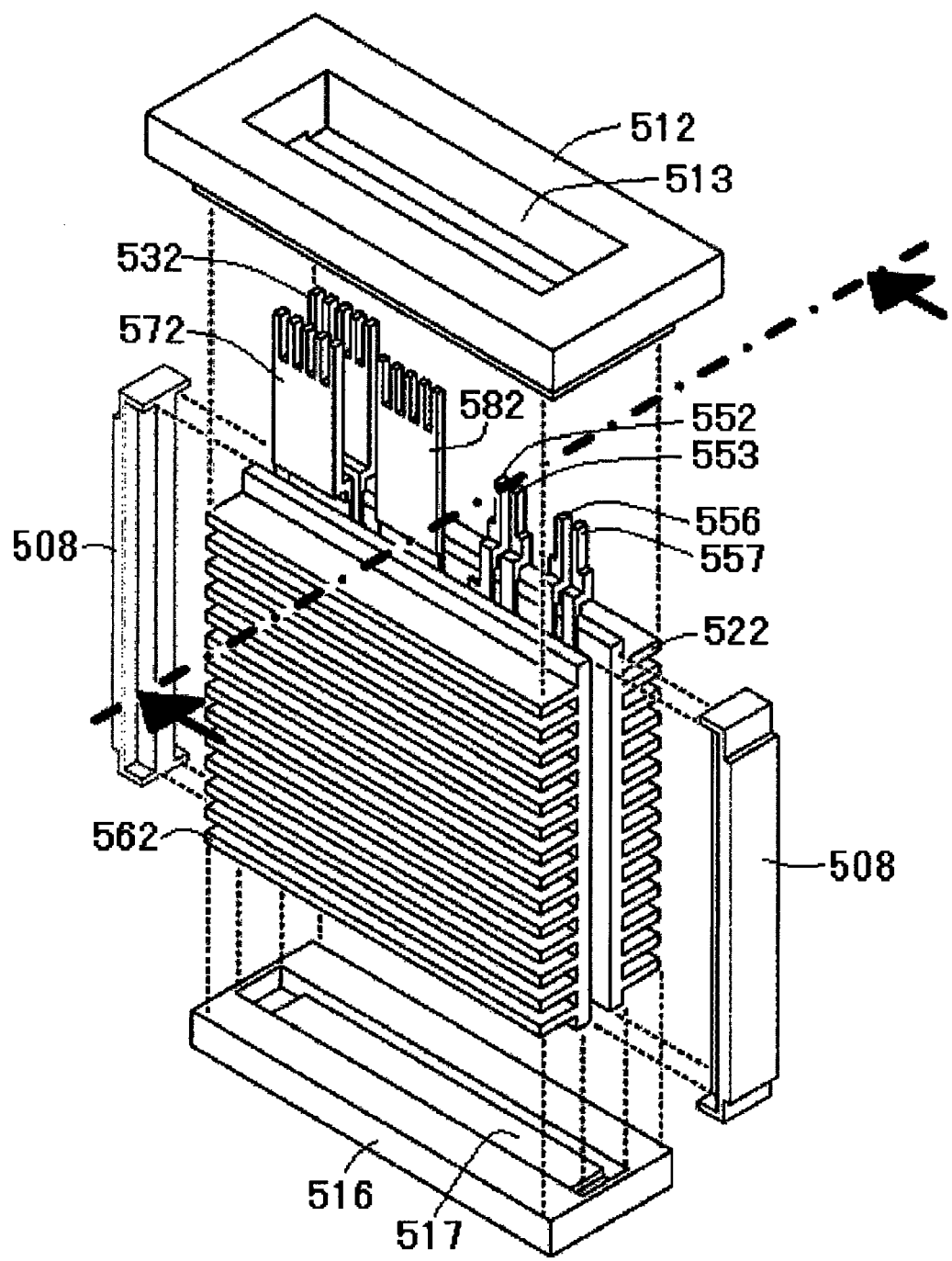
FIG. 20 is an expansion plan of a semiconductor module including a case.
Figure 21:
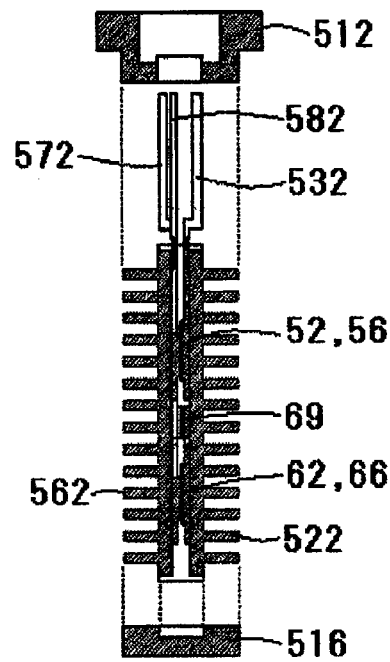
FIG. 21 is a sectional view of the semiconductor module shown in FIG. 20.

Next, a fabrication method and structure of a semiconductor module for a power conversion apparatus according to the embodiment of the present invention will be described in detail while referring to FIG. 18 to FIG. 28. FIG. 18 is a view that shows the external appearance of a semiconductor module with heat radiating fins having a built-in upper and lower arm series circuit in a power conversion apparatus according to the present embodiment. FIG. 19 is a sectional view of the semiconductor module shown in FIG. 18. FIG. 20 is an expansion plan of a semiconductor module including a case. FIG. 21 is a sectional view of the semiconductor module shown in FIG. 20.

Figure 22:
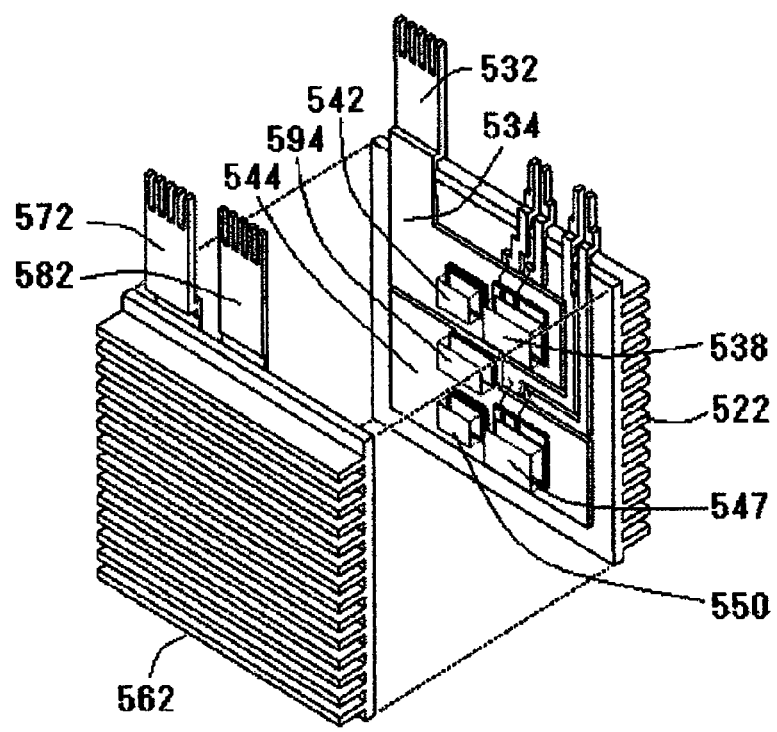
FIG. 22 is a view that shows an oblique perspective of the internal structure of a semiconductor module relating to the present embodiment that shows heat radiating fins (A side) on one side of the semiconductor module and heat radiating fins (B side) on the other side thereof.
Figure 23:
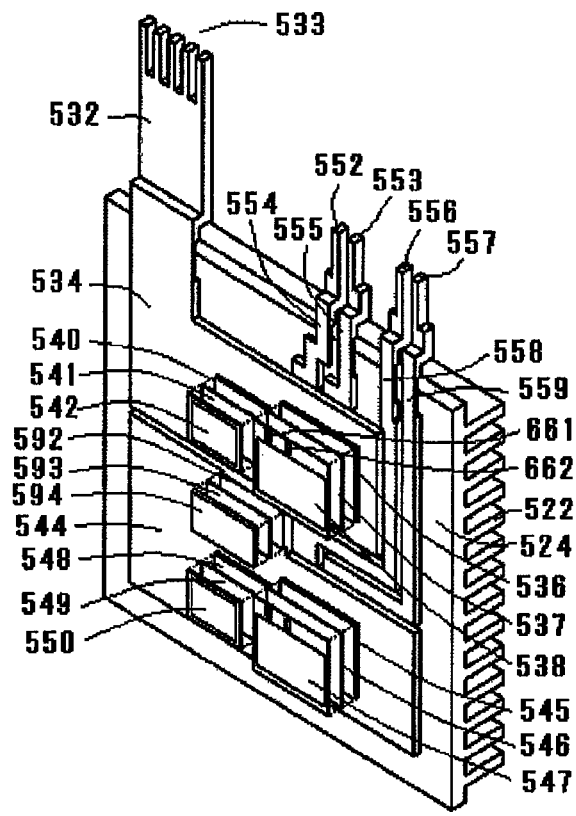
FIG. 23 is a view that illustrates the structure of an upper and lower arm series circuit that is adhered to the inside of heat radiating fins (A side) of a semiconductor module.
Figure 24:
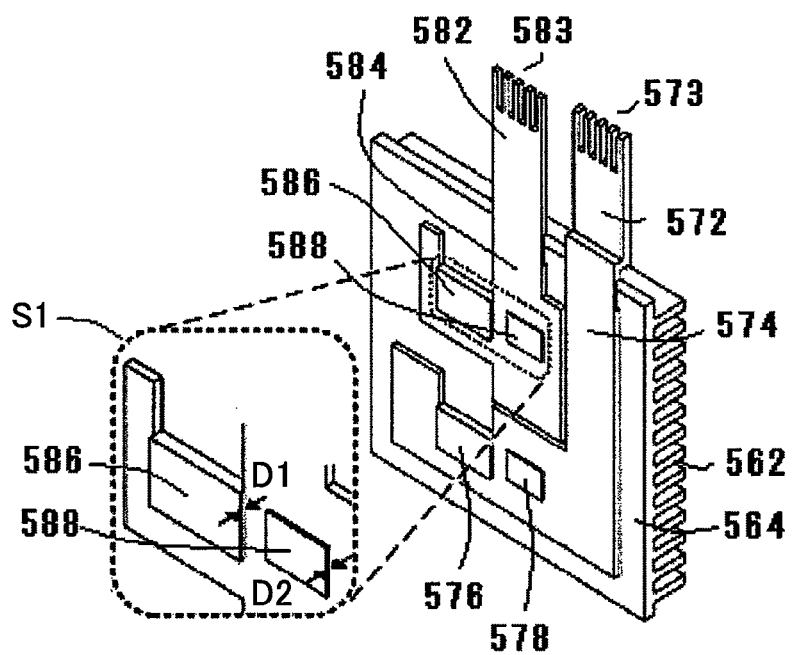
FIG. 24 is an oblique perspective view that illustrates the structure of an upper and lower arm series circuit that is adhered to the inside of heat radiating fins (B side) of a semiconductor module.
Figure 25:
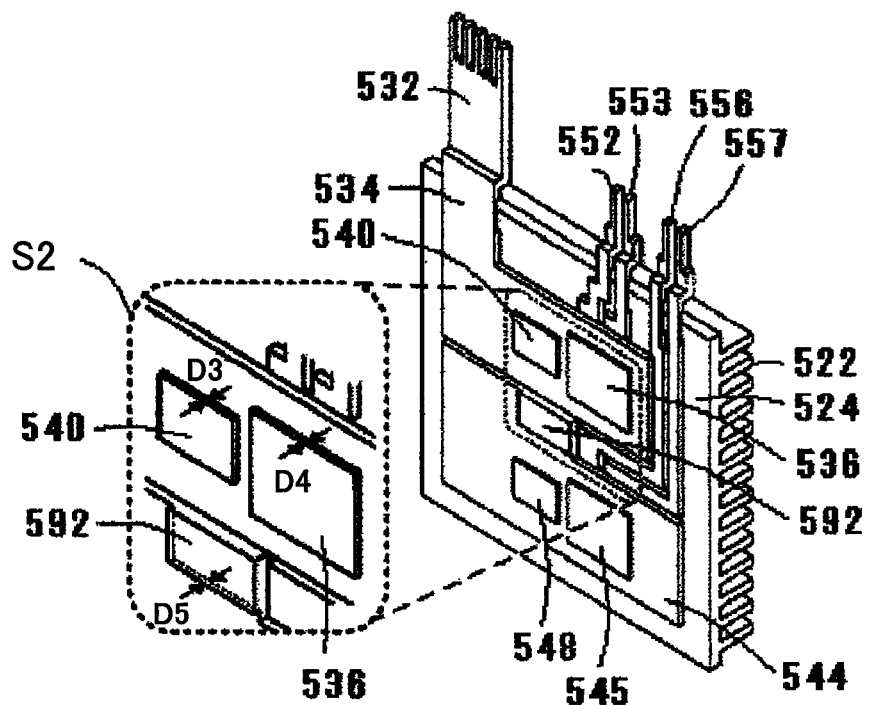
FIG. 25 is an oblique perspective view that illustrates the structure of an upper and lower arm series circuit that is adhered to the inside of heat radiating fins (A side) of a semiconductor module.
Figure 26:
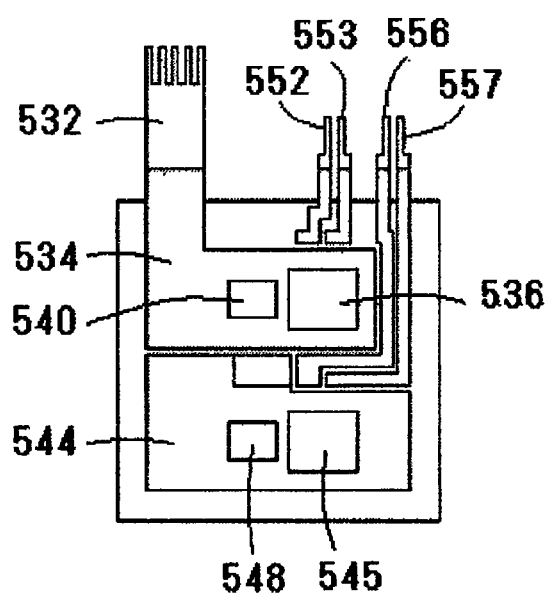
FIG. 26 is a front view of the structure shown in FIG. 25.
Figure 27:
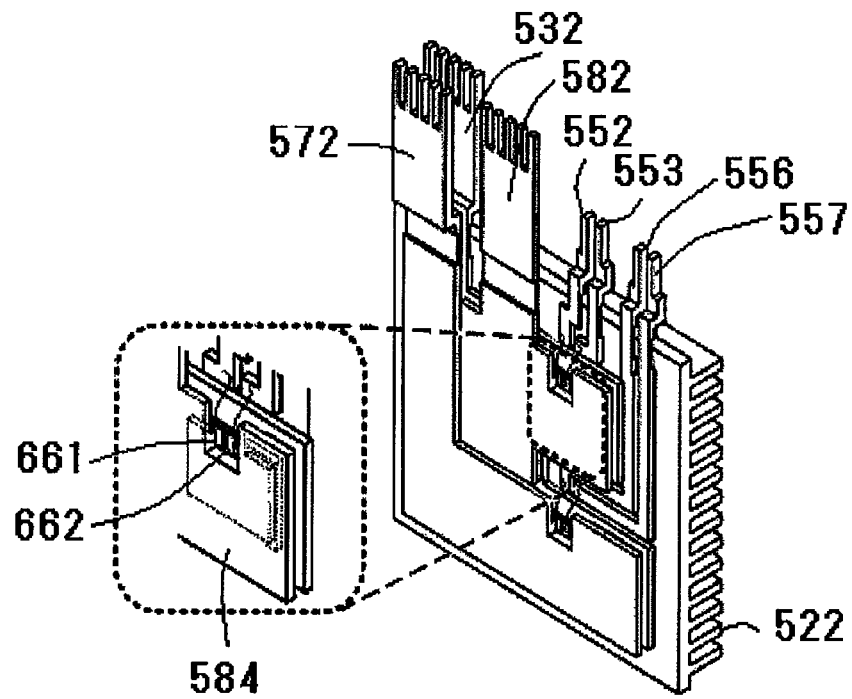
FIG. 27 is an oblique perspective view that shows a wire bonding state and a structure of a conductor plate that is bonded by a vacuum thermocompression method to the inside of heat radiating fins of a semiconductor module.
Figure 28:
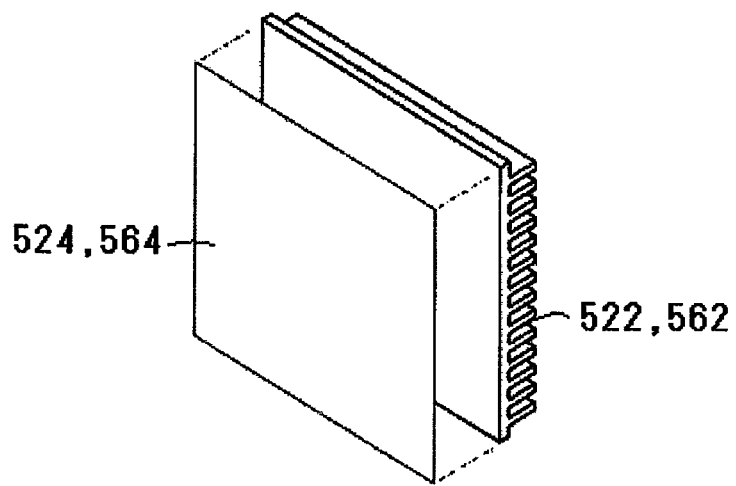
FIG. 28 is an explanatory view of vacuum thermocompression bonding of a conductor plate via a heat radiating sheet to heat radiating fins of a semiconductor module.

FIG. 22 is a view that illustrates in an oblique perspective manner the internal structure of a semiconductor module relating to the present embodiment by showing a developed view of heat radiating fins (A side) on one side of the semiconductor module and heat radiating fins (B side) on the other side thereof. FIG. 23 is a view that illustrates the structure of an upper and lower arm series circuit that is adhered to the inside of the heat radiating fins (A side) of the semiconductor module. FIG. 24 is an oblique perspective view that illustrates the structure of an upper and lower arm series circuit that is adhered to the inside of the heat radiating fins (B side) of the semiconductor module. FIG. 25 is an oblique perspective view that illustrates the structure of an upper and lower arm series circuit that is adhered to the inside of the heat radiating fins (A side) of the semiconductor module. FIG. 26 is a front view of the structure shown in FIG. 25. FIG. 27 is an oblique perspective view that shows a wire bonding state and a structure of a conductor plate that is bonded by a vacuum thermocompression method to the inside of heat radiating fins of the semiconductor module. FIG. 28 is an explanatory view of vacuum thermocompression bonding of a conductor plate via an insulating sheet to heat radiating fins of the semiconductor module.

In FIGS. 18 to 21, a semiconductor module 500 relating to the present embodiment comprises heat radiating fins (A side) 522 on one side (the term "heat radiating fins" refers to not just a fin-shaped portion, but to the entire heat radiating metal), heat radiating fins (B side) 562 that is on the other side, an upper and lower arm series circuit 50 that is sandwiched between the two heat radiating fins 522 and 562, various terminals including a positive electrode terminal 532, a negative electrode terminal 572, and an alternating current terminal 582 of the upper and lower arm series circuit, and a top case 512, a bottom case 516, and a side case 508. As shown in FIG. 19 and FIG. 20, in a state in which upper and lower arm series circuits on conductor plates that are respectively adhered through an insulating sheet to the heat radiating fins (A side) 522 and the heat radiating fins (B side) 562 (the fabrication method is described later) are sandwiched between the heat radiating fins (A side) 522 and the heat radiating fins (B side) 562, the bottom case 516, the top case 512, and the side case 508 are attached and a mold resin is filled from the top case 512 side into the area between the two heat radiating fins 522 and 562 to form the semiconductor module 500 as an integrated structure.

The external structure of the semiconductor module 500, as shown in FIG. 18, is one in which the heat radiating fins (A side) and heat radiating fins (B side) are formed bordering a cooling channel, and the positive electrode terminal 532 (corresponds to P terminal 57 shown in FIG. 2), the negative electrode terminal 572 (corresponds to N terminal 58 shown in FIG. 2), the alternating current terminal 582 (corresponds to alternating current terminal 59 shown in FIG. 2), a signal terminal (for upper arm) 552, a gate terminal (for upper arm) 553, a signal terminal (for lower arm) 556, and a gate terminal (for lower arm) 557 of the upper and lower arm series circuit 50 protrude from the top case 512.

The external shape of the semiconductor module 500 is a substantially rectangular solid shape, in which the area of the heat radiating fins (A side) 522 and the heat radiating fins (B side) 562 is large, and when the surface of the heat radiating fins (B side) is taken as the front surface and the heat radiating fins (A side) is taken as the rear surface, the two side surfaces consisting of the side having the side case 508 and the opposite side thereto as well as the bottom surface and top surface are narrow in comparison to the aforementioned front surface and rear surface. Since the basic shape of the semiconductor module is a substantially rectangular solid shape and the heat radiating fins (B side) and (A side) are square, cutting is facilitated. Further, the semiconductor module has a shape which makes it hard to tumble over on the production line and is thus excellent in terms of productivity. Furthermore, the ratio of the heat radiating area to the overall capacity is large, and thus the cooling effect is improved.

In this connection, according to the present embodiment, in the heat radiating fins (A side) 522 and the heat radiating fins (B side) 562, a metal plate for inserting a semiconductor chip and for retaining a conductor inside the semiconductor module and a fin for dissipating heat are made with a single metal. This structure is excellent for increasing the heat dissipation efficiency. However, although the heat dissipation efficiency will decrease slightly, a structure can also be used in which a metal plate for inserting a semiconductor chip and for retaining a conductor inside the semiconductor module and heat radiating fins are formed as separate members and then bonded together.

Further, the positive electrode terminal 532 (corresponds to P terminal 57 shown in FIG. 2), the negative electrode terminal 572 (corresponds to N terminal 58 shown in FIG. 2), the alternating current terminal 582 (corresponds to alternating current terminal 59 shown in FIG. 2), the signal terminal (for upper arm) 552, the gate terminal (for upper arm) 553, the signal terminal (for lower arm) 556, and the gate terminal (for lower arm) 557 are assembled at the top surface that is one of the narrow surfaces of the substantially rectangular solid shape. Thus the structure is excellent in the respect of ease of insertion of the semiconductor module 500 into a channel case. Further, the outer shape of the top surface on which these terminals are provided is, as shown in FIG. 18, made larger than the outer shape of the bottom surface side, and thus the terminal portion that is the portion most easily damaged when the semiconductor module is moved on the production line or the like can be protected. More specifically, by making the outer shape of the top case 512 larger than the outer shape of the bottom case 516, in addition to the effect that the sealing properties of the cooling channel opening that is described later are excellent, there is an effect that the terminals of the semiconductor module can be protected when manufacturing and transporting the semiconductor module and when installing the semiconductor module into a channel case.

According to the disposition of the terminals as described above, the positive electrode terminal 532 and the negative electrode terminal 572 are disposed so as to face each other in a manner in which the respective sectional areas form a rectangular plate shape, and are disposed close to one of the side surfaces of the semiconductor module. Since the positive electrode terminal 532 and the negative electrode terminal 572 are disposed at a side surface side, the wiring to the capacitor module is simple. Further, the connection ends of the positive electrode terminal 532 and the negative electrode terminal 572 and the connection end of the alternating current terminal 582 are disposed in a respectively staggered condition in the cross direction of the semiconductor module (direction linking the two side surfaces of the semiconductor module). It is therefore possible to easily secure a space in which to use an instrument for connecting the connection end of the positive electrode terminal 532 or the negative electrode terminal 572 with another component and connecting the connection end of the alternating current terminal 582 with another component on a production line of the power conversion apparatus, making the structure excellent with respect to productivity.

There is the possibility that a power conversion apparatus for a vehicle may be cooled to minus 30 degrees or more as far as minus 40 degrees. In contrast, there is the possibility that a power conversion apparatus for a vehicle may reached a temperature over 100 degrees, and in some rare cases a temperature close to 150 degrees. It is thus necessary to adequately consider thermal expansion changes over a wide usage temperature range for a power conversion apparatus to be mounted in a vehicle. The power conversion apparatus is also used in an environment which is constantly subjected to vibrations. The semiconductor module 500 that is described using FIG. 18 to FIG. 21 has a structure in which a semiconductor chip is inserted between two heat radiating metals. According to this embodiment metal plates having heat radiating fins with an excellent heat dissipation function are used as one example of the heat radiating metals, and in the present embodiment the metal plates are described as the heat radiating fins 522 (A side) and the heat radiating fins 562 (B side).

In the aforementioned structure in which the semiconductor chip is inserted, the two sides of the aforementioned two heat radiating metals comprise a structure that is fixed by the top case 512 and the bottom case 516. In particular, the top case 512 and the bottom case 516 have a structure in which the above described two heat radiating metals are inserted from the outer side thereof and fixed. According to this structure, a force is always applied from the outer side toward the inner side of the heat radiating metals, and it is possible to prevent a large force occurring between the two heat radiating metals in a direction that attempts to open apart the two heat radiating metals that is cause by vibrations or thermal expansion. It is therefore possible to obtain a highly reliable power conversion apparatus that does not fail even when mounted in a vehicle over a long period.

According to the present embodiment, in addition to the above described two heat radiating metals, since in this structure the aforementioned top case 512 and bottom case 516 including the side cases are also inserted from the outer periphery side and fixed, reliability is further enhanced.

The structure adopted is one in which the positive electrode terminal 532, the negative electrode terminal 572, the alternating current terminal 582, the signal terminals 552 and 554, and the gate terminals 553 and 556 of the semiconductor module are caused to protrude externally through a hole inside the top case 512 that is one of the case, and this hole is then sealed with a mold resin 502. A high strength material is used for the top case 512, and in consideration of the thermal expansion coefficient of the above described two heat radiating metals, a material with a thermal expansion coefficient near thereto, for example, a metallic material, is used. The mold resin 502 acts to decrease stress that is applied to the above terminals by absorbing stress caused by thermal expansion of the case 512. Therefore the power conversion apparatus of the present embodiment has high reliability that enables the power conversion apparatus to be used even in a state in which there is a wide range of temperature changes as described above or in a state in which vibrations are constantly applied.

The formation method and structure of an upper and lower arm series circuit (as an example, a 2 arm in 1 module structure) that is inserted between the two heat radiating fins 522 and 562 are described hereunder referring to FIG. 22 and FIG. 28.

The fundamental process of the production method of the semiconductor module relating to the present embodiment is described in order. Plates of heat radiating metal, for example, according to the present embodiment the heat radiating fins (A side) 522 and the heat radiating fins (B side) 562 that are metal plate comprising a fin structure are employed as a base material, and an insulating sheet (A side) 524 and an insulating sheet (B side) 564 are adhered by vacuum thermocompression bonding to the respective inner sides thereof (see FIG. 28). A positive electrode side of a conductor plate 534 and a first conductor plate 544 are adhered by vacuum thermocompression bonding to the insulating sheet 524 (A side), and a negative electrode side conductor plate 574 and a conductor plate for alternating current (second conductor plate) 584 are adhered to the insulating sheet 564 (B side). Adhering of the conductor plates 534 and 544 to the heat radiating fins (A side) 522 and the insulating sheet (A side) 524 is illustrated in FIG. 25 and FIG. 26, and adhering of the conductor plates 574 and 584 to the heat radiating fins (B side) 562 and the insulating sheet (B side) 564 is illustrated in FIG. 24.

Furthermore, a signal conductor 554 of the signal terminal (for upper arm) 552, a gate conductor 555 of a gate terminal (for upper arm) 553, a signal conductor 558 of a signal terminal (for lower arm) 556, and a gate conductor 559 of a gate terminal (for lower arm) 557 are adhered to the insulating sheet 524 (A side). The dispositional relationship of these components is as shown in FIG. 23.

The insulating sheet (A side) 524 and the insulating sheet (B side) 564 function as insulating members that electrically insulate a conductor or a semiconductor chip comprising an upper and lower arm series circuit of an inverter circuit and the heat radiating fins (A side) 522 or heat radiating fins (B side) 562 as described below. The insulating sheet (A side) 524 and the insulating sheet (B side) 564 also perform a function of forming a heat conduction path that conducts heat generated from a semiconductor chip or the like to the heat radiating fins (A side) 522 or the heat radiating fins (B side) 562. The insulating member may be an insulating plate or an insulating sheet made of resin or may be a ceramic substrate. For example, in the case of a ceramic substrate the thickness of the insulating member is preferably 350 μ-meters or less, and in the case of an insulating sheet the thickness is preferably even thinner at between 50 μ-meters and 200 μ-meters. However, for the inductance reduction that is described later, the effect is greater when the insulating member is thin, and thus an insulating sheet made of resin has superior characteristics in this respect to a ceramic substrate.

Next, IGBT chips 538 and 547 and diode chips 542 and 550 are soldered via solder layers 537, 541, 546, and 549 to protrusions 536, 540, 545, 548 provided in the conductor plates 534 and 544 of the heat radiating fins (A side) 522 (see FIG. 23). At this time, the positive electrode side conductor plate 534 and the first conductor plate 544 are provided in a mutually insulated state and the IGBT chips and diode chips soldered to the conductor plate 534 and 544. Further, as shown in FIG. 2, a connecting plate 594 that connects an emitter electrode of an upper arm and a collector electrode of a lower arm is soldered to the first conductor plate 544 in the same manner as chips 547 and 550. The intermediate electrode 69 between the upper and lower arms (see FIG. 2) is configured by a direct-contact connection between the connecting plate 594 and the conductor plate for alternating current (second conductor plate) 584.

Next, an emitter electrode for signals 661 of the upper arm IGBT 538 that is soldered onto the conductor plate 534 of the heat radiating fins (A side) 522 and the signal conductor 554 of the signal terminal (for upper arm) 552 are connected by wire bonding, and a gate electrode 662 of the upper arm IGBT 538 and the gate conductor 555 of the gate terminal (for upper arm) 553 are connected by wire bonding (see FIG. 27). Likewise, an emitter electrode for signals of the lower arm IGBT 547 that is soldered onto the first conductor plate 544 of the heat radiating fins (A side) 522 and the signal conductor 558 of the signal terminal (for lower arm) 556 are connected by wire bonding, and a gate electrode of the lower arm IGBT 547 and the gate conductor 559 of the gate terminal (for lower arm) 557 are connected by wire bonding (see FIG. 27).

As shown in FIG. 23, two semiconductor chips that comprise the upper arm and lower arm are fixed to the heat radiating fins (A side) 522 as one side of the heat radiating fins, and gate conductors 555 and 559 and signal conductors 554 and 558 for controlling signals to these semiconductor chips are provided. Since semiconductor chips for the upper and lower arms and control lines thereof are fixed to one insulating member in this manner, work such as wire bonding to connect a signal wire and a semiconductor chip can be concentrated in the production process, and productivity and reliability are thereby improved.

Further, when using the apparatus in an environment with large vibrations as in a vehicle, since the semiconductor chips and the control lines that are to be wired are both fixed to one heat radiating fins as the same member, anti-vibration characteristics are enhanced.

In the structure shown in FIG. 23, the upper arm semiconductor chip and the lower arm semiconductor chip are adhered in the same direction, that is, their respective collector surfaces are adhered to the insulating sheet 524 as an insulating member. Matching the directions of the semiconductor chips in this manner improves workability. The same applies with respect to the diode chips.

In the structure shown in FIG. 23, the upper arm semiconductor chip and the lower arm semiconductor chip are disposed in a condition in which they are divided between the back side and the front side in the lead direction of the terminals. As described later, this lead direction of the terminals matches the direction of insertion to the channel. The upper arm semiconductor chip and the lower arm semiconductor chip are disposed in a condition in which they are divided between the back side and the front side in the direction of insertion to the channel. By adopting this disposition, the layout of electrical components within the semiconductor module becomes systematic, and the overall size is reduced. Further, since the heat sources are systematically separated (since the on/off operations of each IGBT among the plurality of IGBTs as heat generating sources are systematically changed), the structure has excellent heat dissipation properties. Furthermore, since the heat radiating surfaces are systematically separated, even if the semiconductor module is subjected to a comparative reduction in size, the heat radiating surfaces act effectively to improve the cooling effect.

Next, the heat radiating fins (B side) 562 is described. A conductor plate that is subjected to vacuum thermocompression bonding is adhered through the insulating sheet 564 as an insulating member to the heat radiating fins (B side) 562. As shown in FIG. 24, a conductor plate for alternating current 584 extending an alternating current terminal 582 and a negative electrode side conductor plate 574 extending a negative electrode terminal 572 are disposed in a mutually insulated state on an insulating sheet 564 as an insulating member, and protrusions 576, 578, 586, and 588 are provided as shown in the figure on the respective conductor plates 574 and 584. The protrusions 576 and 586 are connected to IGBT chips, and the protrusions 578 and 588 are connected to diode chips.

In FIG. 24, as shown in a partially enlarged view S1, D1 and D2 represent the thickness of protrusions. The reason D1>D2 is that the diode chips are thicker than the IGBT chips. As shown in FIG. 23, on the inner side of the heat radiating fins (A side) 522, the emitter electrode of the upper arm and the anode electrode of the diode are presented in a projecting shape on the positive electrode side conductor plate 534 having the positive electrode terminal 532. Further, on the conductor plate 544, the emitter electrode of the lower arm and the anode electrode of the diode are presented in a projecting shape and a connecting plate 594 constituting the intermediate electrode 69 is presented in a projecting shape.

Subsequently, the heat radiating fins (A side) 522 and the heat radiating fins (B side) 562 are disposed facing each other as shown in FIG. 22, and the protrusions 586, 588, 576, and 578 on the conductor plates 574 and 584 on the heat radiating fins (B side) 562 are soldered in a condition facing the electrodes of the IGBT chips 538 and 547 and the diode chips 542 and 550 of the heat radiating fins (A side) 522 so as to connect the electrodes. Further, the connecting plate 594 provided on the first conductor plate 544 of the heat radiating fins (A side) 522 is disposed so as to face the conductor plate for alternating current 584 provided on the heat radiating fins (B side) 562 and soldered. Next, the bottom case 516, the top case 512, and the side case 508 are adhered with an adhesive to the heat radiating fins (A side) 522 and the heat radiating fins (B side) 562 that form an integrated structure (see FIG. 20). Further, a mold resin is filled inside this structure from a hole 513 in the top case to form the semiconductor module 500.

As shown in FIG. 22 or FIG. 24, one of the DC terminals and an alternating current terminal are disposed in a single insulating member. Thus, by adopting a configuration in which a wiring member is disposed in the heat radiating fins (B side) 562 and disposition of the semiconductor chips is concentrated in the heat radiating fins (A side) 522, productivity is improved.

The positive electrode terminal 532, the negative electrode terminal 572, the alternating current terminal 582, and the respective conductor plates 534, 574, and 584 inside the semiconductor module are formed as an integrated object, thereby enhancing productivity. Further, these conductors are adhered to respective heat radiating metals through an insulating member to enclose the semiconductor chip. As a result of a reactive force of the enclosed semiconductor chip, these conductor plates receive a force in a direction that presses against the respective heat radiating metals, to thereby enhance the reliability of the aforementioned adhesion. Since the terminals and the respective conductors are formed as an integrated whole as described above, reliability relating to fixing of the terminals, and not only the conductors, is also enhanced. Accordingly, when applying the semiconductor module of the above described structure to a power conversion apparatus of a vehicle, a high level of reliability can be retained in an environment subjected to vibrations and the like.

Figure 34:
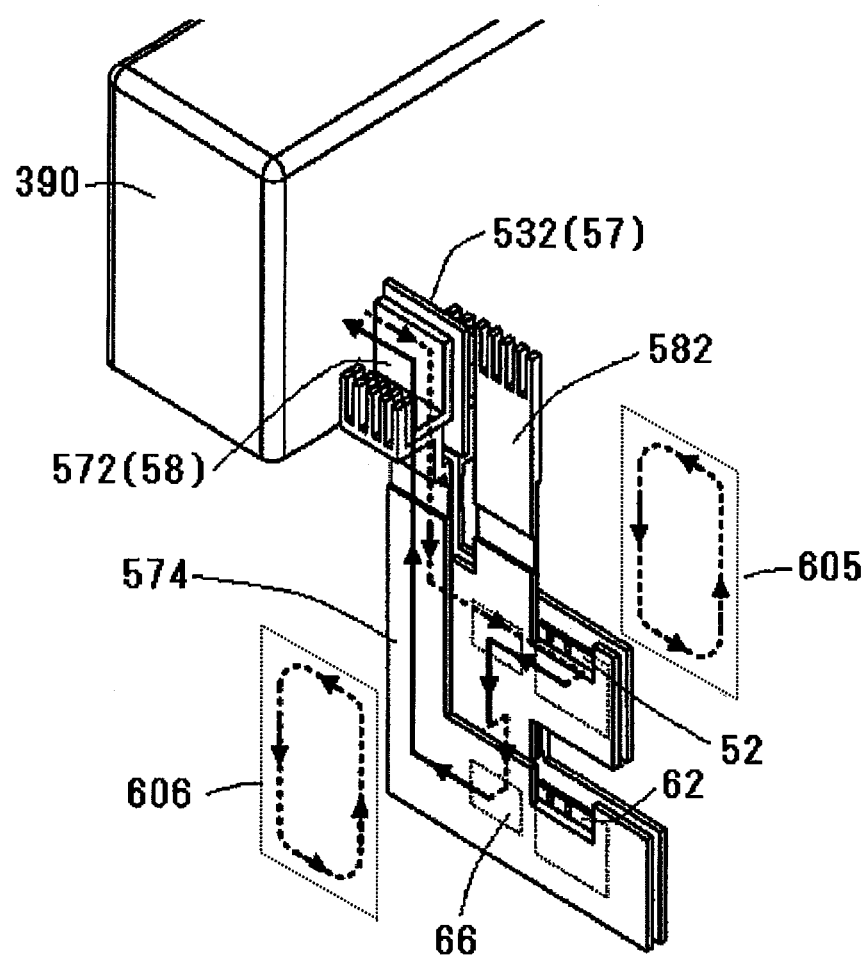
FIG. 34 is a structural layout drawing that illustrates an inductance lowering effect of a semiconductor module relating to the present embodiment.
Figure 35:
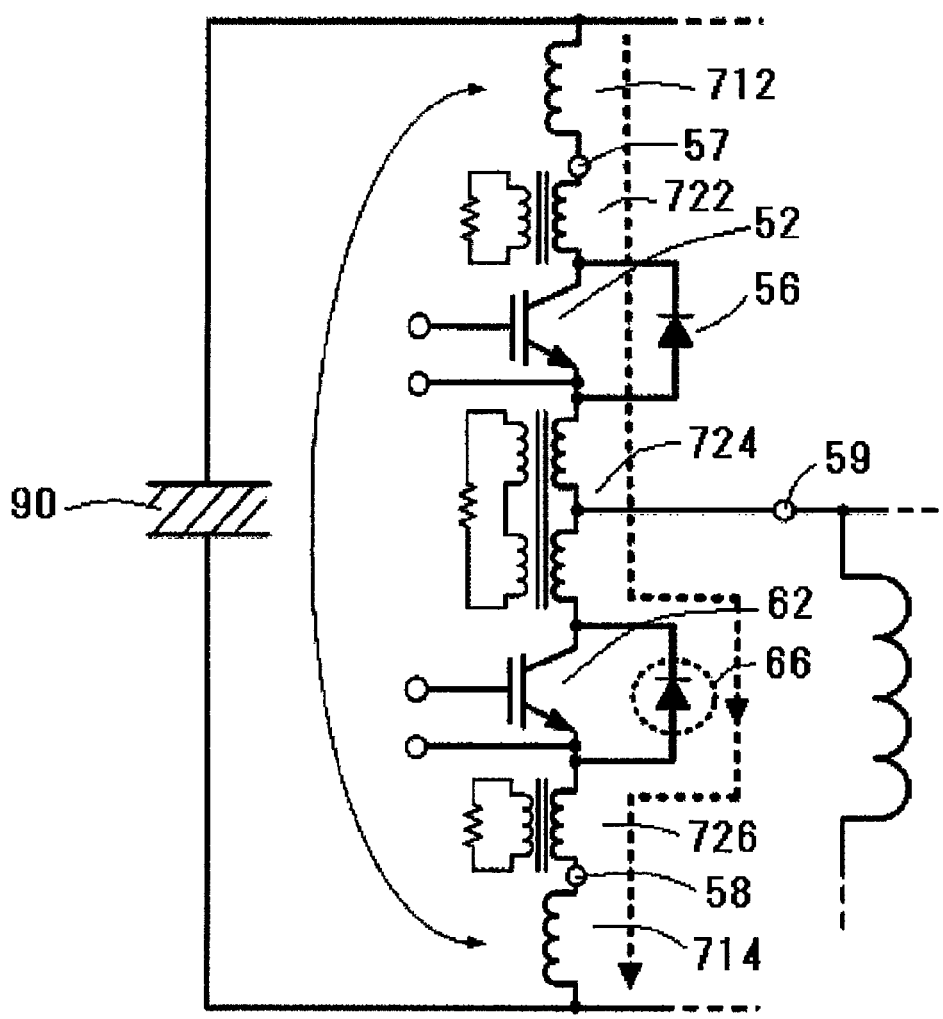
FIG. 35 is a circuit layout drawing that illustrates an inductance lowering effect of a semiconductor module relating to the present embodiment.

Next, the achievement of low inductance by the circuit layout designed in the semiconductor module relating to the present embodiment is described while referring to FIG. 34 and FIG. 35. However, first, the method of attaching a semiconductor chip will be summarized again using FIG. 2, FIG. 22, FIG. 24, and FIG. 25. In this case, with respect to the upper arm, on the heat radiating fins (A side) 522 a collector and a cathode of a semiconductor chip comprising a diode and a IGBT are soldered to a conductor plate 534 (Cu lead) of a positive plate as the positive electrode terminal 532 (P terminal), and the emitter electrode of the IGBT and the anode electrode of the diode are exposed on the surface of the semiconductor chip. On the heat radiating fins (B side) 562, protrusions 586 and 588 are provided facing the emitter electrode and anode electrode of the heat radiating fins (A side) 522 on the conductor plate for alternating current 584 (Cu lead). At an extension portion of the conductor plate for alternating current 584 are provided the alternating current terminal 582 (terminal connecting to the U-phase, V-phase, or W-phase of the motor generator 92). When the heat radiating fins (A side) 522 and the heat radiating fins (B side) 562 are superimposed and soldered, a circuit of the upper arm 52 and 56 shown in FIG. 2 is formed to form a shape in which the alternating current terminal 582 and the positive electrode terminal 532 protrude from the top case 512 as shown in FIG. 18 and FIG. 22.

The basic structure of the present embodiment is described above. According to the present embodiment, in addition to the above described upper arm (upper semiconductor chip), a lower arm (lower semiconductor chip) is also formed in the same manner on the heat radiating fins (A side) 522 and the heat radiating fins (B side) 562. As shown in FIG. 23, as a lower arm, the IGBT 62 and the diode 66 shown in FIG. 2 are soldered on the conductor plate 544 of the heat radiating fins (A side) 522 in the same manner as for the upper arm. At this time, the conductor plate of the heat radiating fins (A side) 522 forms two upper and lower tiers, the semiconductor chips of the upper and lower arms are soldered onto the respective tiers, and the emitter electrode of the IGBT and the anode electrode of the diode are exposed on the surface thereof. On the conductor plates 574 and 584 of the heat radiating fins (B side) 562, protrusions 576, 578, 586, and 588 are provided at positions opposing the anode electrodes and emitter electrodes of the upper and lower arms of the heat radiating fins (A side) 522, and a negative electrode terminal 572 is provided at an extension portion of the lower tier conductor plate 574 of the heat radiating fins (B side) 562 and an alternating current terminal 582 is provided at an extension portion of the upper tier conductor plate 584.

With this structure, the emitter electrode and the anode electrode 542 of the IGBT chip 538 of the upper arm is connected to the alternating current terminal 582 through the protrusion 586 and protrusion 588. Further, the collector electrode and the cathode electrode of the IGBT chip 547 of the lower arm are connected via the conductor plate 544 and the protrusion-shaped connecting plate 594 to the conductor plate for alternating current 584 to communicate with the alternating current terminal 582. Furthermore, the emitter electrode 547 and anode electrode 550 of the lower arm communicate with the negative electrode terminal 572 through the protrusions 576 and 578. Thus, the circuit configuration shown in FIG. 2 is formed. FIG. 23 shows a butting surface of the heat radiating fins (A side) 522. FIG. 24 shows a butting surface of the heat radiating fins (B side) 562. These butting surfaces are matched and soldered to form a principal portion of the semiconductor module.

As shown in FIGS. 18 to 28, according to the power conversion apparatus of the present embodiment, the semiconductor module 500 has a structure in which semiconductor chips are wedged between two heat radiating metals. According to this embodiment metal plates, heat radiating fins 522 (A side) and heat radiating fins 562 (B side), having heat radiating fins with an excellent heat dissipation function are used as one example of a heat radiating metal. A structure is adopted in which the IGBT chips 538 and 547 as semiconductor chips are wedged between conductor plates provided on the inner side of two heat radiating metals. According to this structure, low-temperature soldering can be used as soldering for electrical connections. When using low-temperature soldering, there is a possibility that after fixing a semiconductor chip to one of the heat radiating metals when a solder has melted once, the aforementioned soldered portion will melt again in a process that sandwiches the semiconductor chip with the other heat radiating metal to make an electrical connection.

However, as described above, since a fixing method is employed which strongly inserts the electrodes on both sides of the semiconductor chip, for example, according to the present embodiment the collector electrode and emitter electrode of the IGBT chip, even if the solder layer melts again a problem that results in a fault does not occur. For this reason, low-temperature soldering can be used. Not only does low-temperature soldering lead to favorable productivity in comparison to high-temperature soldering, but thermal conductivity is also superior compared to high-temperature soldering. Therefore, by adopting a structure that can use low-temperature soldering, a semiconductor module with excellent heat resistance can be obtained, and a significant effect can be obtained from the viewpoint of reliability when applied to a power conversion apparatus to be mounted in a vehicle.

As shown in FIGS. 18 to 28, according to the power conversion apparatus of the present embodiment, the semiconductor module 500 has a structure in which semiconductor chips are wedged between two heat radiating metals. By adopting a structure in which semiconductor chips are inserted between heat radiating metals in this manner, a power conversion apparatus for a vehicle can be obtained which can be used in an environment in which vibrations are constantly present and for which the usage temperature range is extremely wide. Further, the present embodiment has a structure in which the top sides of the above described two heat radiating metals that sandwich the semiconductor chips are fixed with the top case 512, and the positive electrode terminal 532, the negative electrode terminal 572, and the alternating current terminal 582 of the semiconductor module protrude to outside from the top case 512. The present embodiment also has a portion in which the sectional area of the terminals narrows at the base of the aforementioned positive electrode terminal 532, the negative electrode terminal 572, and the alternating current terminal 582 of the semiconductor module that protrude externally. The conductors 534, 574, and 584 inside the semiconductor module of each terminal are fixed to one or the other of the heat radiating metals to provide a strong structure with respect to vibrations. Further, although not shown in the drawings, by providing respective portions with small sectional areas between the terminals that protrude externally and the inner conductors, it is possible to reduce the amount of stress produced by vibrations from outside or stress produced by thermal expansion being applied as it is to the inner conductors.

Next, achievement of low inductance in the semiconductor module according to the present embodiment is described using FIG. 34 and FIG. 35. Since a transient voltage rise or a large heat generation in a semiconductor chip occurs at the time of a switching operation of an upper or lower arm configuring an inverter circuit, it is preferable to reduce inductance at the time of a switching operation in particular. Since the recovery current of a diode occurs at the time of a transition, based on this recovery current the action of inductance reduction will now be described taking as one example the recovery current of the diode 66 of a lower arm.

The recovery current of the diode 66 is a current that flows regardless of the fact that the diode 66 has a reverse bias, and it is generally said that the recovery current is ascribable to carriers that are filled inside the diode 66 in a forward direction state of the diode 66. When a conduction operation or cutoff operation of an upper or lower arm constituting the inverter circuit is performed in a predetermined order, a three-phase alternating current power is generated in the alternating current terminal of the inverter circuit. At this time, when the semiconductor chip 52 operating as an upper arm switches from a conducting state to a cutoff state, a return current flows through the diode 66 of the lower arm in a direction that maintains the current of the stator winding of the motor generator 92. This return current is a forward direction current of the diode 66, and the inside of the diode is filled with carriers. Next, when the semiconductor chip 52 operating as the upper arm stitches from a cutoff state to return to a conducting state again, a recovery current ascribable to the aforementioned carriers flows into the diode 66 of the lower arm. In routine operations either one of the upper and lower arm series circuits is always in a cutoff state, and although a state does not occur in which a short circuit current flows to the upper and lower arms, a transient state current, for example, a recovery current of a diode, flows through a series circuit comprising the upper and lower arms.

When an IGBT (semiconductor device for switching) 52 operating as an upper arm of the upper and lower arm series circuit in FIG. 34 and FIG. 35 changes from off to on, a recovery current (indicated by an arrow in the drawings) of the diode 66 flows from the positive electrode terminal 532 (57) to the negative electrode terminal 572 (58) through the IGBT 52 and the diode 66. At this time the IGBT 62 is in a cutoff state. When the flow of this recovery current is observed, as shown in FIG. 34 it is found that in the vicinity of the positive electrode terminal 532 and the negative electrode terminal 572 conductor plates are parallelly disposed and the same current flows in reverse directions. Thus, magnetic fields produced by the current of each conductor plate in the space between the conductor plates cancel each other out, and as a result the inductance in the current path decreases.

More specifically, because the positive electrode side conductor 534 and terminal 532 and the negative electrode side conductor 574 and terminal 572 are in a laminated state in which they are adjacent and opposingly disposed, an inductance lowering action occurs. FIG. 35 is an analogous circuit to FIG. 34, in which an equivalent coil 712 of the terminal 532 and the conductor 534 on the positive electrode side and an equivalent coil 714 of the terminal 572 and the conductor 574 on the negative electrode side act in a direction that cancels out each others' magnetic flux to thereby lower the inductance.

Further, when the path of the recovery current shown in FIG. 34 is observed, it is found that a path with a loop shape arises following the paths of the currents that are parallel and flow in inverse directions. When a current flows through this loop-shaped path, eddy currents 605 and 606 flow to the heat radiating fins (A side) and the heat radiating fins (B side), and an action that reduces inductance in the loop-shaped path occurs as a result of a magnetic field cancellation effect produced by these eddy currents. In the analogous circuit shown in FIG. 35, a phenomenon that produces an eddy current is equivalently represented by inductances 722, 724, and 726. Since these inductances are positioned near the metal plate that is the heat radiating fins, a relationship is entered in which magnetic fluxes produced by eddy currents generated by induction are cancelled out, and as a result the inductance of the semiconductor module is reduced by the eddy current effect.

As described above, according to the layout of the circuit configuration of the semiconductor module relating to the present embodiment, inductance can be reduced by the effect produced by a laminated arrangement and the effect produced by eddy currents. Reducing inductance at the time of a switching operation is important and thus according to the semiconductor module of the present embodiment the series circuit of the upper arm and the lower arm is housed inside the semiconductor module. Therefore, there is a significant inductance lowering effect in transient state, including the fact that a low inductance can be achieved with respect to the recovery current of a diode that flows through an upper and lower arm series circuit.

When the inductance is reduced, an induction voltage produced in the semiconductor module decreases and it is possible to obtain a low-loss circuit configuration. An improvement in the switching speed can also be obtained as a result of the low inductance. Further, as described later referring to FIG. 31, when adopting a configuration for achieving a large capacity by disposing a plurality of semiconductor modules 500 comprising the above described upper and lower arm series circuits 50 in parallel and connecting them with each capacitor 90 inside the capacitor module 95, the effects of variations in the inductance produced by the semiconductor modules 500 inside the power conversion apparatus 100 decrease because of a reduction in the inductance of the semiconductor modules 500 themselves, and the operation of the inverter device is stable.

Figure 31:
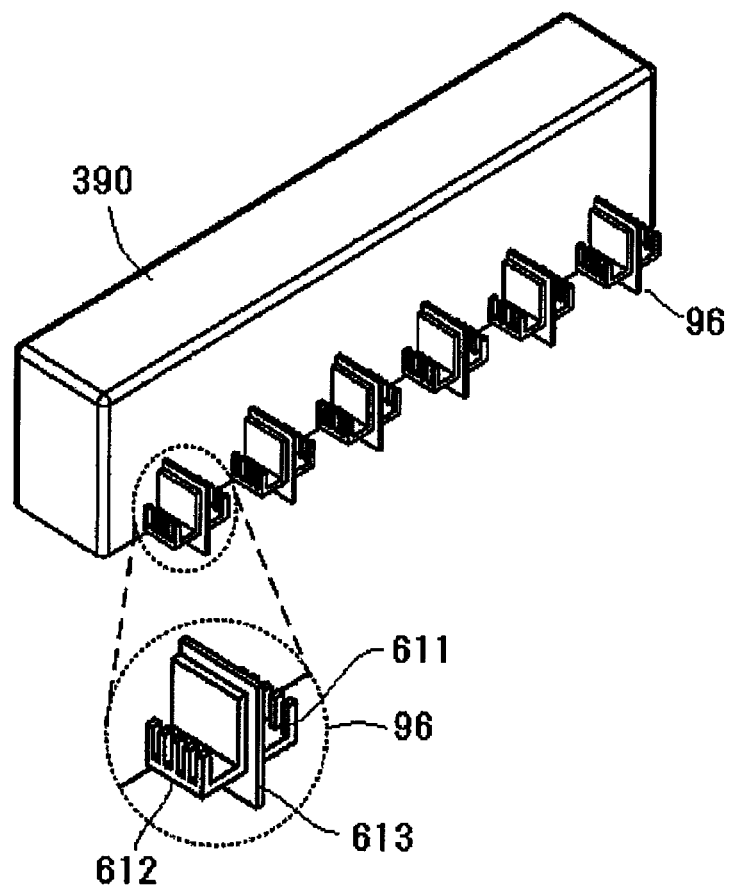
FIG. 31 is a view showing connection terminals of a capacitor module of the power conversion apparatus according to the present embodiment.

Further, when it is desired to achieve a large capacity (for example, 400 A or more) for a motor generator, it is necessary to also provide the capacitor 90 with a large capacity, and as shown in FIG. 31, when a large number of individual capacitors 90 are parallelly connected and capacitor terminals 96 are disposed in a parallel condition as shown in the figure, the positive electrode terminal 532 and negative electrode terminal 572 of the respective semiconductor modules are connected at equal distances with respective capacitor terminals 96. As a result, a current flowing to each of the semiconductor modules is equally distributed, making it possible to achieve well-balanced, low-loss motor generator operations. Further, as a result of the parallel disposition of the positive electrode terminal and negative electrode terminal of the semiconductor module, together with the reduction in inductance by the laminated effect, low-loss operations can be performed.

Next, the specific contents disclosed in the drawings will be described for a configuration example of the power conversion apparatus according to the present embodiment. FIG. 18 is a view that shows the external appearance of a semiconductor module with heat radiating fins relating to the present embodiment. FIG. 19 is a sectional view of the semiconductor module shown in FIG. 18 when the section indicated by alternate long and short dashed lines is viewed from the direction of the arrows. FIG. 20 is an expansion plan of the semiconductor module relating to the present embodiment that shows various terminals of the upper and lower arm series circuit, heat radiating fins and cases. FIG. 21 is a view of the semiconductor module shown in FIG. 20 when the section indicated by alternate long and short dashed lines is viewed from the direction of the arrows, which shows a state in which the heat radiating fins 522 and 562 are adhered by adhesion of the bottom case 516 and the top case 512. FIG. 22 is an expansion plan that shows soldering of an IGBT chip, a diode chip and a connecting plate provided on the conductor plate of the heat radiating fins (A side) with protrusions of the conductor plate of the heat radiating fins (B side) in the semiconductor module relating to the present embodiment.

FIG. 23 is a view that shows the specific structure according to which an IGBT chip, a diode chip, and a connecting plate are disposed on the conductor plate of the heat radiating fins (A side). The details thereof are as described above. FIG. 24 is a view showing the specific disposition of protrusions on the conductor plate on the heat radiating fins (B side), in which the fact that there is a difference in the thicknesses D1 and D2 of the protrusions in the partially enlarged view S1 is as described above. FIG. 25 is an oblique perspective view showing the specific disposition of protrusions on the conductor plate of the heat radiating fins (A side), in which S2 denotes a partially enlarged view. In S2, reference characters D3 denote the thickness of a protrusion 540, reference characters D4 denote the thickness of a protrusion 536, and reference characters D5 denote the thickness of a protrusion 592. The reason these thicknesses differ is to compensate for the differences in the thicknesses of the diode chip, the IGBT chip, and the connecting plate 594. FIG. 26 is a front view of the structure shown in FIG. 25. FIG. 27 is a view that shows a state in which the conductor plate of the heat radiating fins (A side) and the conductor plate of the heat radiating fins (B side) overlap each other, and shows a wire bonding state between the signal conductor 554 and gate conductor 555 and the emitter electrode terminal 661 and gate electrode terminal 662 in the IGBT of the upper and lower arm series circuit. FIG. 28 is a view showing vacuum thermocompression bonding of the insulating sheets 524 and 564 to the heat radiating fins 522 and 562.

In FIG. 23 and FIG. 27, the emitter electrode 538 of the upper arm 52 is illustrated as a rectangular shape, and at an upper portion thereof at a distance from the rectangular-shaped emitter electrode 538 are formed the emitter electrode terminal for signals 661 (corresponds to symbol 55 in FIG. 2) and the gate electrode terminal 662 (corresponds to symbol 54 in FIG. 2). As described above, the emitter electrode terminal for signals 661 and the signal conductor 554 are subjected to wire bonding, and the gate electrode terminal 662 and the gate conductor 555 are subjected to wire bonding. On the heat radiating fins (B side) 562, a concave-shaped conductor plate for alternating current 584 is formed so as to cover the rectangular-shaped emitter electrode 538. The emitter electrode terminal for signals 661 and the gate electrode terminal 662 are exposed through this concave hollow portion. In the configuration example shown in FIG. 23 and FIG. 27, the rectangular-shaped emitter electrode 538 provided on the heat radiating fins (A side) 522 and the concave shaped conductor plate for alternating current 584 provided on the heat radiating fins (B side) 562 are shown.

The emitter electrode 538 and the conductor plate for alternating current 584 shown in the enlarged display view surrounded by a dotted line frame in FIG. 27 effect improvements in terms of current capacity and heat release with respect to the shape of an emitter electrode of an IGBT chip. The improvements produced by this change in shape will be described using FIG. 41. In a normal IGBT, as shown in FIG. 23, an emitter electrode has a substantially square shape, and on the outside area of this square shape are provided the emitter electrode terminal for signals 661, the gate electrode terminal 662 and, as necessary, other electrodes. In this case, as shown in FIG. 24, the substantially square emitter electrode and the conductor 574 or the conductor 584 are electrically connected.

Figure 41:
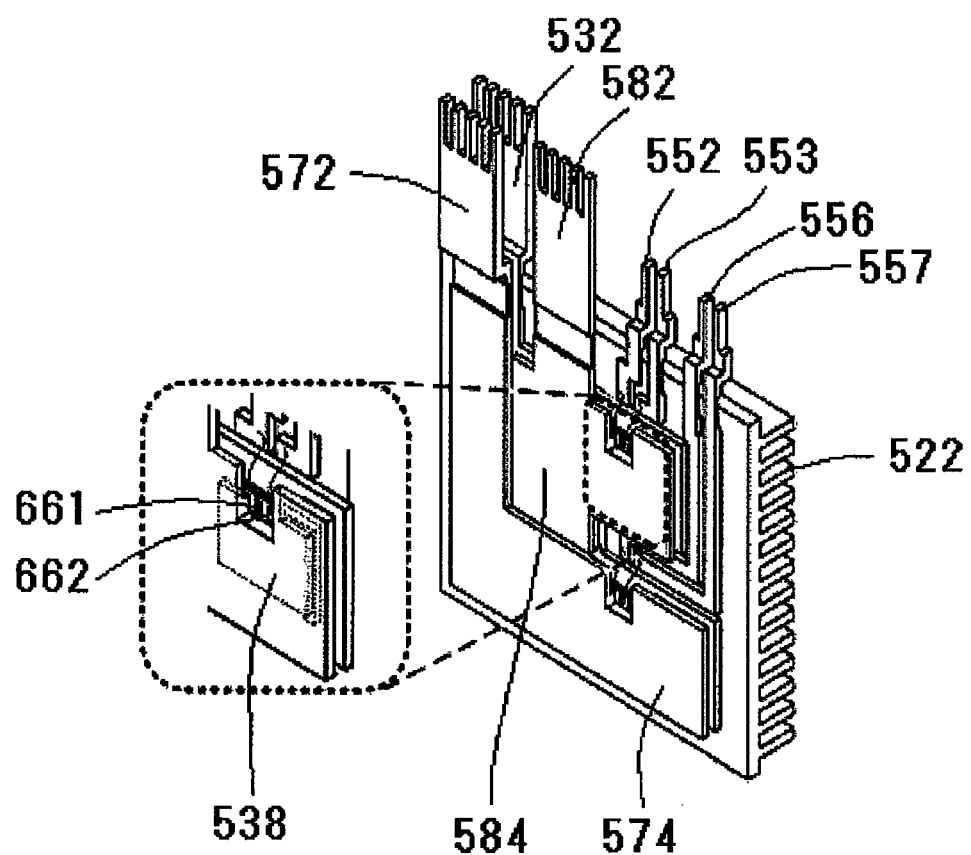
FIG. 41 is a view showing a configuration example that enlarges the area of an emitter electrode of an IGBT chip in a semiconductor module.

In FIG. 27 and FIG. 41 the proportion of the area of the emitter electrode 538 on the IGBT chip 52 is increased. More specifically, instead of the rectangular shape shown in FIG. 23, the area of the emitter electrode is formed in a concave shape to expose only the emitter electrode for signals 661 and the gate electrode 662, and the emitter electrode terminal for signals 661 and the gate electrode terminal 662 and, as necessary, other electrodes are provided in this concave area. Further, in order that the enlarged emitter electrode having a concave portion electrically connects with the conductor plate for alternating current 584 or the conductor 574, a concave portion is also provided in the conductors 584 and 574 to adopt a configuration that enlarges the connection area with the emitter electrode. As a result of this area enlargement of the emitter electrode, the current density of the emitter of the IGBT chip 52 drops and the heat radiating area also increases. Further, to enhance thermal diffusion, the area of the conductor plates 584 and 574 is enlarged by providing the conductor plate for alternating current 584 and the conductor 574 in a concave shape such that they face the concave-shaped outer edge of the emitter electrode 538 having the enlarged area (in comparison with the conductor plates for alternating current 584 and 574 shown in FIG. 24 that do not have a concave shaped hollow portion in a shape corresponding to the emitter electrode, the conductor plates in FIG. 27 and FIG. 41 have a hollow portion).

Figure 32:
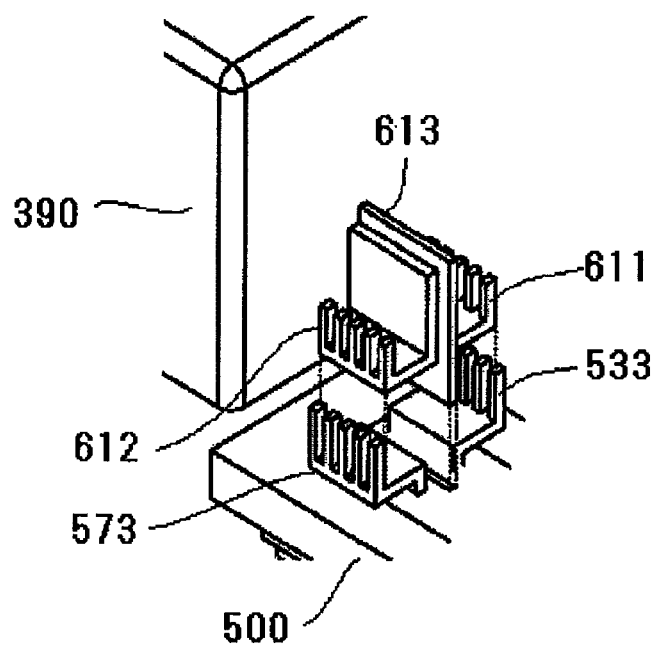
FIG. 32 is an oblique perspective view illustrating a connection state between a capacitor module and a semiconductor module relating to the present embodiment.
Figure 33:
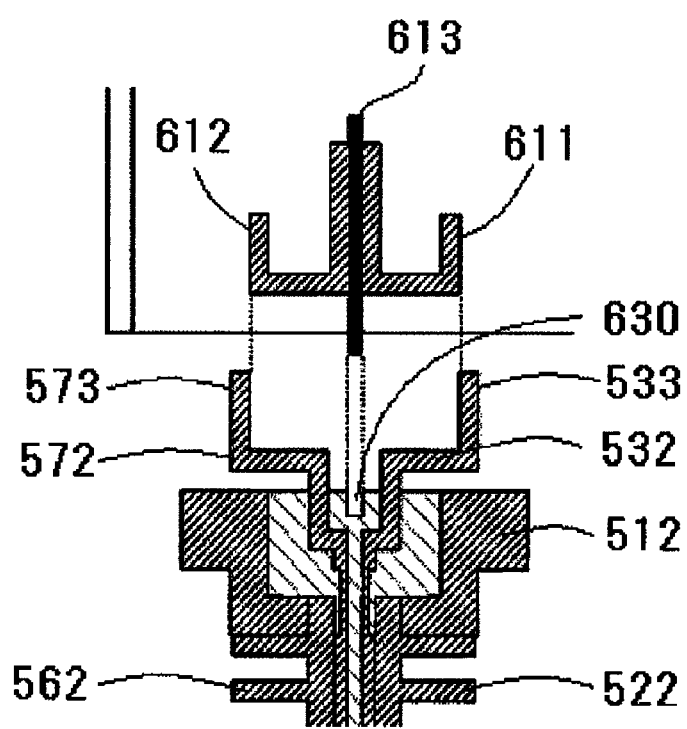
FIG. 33 is a sectional view illustrating a connection state between a capacitor module and a semiconductor module relating to the present embodiment.

Next, the connection between the semiconductor module and the capacitor module relating to the present embodiment is described while referring to FIG. 31, FIG. 32, and FIG. 33. In this case, although the capacitor module may be configured with a single electrolytic capacitor or film capacitor, since it is preferable to obtain a larger capacity with a small volume, a configuration in which a plurality of electrolytic capacitors or film capacitors are electrically connected in parallel is preferred. Further, by parallelly connecting a plurality of unit capacitors and covering the outer side thereof with a metal with excellent heat dissipation properties, a small sized capacitor module with high reliability can be obtained. In comparison to a film capacitor, the amount of generated heat of an electrolytic capacitor is large and in particular the effect thereof is large.

Further, by covering the outside with a metal, fixation of the unit capacitors that are inside the capacitor module to the inside of the power conversion apparatus is strengthened, and is strong with respect to vibrations. For example, frequencies of various components are included in vibrations of a vehicle and there is a risk that the unit capacitors within the aforementioned capacitor module will resonate. It is therefore preferable to firmly fix one or a plurality of unit capacitors within the capacitor module and, as described later, to also firmly fix the capacitor module inside the power conversion apparatus and, for example, to firmly fix the apparatus in a channel case.

FIG. 31 is a view showing connection terminals of a capacitor module of the power conversion apparatus according to the present embodiment. FIG. 32 is an oblique perspective view illustrating a connection state between a capacitor module and a semiconductor module relating to the present embodiment, and FIG. 33 is a sectional view illustrating this connection state. In the figures, reference numeral 390 denotes a capacitor module, reference numeral 96 denotes a capacitor terminal, reference numeral 611 denotes a capacitor positive electrode terminal, reference numeral 612 denotes a capacitor negative electrode terminal, reference numeral 613 denotes an insulation guide, reference numeral 533 denotes a positive electrode terminal comb of the semiconductor module, reference numeral 573 denotes a negative electrode terminal comb of the semiconductor module, and reference numeral 630 denotes an insertion opening.

In the example illustrated in the drawings, the capacitor module 390 is provided with capacitor terminals 96 that respectively correspond with the U-phase, V-phase, and W-phase of the motor. Respective capacitors 90 are provided inside the capacitor module in correspondence with the number of terminals 96.

The positive electrode terminal 611 and the negative electrode terminal 612 of the capacitor terminal 96 are formed in a comb shape as shown in the drawings, similarly to the comb shapes 533 and 573 of the positive electrode terminal 532 and the negative electrode terminal 572 of the semiconductor module 390. By making the connection terminals of both the capacitor module 390 and the semiconductor module in a comb shape, welding and other adhesive connections are facilitated between the connection terminals of the capacitor module 390 and the semiconductor module. Further, an insulation guide 613 is provided at a center part of the terminals of the capacitor module 390. The insulation guide 613 provides insulation between the positive electrode terminal 611 and the negative electrode terminal 612, and by inserting the insulation guide 613 into the insertion opening 630 of the semiconductor module the insulation guide 613 also performs a guide function for connecting together the connection terminals of the capacitor module and the semiconductor module.

According to the present embodiment, a DC terminal of the capacitor module 390 is provided in correspondence with each direct current side terminal of the semiconductor module 500, and inductance is reduced between the terminals of the capacitor module 390 and the terminals of the semiconductor module. Although it is preferable from an inductance reduction viewpoint to directly connect the terminals of the capacitor module and the terminals of the semiconductor module, as in the present embodiment, a situation may be considered in which the capacitor module and the semiconductor module can not be adjacently disposed. As shown in FIG. 2 and FIG. 3, the capacitor and each upper and lower arm series circuit of the inverter circuit are in a parallelly connected relationship and, for example, a configuration may be adopted in which a direct current bus bar that is disposed facing the DC positive electrode conductor and the DC negative electrode conductor is used, one end of the direct current bus bar is connected to the positive electrode terminal 611 and the negative electrode terminal 612 of the capacitor module 390, and the other end of the direct current bus bar is connected to the positive electrode terminal 532 and the negative electrode terminal 572 of the semiconductor module. By disposing the conductors in an opposing condition as close as possible to each other so that the respective magnetic fluxes generated by the DC positive electrode conductor and the DC negative electrode conductor comprising the direct current bus bar cancel each other out, an inductance increase can be suppressed.

In a case in which each phase of a inverter circuit is configured with a plurality of upper and lower arm series circuit that are parallelly connected as shown in FIG. 3, even when using the above described direct current bus bar it is preferable that the parallelly connected plurality of upper and lower arm series circuits constituting each phase are placed in electrically equivalent conditions. Accordingly, on the semiconductor module side of the aforementioned direct current bus bar, it is preferable that respective connection terminals are provided in correspondence with terminals of the semiconductor module that constitute each phase, and preferably the shape of those terminals is like the shape of the terminals 96 shown in FIG. 31.

Figure 29:
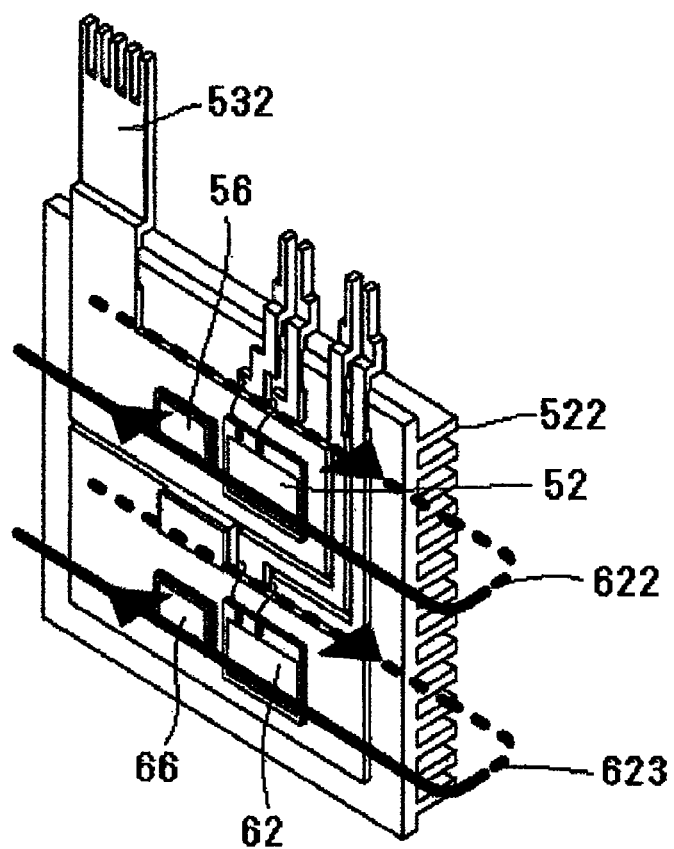
FIG. 29 is a view that represents the flow of cooling water of heat radiating fins (A side) in a semiconductor module related to the present embodiment.
Figure 30:
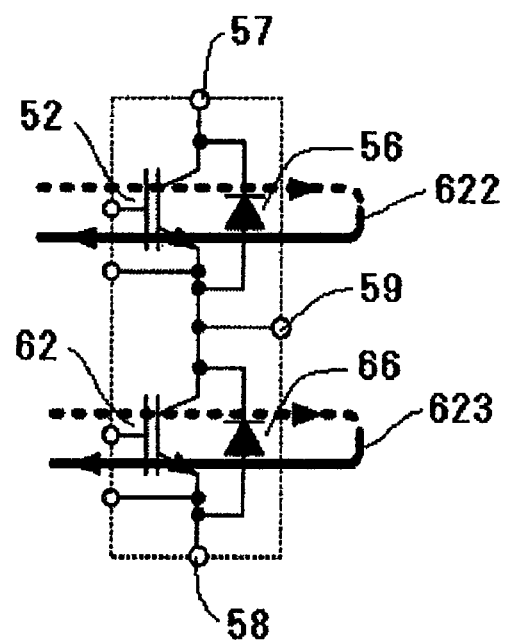
FIG. 30 is a view that represents the relation between cooling water flow in a semiconductor module and the layout of a circuit configuration.

Next, the cooling situation of the semiconductor module relating to the present embodiment is described hereunder while referring to FIG. 29 and FIG. 30. FIG. 29 is a view that represents the flow of cooling water of the heat radiating fins (A side) in a semiconductor module related to the present embodiment. FIG. 30 is a view that represents the relation between the cooling water flow and the layout of the circuit configuration in the semiconductor module shown in FIG. 30. In the figures, reference numeral 622 represents the flow of cooling water in the upper tier of the semiconductor module and reference numeral 623 represents the flow of cooling water in the lower tier of the semiconductor module.

As described above, inside the semiconductor module relating to the present embodiment, the IGBT chip 52 of the upper arm as a heating element and the diode chip 56 are disposed in the same series shape on the upper tier, and the IGBT chip 62 of the lower arm as a heating element and the diode chip 66 are disposed in the same series shape on the lower tier. In this case, the upper tier corresponds to the front side in the insertion direction of the semiconductor module 500 to the cooling channel, and the lower tier corresponds to the back side in the aforementioned insertion direction.

In addition to a heat exchanging function with the cooling water, the semiconductor module 500 has an action that keeps the cooling water in a laminar flow state and also guides the cooling water in a predetermined direction. According to the present embodiment, normally the cooling water forms a horizontal flow along a concave portion (groove) of the concavo-convex shaped heat radiating fins. The cooling water 622 that flows into the upper tier absorbs heat that is generated at the diode chip 56 and the IGBT chip 52 as shown by the dotted line, and forms a return path through a fin concave portion of the heat radiating fins (B side) as shown by the solid line. Likewise, the cooling water 623 that flows into the lower tier absorbs heat that is generated at the IGBT chip 62 and the diode chip 66, without receiving the influence of heat generated from the upper tier semiconductor chips 52 and 56. Thus, by adopting a semiconductor module structure in which semiconductor chips comprising the diode chip and the IGBT chip that are heating elements are differently disposed in upper and lower tiers, the water-cooling effect is augmented.

Next, an outline regarding cooling of the semiconductor module relating to the present embodiment is initially described. As shown in FIG. 18 and FIG. 19, the semiconductor module 500 has built therein an upper and lower arm series circuit 50 including semiconductor chips 52, 56, 62, and 66 of the upper and lower arms that is wedged between the facing heat radiating fins (A side) and heat radiating fins (B side), and is inserted into a channel case 212 shown in FIG. 16 and FIG. 17. The semiconductor module is configured to be cooled by flowing water on the two surfaces of heat radiating plates forming heat radiating fins of the semiconductor module 500. More specifically, a two-sided cooling structure is used in which semiconductor chips as heating elements are cooled from two surfaces consisting of the heat radiating fins (A side) 522 and the heat radiating fins (B side) 562 by cooling water.

In this case, considering the changes regarding cooling of semiconductor modules, although there is a trend that the cooling methods have develop from single-sided indirect cooling systems to single-sided direct cooling systems to two-sided indirect cooling systems and onto two-sided direct cooling systems, in the current cooling systems a structure is often observed in which a plurality of semiconductor devices for switching (IGBT) that are heating elements are provided, these are parallelly connected (to disperse generated heat that the semiconductor devices carry), and a group of parallelly connected semiconductor devices are mounted on a heat radiating plate via a grease layer and an insulating layer. According to this current cooling system, one-sided cooling is performed by a providing a heat radiating plate on one side of the group of semiconductor devices, and indirect cooling is carried out by putting grease between the group of semiconductor devices and the heat radiating plate. Although the grease is originally provided for the purpose of adhering a conductor plate with an insulating layer (Cu lead mounting a group of semiconductor devices) to the heat radiating plate, it is necessary to tightly fix the plate with a screw since the thickness becomes uneven. Although the thermal conductivity of the grease is good, the grease has drawbacks with regard to adhesiveness, thickness uniformity, and insulating properties.

Since the present embodiment has various improvements, for example as shown in FIG. 29 and FIG. 30, even for an indirect cooling system using the aforementioned grease, the heat dissipation effect is improved compared to the conventional system, and various other effects can be obtained as described above. As will be described below, since a semiconductor chip is fixed to a metal for heat dissipation through an insulating member, the heat dissipation effect is improved further. Examples of the insulating member include a ceramic plate or an insulating sheet made of resin, and by fixing the semiconductor chip to the heat radiating metal via these, the heat conduction properties are improved and the heat dissipation effect is improved. In comparison to a ceramic plate, the insulating sheet described below has a thinner thickness and thus can produce a larger effect.

The power conversion apparatus according to the embodiment of the present invention employs a two-sided direct cooling system in which cooling is conducted from both sides of the semiconductor module and, without using grease, an insulating sheet is placed between a heat radiating plate and a conductor plate on which semiconductor chips are mounted to perform vacuum thermocompression bonding, and thus the cooling capability can be improved. According to the present embodiment, as described above with reference to FIG. 28 and FIG. 23, the two-sided direct cooling system is achieved by initially bonding insulating sheets for heat dissipation 524 and 564 (for example, insulating resin with a thickness of 100 to 350 mm) by a vacuum thermocompression bonding to heat radiating fins (heat radiating plates) 522 and 562 comprising Cu or Al, then performing vacuum thermocompression bonding again between the insulating sheets and conductor plates 534, 544, 574 and 584 (for example Cu lead) having positive electrode and negative electrode terminals 532 and 572, and subsequently attaching semiconductor chips by soldering to the conductor plates and water cooling the two sides of the semiconductor module 500 through the heat radiating fins as shown in FIG. 29. In this case, in comparison to grease, the insulating sheets have superior properties with respect to adhesiveness, uniformity of thickness, and insulating properties.

Figure 4:
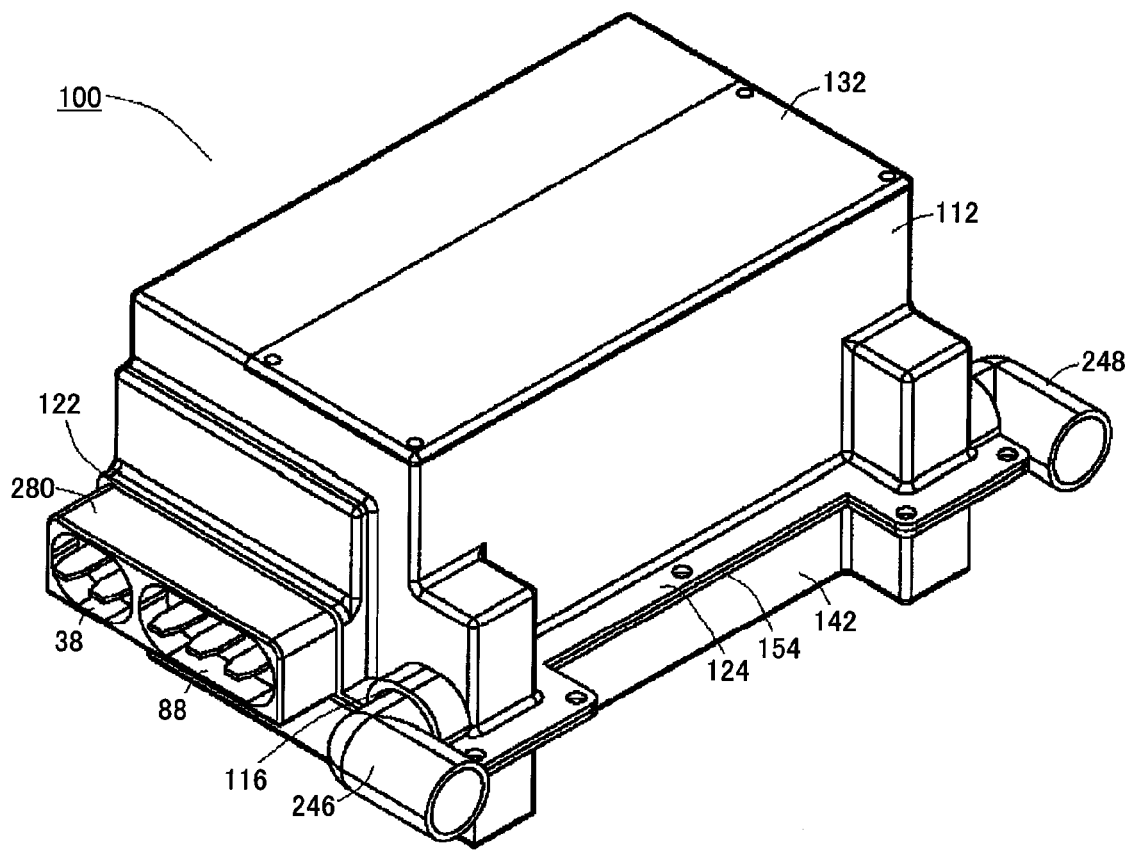
FIG. 4 is a view that illustrates the external shape of a power conversion apparatus according to an embodiment of the present invention.
Figure 5:
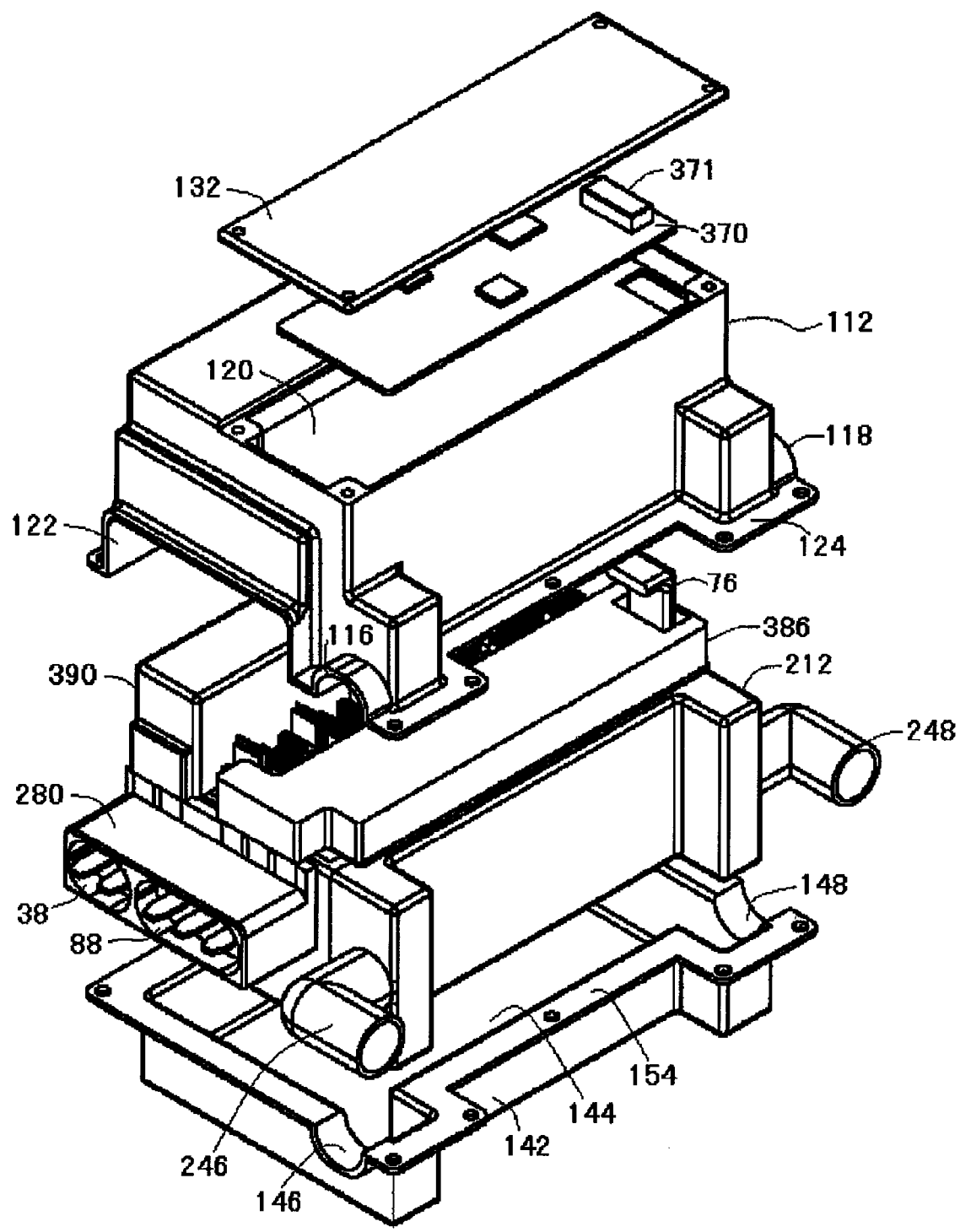
FIG. 5 is an exploded view that gives a perspective view of the internal structure of a power conversion apparatus according to the present embodiment.
Figure 6:
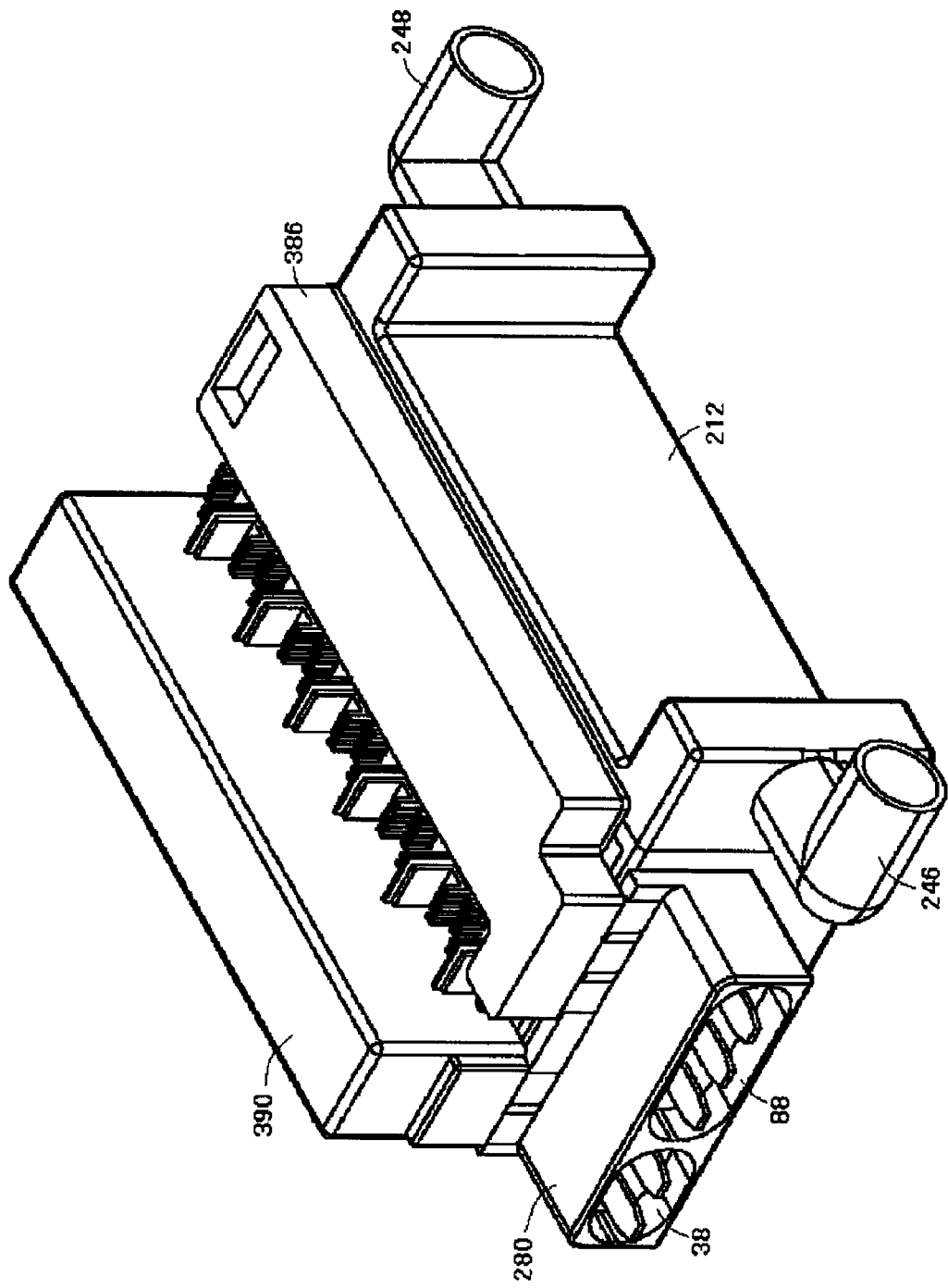
FIG. 6 is an oblique perspective view of a state in which an upper case is removed from the power conversion apparatus according to the present embodiment.
Figure 7:
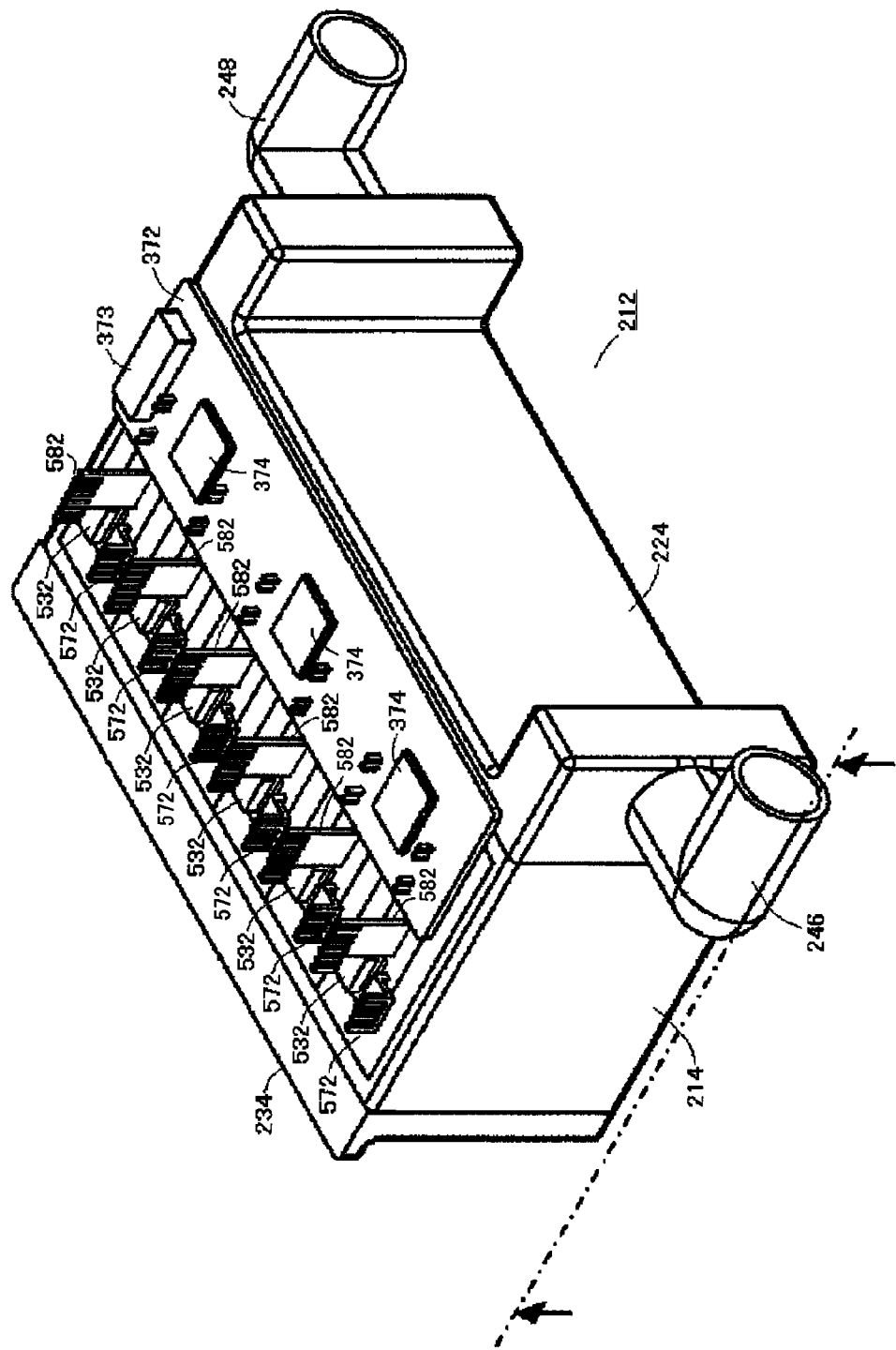
FIG. 7 is an oblique perspective view of a state in which an upper case, a capacitor, and a bus bar assembly are removed from the power conversion apparatus according to the present embodiment.

Next, a specific configuration of a power conversion apparatus having a cooling function according to the embodiment of the present invention will be described while referring to FIG. 4 to FIG. 7. FIG. 4 is a view that illustrates the external shape of the power conversion apparatus according to the embodiment of the present invention. FIG. 5 is an exploded view that gives a perspective view of the internal structure of the power conversion apparatus according to the present embodiment. FIG. 6 is an oblique perspective view of a state in which an upper case is removed from the power conversion apparatus according to the present embodiment. FIG. 7 is an oblique perspective view of a state in which an upper case, a control board 370 containing a control circuit 72, and a bus bar assembly are removed from the power conversion apparatus according to the present embodiment.

In the drawings, the power conversion apparatus 100 has a structure having a plurality of semiconductor modules 500 mounted in the channel case 212, and having a control board 372 on which driver ICs 374 are mounted and which has a driver circuit 74 built therein. Further, a capacitor module 390 (component corresponding to reference numeral 95 shown in FIG. 31) and a bus bar assembly 386 are mounted thereon, the structure comprises a connector portion 280 including the DC connector 38 and the AC connector 88 (see FIG. 2), has an inlet portion 246 and an outlet portion 248 of a channel, and is enclosed by the lower case 142, the upper case 112, and the cover 132. In this connection, the bus bar assembly 386 includes a direct current bus that connects the capacitor module 390 and the DC terminals and DC connector 38 of the semiconductor module 500, and an alternating current bus that connects the alternating current terminal 582 and the AC connector 88 of the semiconductor module 500.

Figure 8:
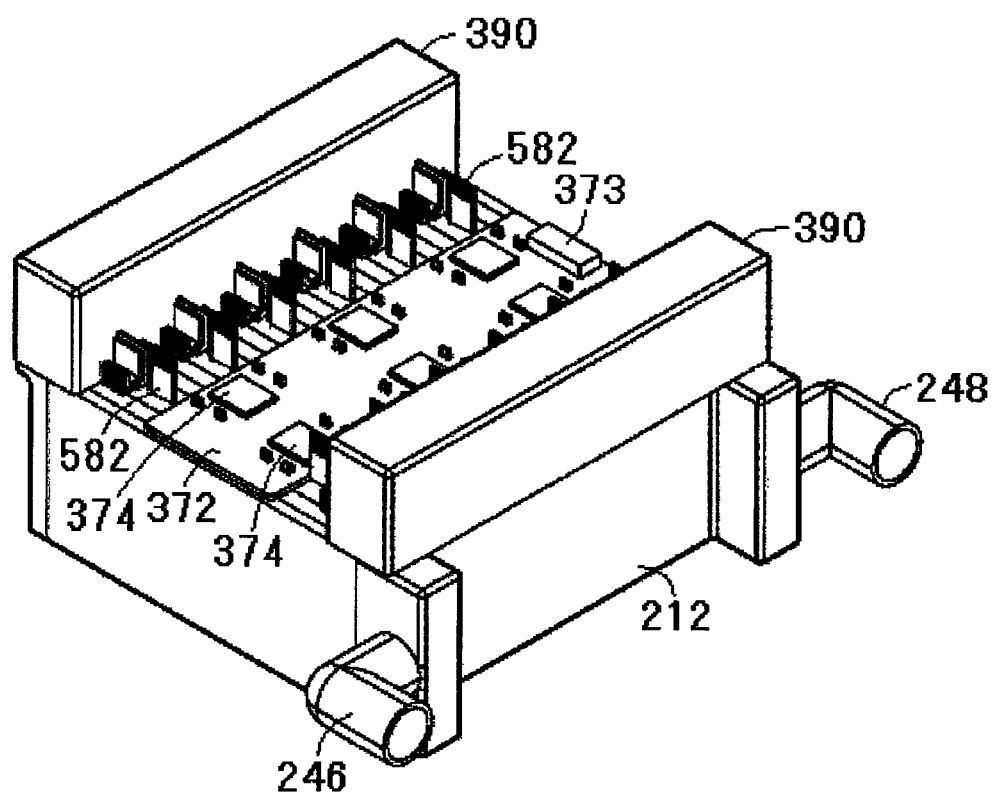
FIG. 8 is an oblique perspective view showing a configuration example of two inverter devices in the power conversion apparatus according to the present embodiment, which shows a state in which a bus bar assembly and an upper case are removed.

Referring to FIG. 7 and FIG. 8, the channel case 212 is broadly divided into a channel case main unit 214, a channel case front portion 224, and a channel case rear surface portion 234, and has the channel inlet portion 246 and the outlet portion 248. A control circuit connector 373 and a driver IC 374 are mounted on the control board 372. In the example shown in FIG. 7, the negative electrode terminal 572, the positive electrode terminal 532, and the alternating current terminal 582 of the semiconductor module are protruding, and the negative electrode and positive electrode terminals 572 and 532 are connected with a capacitor terminal of the capacitor module 390 (see FIG. 6 and FIG. 32). In the configuration example shown in FIG. 7, six upper and lower arm series circuits 50 (principal circuits of the semiconductor module 500) are loaded in correspondence with the circuit configuration of the inverter device 40 shown in FIG. 3. More specifically, two upper and lower arm series circuits are used for the respective U, V, and W phases of the motor to achieve a large capacity to the motor generator 92.

Figure 9:
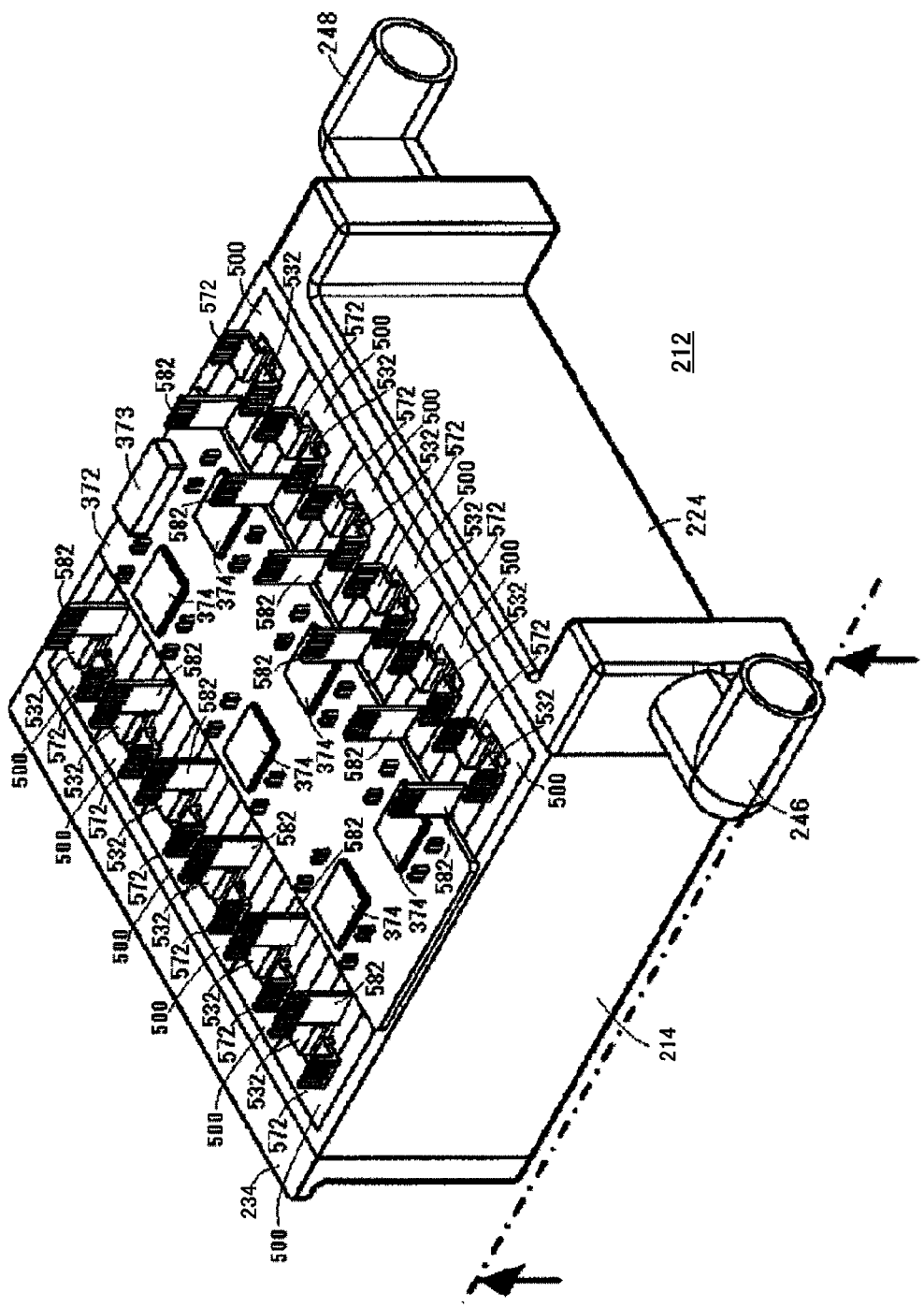
FIG. 9 is an oblique perspective view showing a configuration example of two inverter devices in the power conversion apparatus according to the present embodiment, which shows a state in which a bus bar assembly, an upper case, and a capacitor module are removed.
Figure 10:
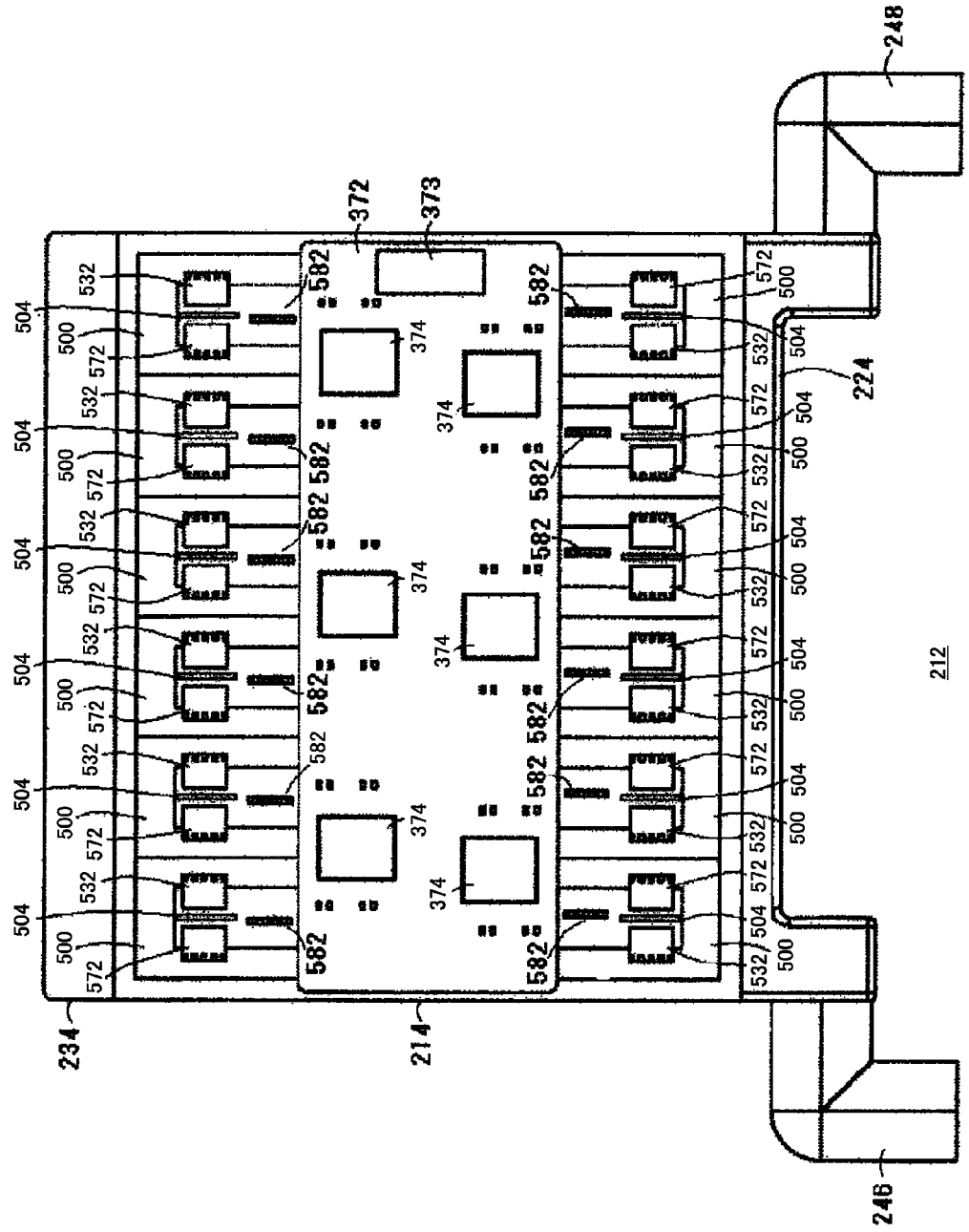
FIG. 10 is a plan view showing a configuration example of two inverter devices in the power conversion apparatus according to the present embodiment, which shows a state in which a bus bar assembly, an upper case, and a capacitor module are removed.

A configuration example in which another unit of the inverter device 40 shown in FIG. 3 is parallelly connected to the battery 36 and each inverter device is connected to respective motor generators to form an apparatus in which two inverter devices supplying power to two motor generators are housed in one channel case 212 is shown in FIG. 8, FIG. 9, and FIG. 10. In this connection, the configuration example shown in FIG. 8, FIG. 9, and FIG. 10 is not limited to a power supply to two motor generators. FIG. 8 is an oblique perspective view showing a configuration example of two inverter devices in the power conversion apparatus according to the present embodiment, which shows a state in which the control board 370 containing the control circuit 72, the bus bar assembly, and the upper case are removed. FIG. 9 is an oblique perspective view showing a configuration example of two inverter devices in the power conversion apparatus according to the present embodiment, which shows a state in which the control board 370 containing the control circuit 72, the bus bar assembly, the upper case and the capacitor module are removed. FIG. 10 is a plan view showing a configuration example of two inverter devices in the power conversion apparatus according to the present embodiment, which shows a state in which the control board 370 containing the control circuit 72, the bus bar assembly, the upper case and the capacitor module are removed. In this connection, in FIG. 8, a bus bar assembly 386 is disposed on an upper portion of the control board 372 and is disposed between the two sets of capacitor modules 390.

Referring to FIG. 8, FIG. 9, and FIG. 10, the two sets of semiconductor modules 500 are inserted into the channel case 212 in a state in which they are rotated 180 degrees. The capacitor modules 390 are also disposed in a state in which they are rotated 180 degrees. The control board 372 having the in-built driver circuit 74 comprises a singe board that is disposed between each set of semiconductor modules 500. It is also possible to provide only one of the control circuit connector 373 as a common component for the two sets of semiconductor modules. The upper and lower arms of each phase are driven with a single driver IC 374, and each phase is configured by two series circuits in which the upper and lower arms are parallelly connected (see FIG. 3). Concurrent control signals are supplied to the parallelly connected upper and lower arm series circuits from the single driver IC 374.

The control board having the driver circuit is disposed at a position on the opposite side to the capacitor module 390 with respect to the alternating current terminal, and the control terminal of the semiconductor switching device comprising upper and lower arms is disposed at a position on the opposite side to the capacitor module with respect to the alternating current terminal. According to this configuration, the electrical connection between the capacitor module 390 and the semiconductor modules and the electrical connection relationship between the control terminal and the control board 372 having the driver circuit 74 are in an orderly state, leading to reduction in the size of the power conversion apparatus.

Further, in the power conversion apparatus having two inverter devices, by disposing the control board 372 having a driver circuit 74 in the center as shown in FIG. 10, it is possible to provide two driver circuits 74 for controlling two inverter devices on a single control board 372, leading to a reduction in the size of the power conversion apparatus and also improvement in productivity.

Next, the method of loading semiconductor modules into a channel case according to the power conversion apparatus of the present embodiment and the situation regarding the cooling water flow in the channel case in which semiconductor modules are loaded will be described referring to FIG. 11 to FIG. 17.

Figure 11:
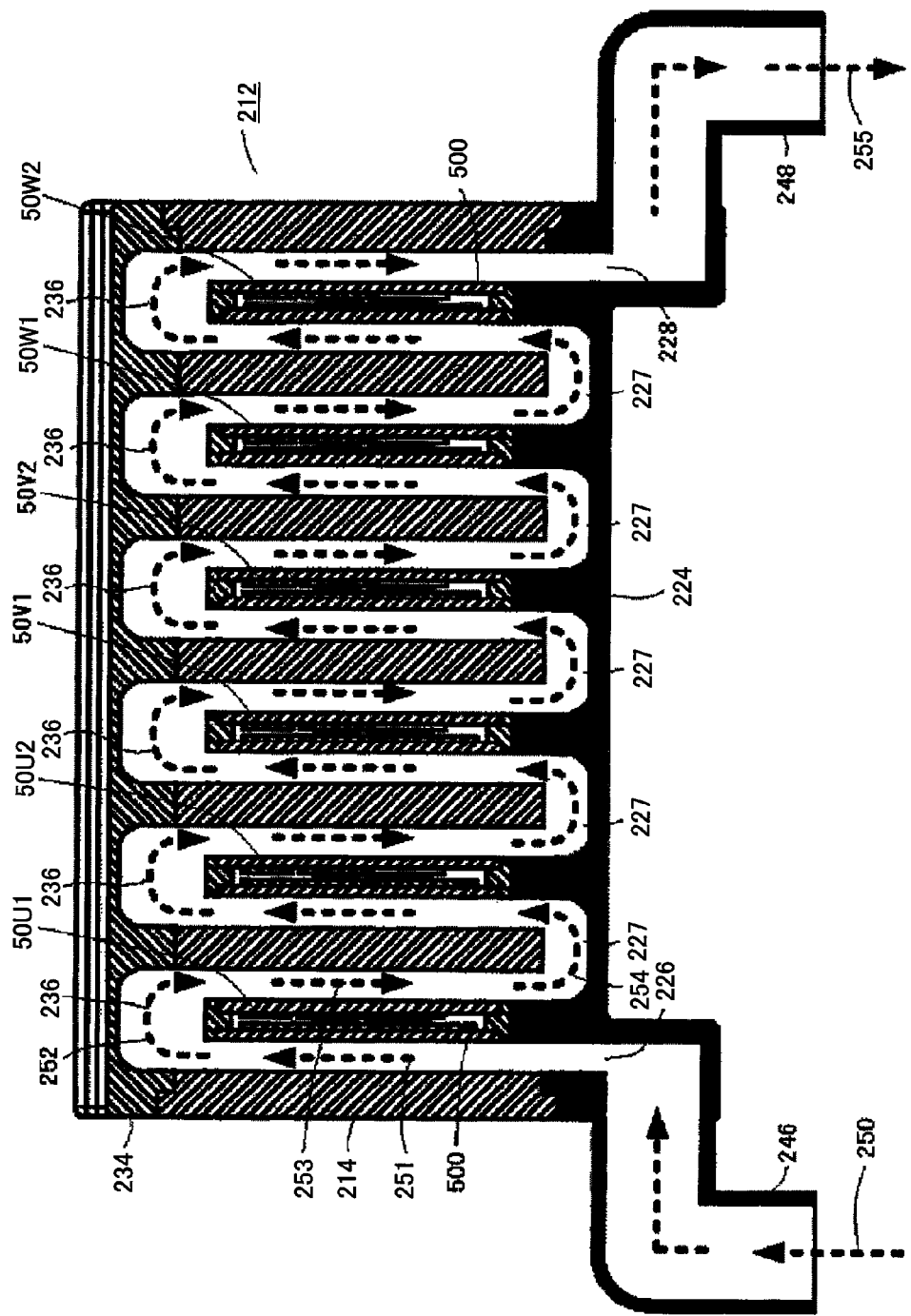
FIG. 11 is a sectional view that illustrates the flow of cooling water in a channel case in which semiconductor modules are loaded that relates to the present embodiment.
Figure 12:
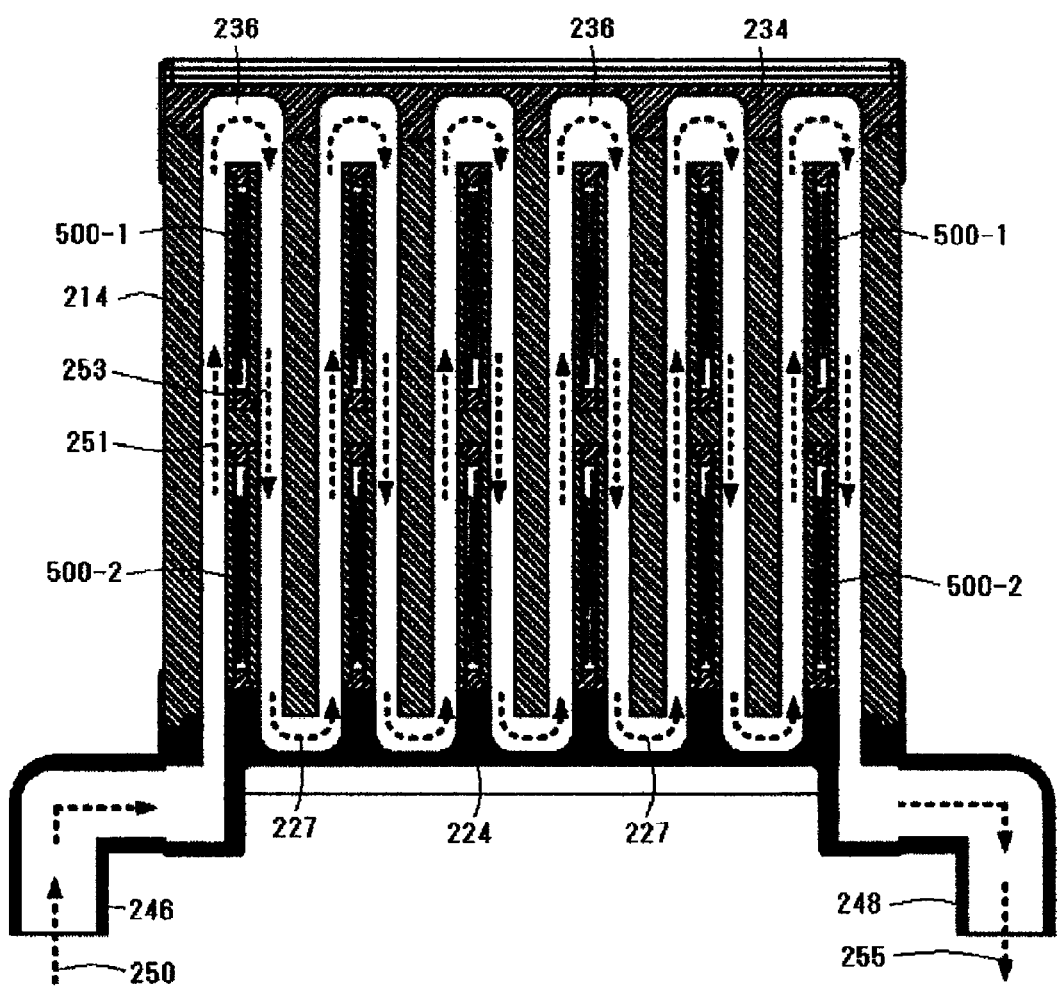
FIG. 12 is a sectional view showing the flow of cooling water in a channel case in which semiconductor modules are loaded for the two inverter devices shown in FIG. 9.
Figure 13:
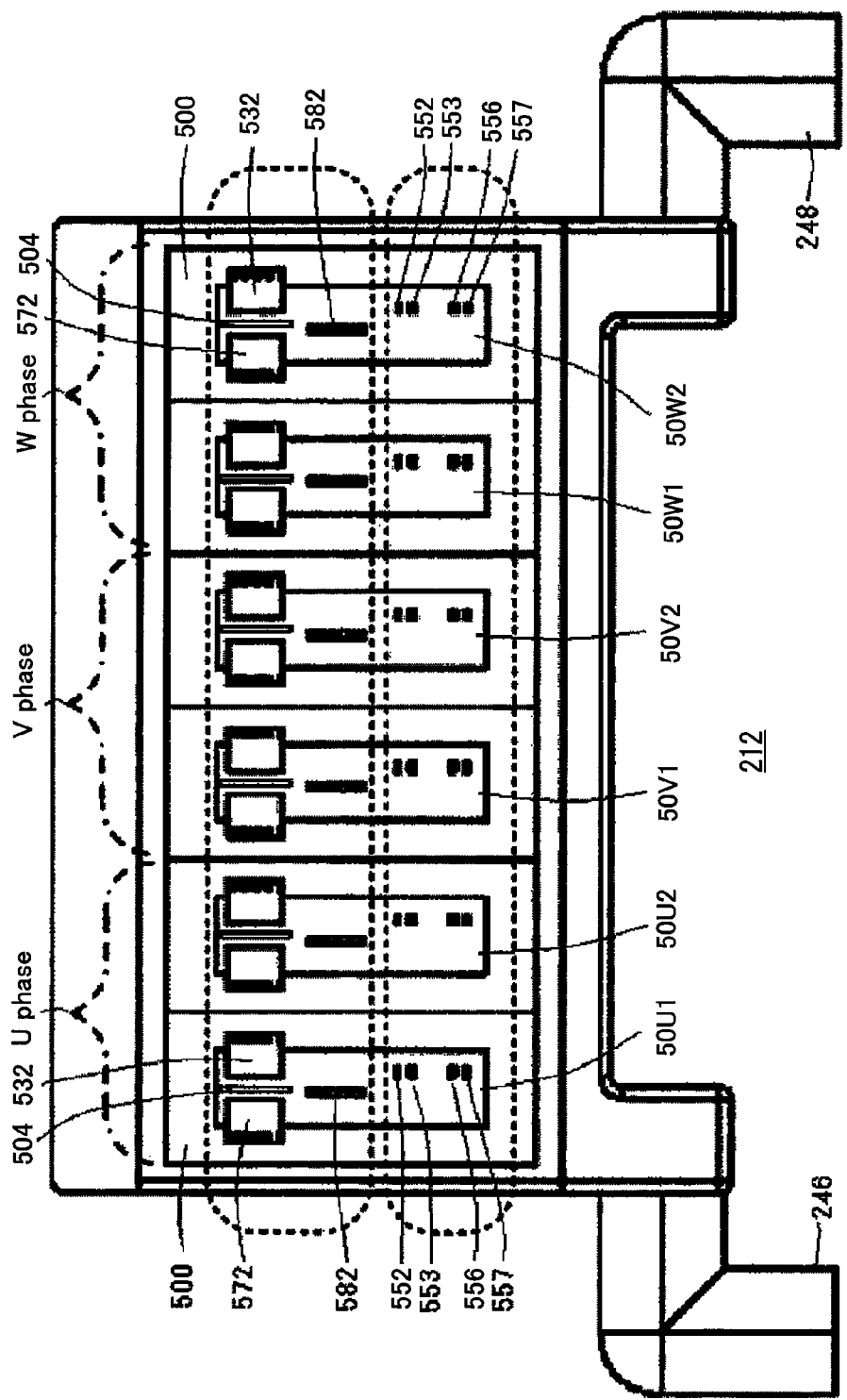
FIG. 13 is a plan view that shows the disposition situation in a channel case of a positive electrode terminal, a negative electrode terminal, an alternating current terminal, a signal terminal, and a gate terminal of semiconductor modules that are parallelly connected for each phase to a motor shown in FIG. 3.
Figure 14:
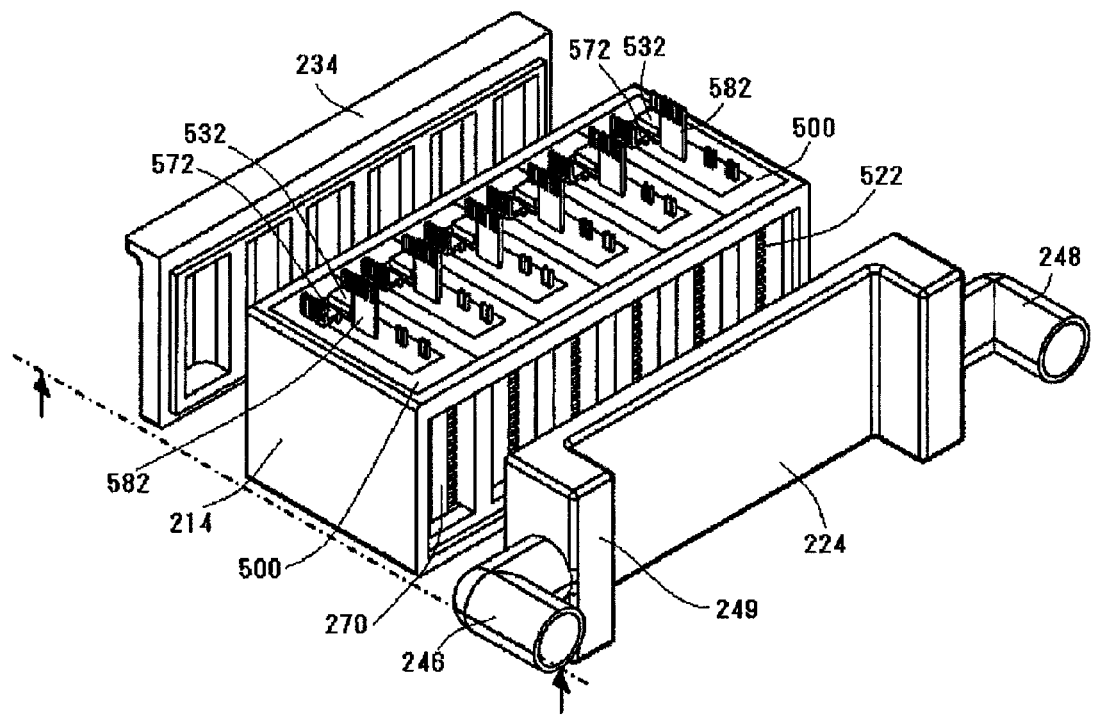
FIG. 14 is an oblique perspective view that illustrates a channel case main unit in which semiconductor modules are loaded, a channel case front surface portion, and a channel case rear surface portion.
Figure 15:
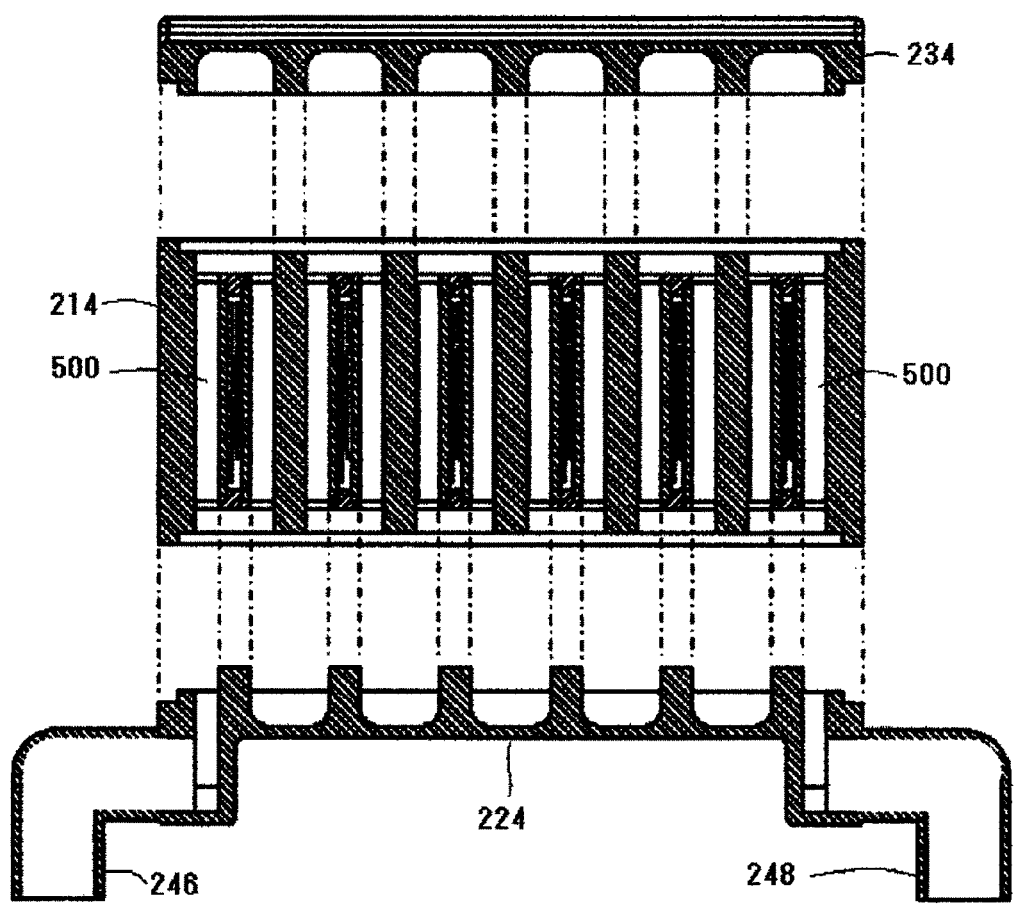
FIG. 15 is a sectional view that illustrates a channel case main unit in which semiconductor modules are loaded, a channel case front surface portion, and a channel case rear surface portion.
Figure 16:
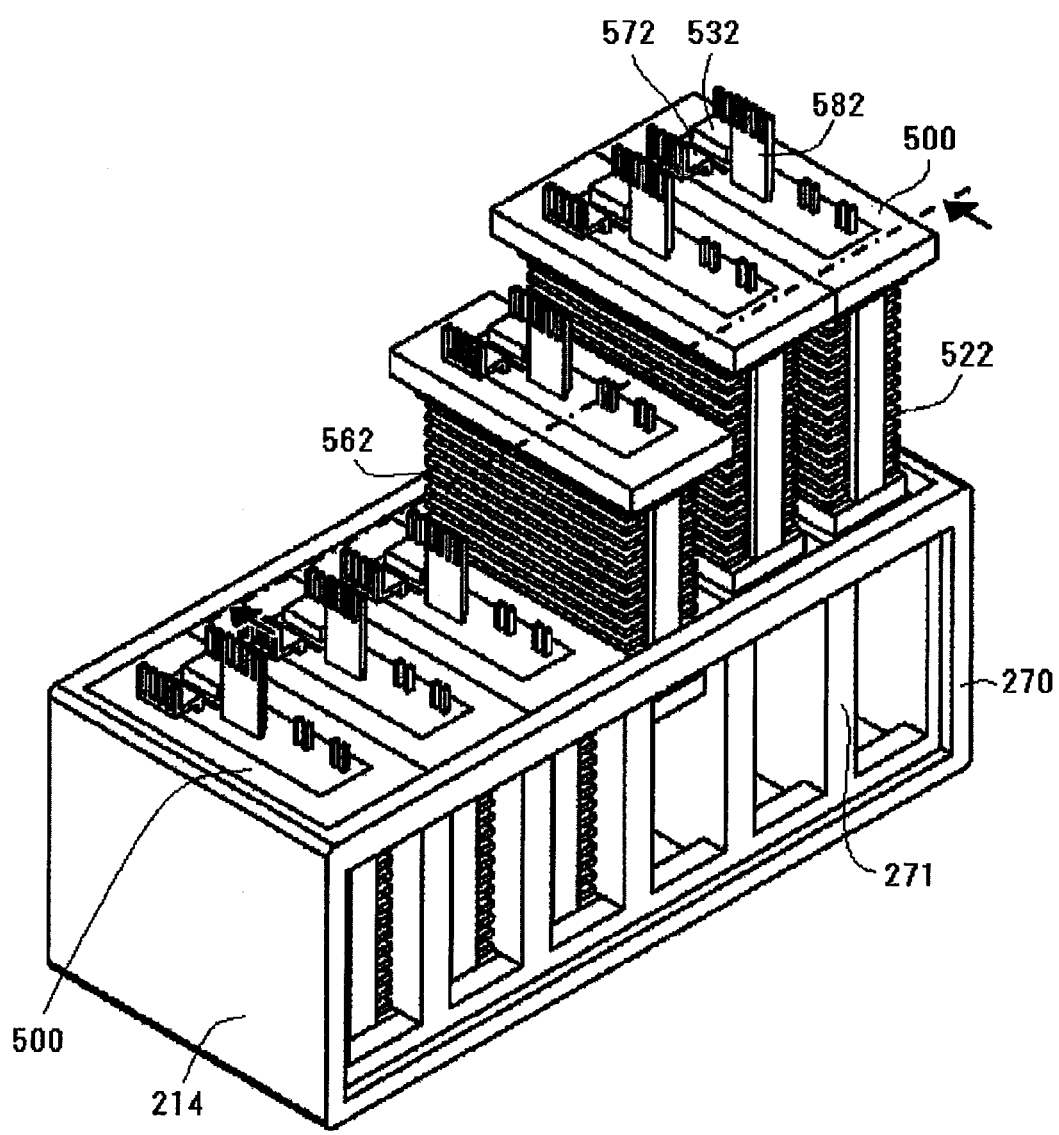
FIG. 16 is an oblique perspective view that illustrates a state in which semiconductor modules are being loaded in a channel case main unit.
Figure 17:
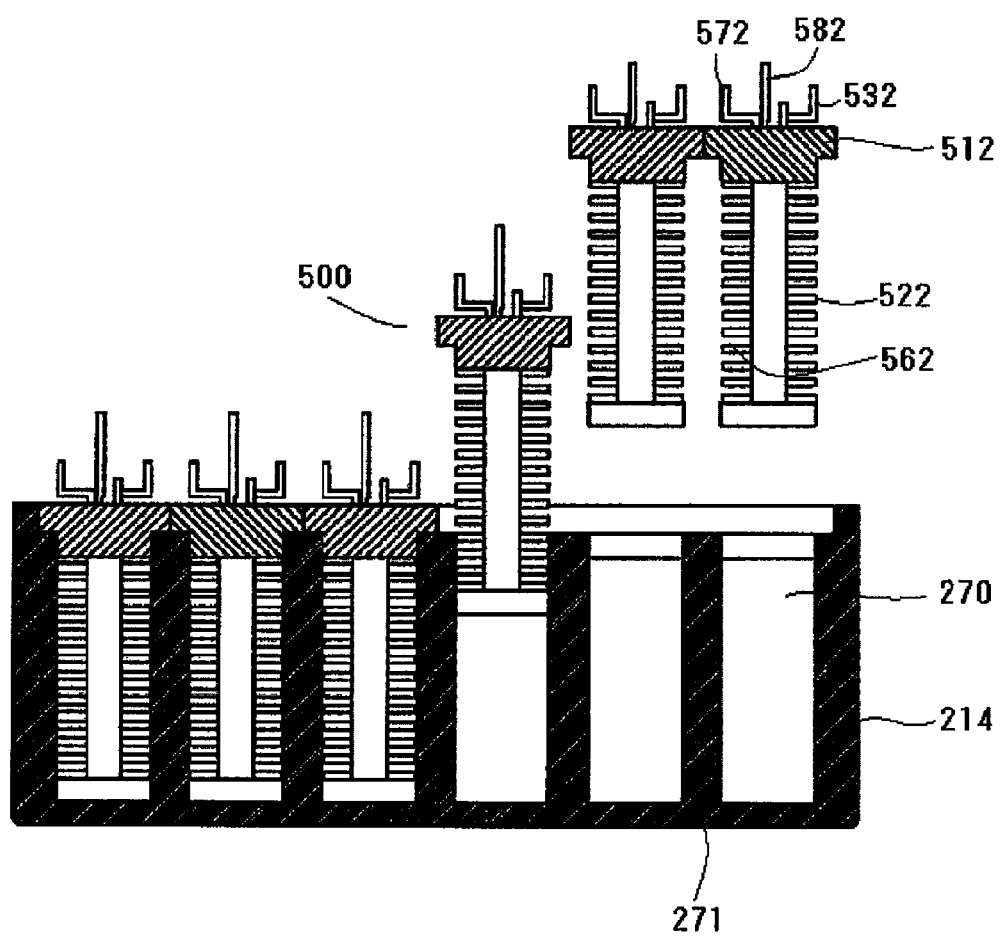
FIG. 17 is a front view that illustrates a state in which semiconductor modules are being loaded in a channel case main unit.

FIG. 11 is a sectional view that illustrates the flow of cooling water in a channel case in which semiconductor modules are loaded that relates to the present embodiment. FIG. 12 is a sectional view showing the flow of cooling water in a channel case in which semiconductor modules are loaded with respect to the two inverter devices shown in FIG. 9. FIG. 13 is a plan view that shows the disposition situation in a channel case of a positive electrode terminal, a negative electrode terminal, an alternating current terminal, a signal terminal, and a gate terminal of semiconductor modules that are parallelly connected for each phase to the motor generator shown in FIG. 3. FIG. 14 is an oblique perspective view that illustrates a channel case main unit in which semiconductor modules are loaded, a channel case front surface portion, and a channel case rear surface portion. FIG. 15 is a sectional view that illustrates a channel case main unit in which semiconductor modules are loaded, a channel case front surface portion, and a channel case rear surface portion. FIG. 16 is an oblique perspective view that illustrates a state in which semiconductor modules are being loaded in the channel case main unit. FIG. 17 is a front view that illustrates a state in which semiconductor modules are being loaded in the channel case main unit.

In FIG. 11 and FIG. 12, reference numeral 212 denotes a channel case, reference numeral 214 denotes a channel case main unit, reference numeral 224 denotes a channel case front portion, reference numeral 226 denotes a front portion inlet channel, reference numeral 227 denotes a front portion loopback channel, reference numeral 228 denotes a front portion outlet channel, reference numeral 234 denotes a channel case rear surface portion, reference numeral 236 denotes a rear surface portion loopback channel, reference numeral 246 denotes an inlet portion, reference numeral 248 denotes an outlet portion, and reference numerals 250 to 255 denote water flows.

As shown in FIG. 6 and FIG. 14 that is described later, a front portion inlet channel 226 and a front portion outlet channel 228 are provided between the inlet portion 246 and outlet portion 248 and the main unit 214 linking these (see FIG. 11), and the channel height of these channels 226 and 228 corresponds to the height of the semiconductor module 500 (see water conveyance portion 249 in FIG. 14). Accordingly, the height of the water flow 250 from the inlet portion 246 increases in the front portion inlet channel 226, and water flows across the total height of the heat radiating fins 522 and 526 of the semiconductor modules 500 loaded in the main unit 214. The water flow indicated by reference numerals 251, 236, 253, and 227 shown in FIG. 11 will now be described. The cooling water flows across the total height of the heat radiating fins (B side) 562 of the semiconductor module 500 (water flow 251), passes through the loopback channel 236 of the rear surface portion 234, flows across the total height of the heat radiating fins (A side) (water flow 253), and passes through the loopback channel 227 of the front portion 224 to flow to the next semiconductor module 500. Thus, the semiconductor modules 500 are subjected to two-sided cooling.

FIG. 12 illustrates a structure in which, as shown in FIG. 9 and FIG. 10, semiconductor modules for two inverter devices are loaded in a single channel case and cooled. In FIG. 12, six semiconductor modules 500-1 are used for one of the inverter devices and six semiconductor modules 500-2 are used for the other of the inverter devices. As shown in FIG. 12, the semiconductor modules 500-1 and 500-2 are arranged in a cascade manner along the direction of the water flows 251 and 253 of the channel case main unit 214.

According to the present embodiment a structure is adopted in which an opening that communicates with the channel is provided in the channel case 212, and the semiconductor modules 500 are inserted into the opening. It is thereby possible to produce the semiconductor modules 500 on an electronic circuit production line and then fix the semiconductor modules 500 in the channel case after undergoing the necessary inspections. This leads to an improvement in productivity as well as an improvement in reliability.

Further, a cooling fin with a wide area is provided on both sides of the semiconductor modules 500, and the flow of a water flow is created with the cooling fins. More specifically, channels that flow in inverse directions are formed by inserting the semiconductor modules 500 into the channel, and the aforementioned cooling fins perform an action of not only dissipating heat but also creating laminar flows in inverse directions, and act to form channels. The channel case is made, for example, by die casting, and a wide section of the channel is formed by the fins of the above described semiconductor modules 500. Accordingly, productivity improves.

Channels that flow in inverse directions are formed by inserting the semiconductor modules 500 into the channel, and the channel sectional area narrows. If it is assumed that the amount of feeding water is the same, the flow rate is increased by making the sectional area smaller. Thus, the cooling efficiency increases.

FIG. 14 illustrates a situation in which all of six semiconductor modules 500 are loaded in a channel case in a case in which the semiconductor modules are parallelly connected with respect to each phase to a motor generator (see the circuit configuration shown in FIG. 3). FIG. 16 and FIG. 17 illustrate a situation in which the semiconductor modules 500 are loaded in sequence into the main unit 214 of the channel case 212. The channel case main unit 214 comprises partition walls 271 that separate a channel forming portion 270 and a channel forming portion 270. The semiconductor modules 500 are loaded into the channel forming portions 270 from above. An adhesive is applied onto an upper edge portion of the top case 512 of the semiconductor module 500 and/or the channel forming portion 270 to fix these two components. As shown in the figure, since the channel forming portion 270 and the heat radiating fins 522 and 562 of the semiconductor module 500 are substantially the same size, the cooling water flows along the recesses in the fins.

As shown in FIG. 14, following the channel inlet portion 246, the front portion 224 of the channel case 212 comprises a water conveyance portion 249 that has substantially the same bulk as the channel forming portion 270 of the main unit 214 (see FIG. 16). By means of this water conveyance portion 249, a substantially uniform water flow is formed across the entire height of the semiconductor module 500.

As shown in FIG. 14 and FIG. 15, by dividing the channel case 212 into the main unit 214, the front portion 224, and the rear surface portion 234, the main unit has a shape in which spaces to become channels open to the front surface side and the rear surface side, and a die casting manufacturing process using aluminum as a material is possible. A die casting manufacturing process can also be used for the front portion 224 and the rear surface portion 234, and thus productivity improves.

FIG. 13 shows the structure of the arrangement with respect to the channel case 212 for the six semiconductor modules 500 in a case in which the semiconductor modules are parallelly connected for each phase to the motor generator (see circuit configuration of FIG. 3). The upper and lower arm series circuits 50 shown in FIG. 3 are arranged as shown in the figure as circuits 50U1 and 50U2 for the U-phase, circuits 50V1 and 50V2 for the V-phase, and circuits 50WU1 and 50W2 for the W-phase. As shown in FIG. 31 and FIG. 32, the capacitor terminals 96 of the capacitor module are disposed in the same direction as the arrangement direction of the positive electrode terminal 532 and the negative electrode terminal 572 of the semiconductor module 500. Since the terminals of the semiconductor module and the capacitor module are directly coupled, parasitic inductance becomes low and uniform so that each semiconductor module operates uniformly and stably.

It is also important to make the electrical characteristics of the plurality of upper and lower arm series circuits constituting the U-, V-, and W-phases as equal as possible. For example, it is important to make the electrical characteristics of the direct circuits 50U1 and 50U2 constituting the U-phase circuits the same as much as possible. According to the present embodiment, the capacitor module is fixed to face in the same direction with respect to the arrangement of the DC terminals 572 and 532 with the semiconductor module 500 forming the direct circuit 50U1 and the semiconductor module 500 forming the direct circuit 50U2, and the physical relation between the terminals of the semiconductor module forming the direct circuit 50U1 and the terminals of the capacitor module that are connected thereto is the same as the relation between the terminals of the semiconductor module forming the direct circuit 50U2 and the terminals of the capacitor module that are connected thereto. It is thus possible to make the electrical characteristics substantially equal between the direct current circuits 50U1 and 50U2 that are parallelly connected by providing the capacitor terminals and disposing the capacitor module along the direction in which the DC terminals are aligned.

Although according to the present embodiment a structure in which terminals of the semiconductor modules and terminals of the capacitor module are directly connected is the most preferable structure, these terminals need not always be directly connected. For example, inductance can also be suppressed to quite a low level by connecting the terminals via a connection conductor having a shape in which a positive electrode conductor and a negative electrode conductor face each other in proximity, such as a direct current bus bar.

Further, the group of terminals 552, 553, 556, and 557 for control or detection are arranged so as to directly couple with the control board 372 shown in FIG. 7. Accordingly, fluctuation components for each phase that are caused by the wiring between the semiconductor modules 500 and the control circuit and driver circuit inside the control board 372 become smaller and uniform. Furthermore, even when adding another semiconductor module 500 for each phase for which two semiconductor modules 500 are parallelly connected to thereby parallelly connect three semiconductor modules 500, it is sufficient to merely dispose the third semiconductor module 500 to form a side by side arrangement in FIG. 13, and thus the structure has excellent applicability with respect to providing additional semiconductor modules 500.

Figure 36:
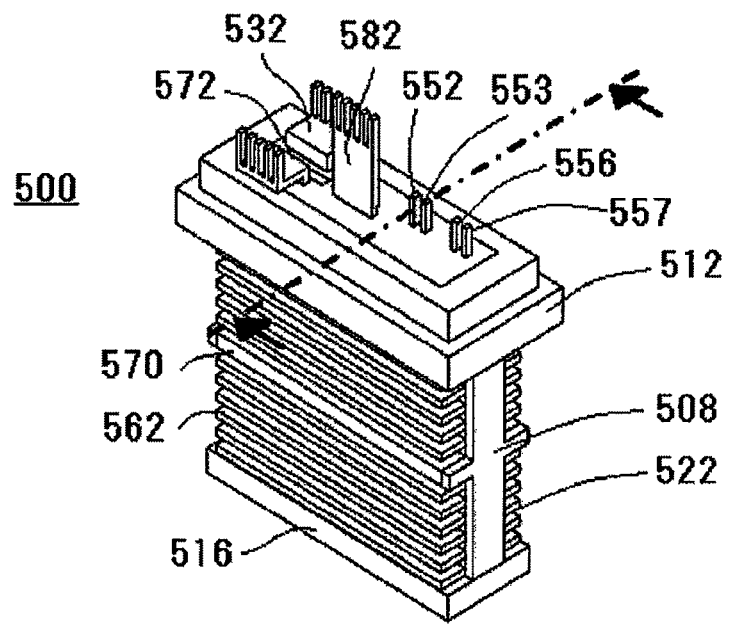
FIG. 36 is an oblique perspective view that shows another configuration example of a semiconductor module relating to the present embodiment.
Figure 37:
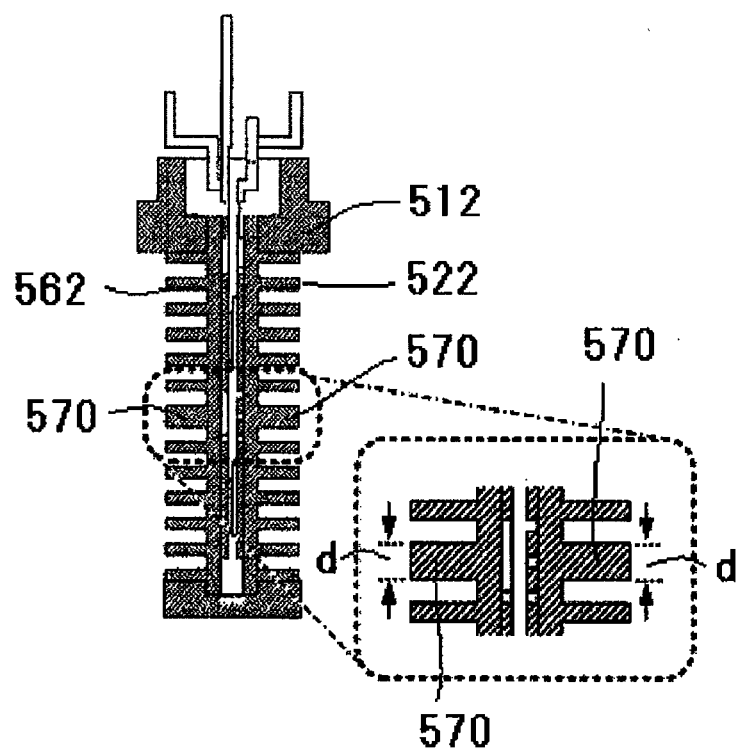
FIG. 37 is a sectional view that shows another configuration example of a semiconductor module relating to the present embodiment, which is a view as seen from the dotted-line arrows shown in FIG. 36.
Figure 38:
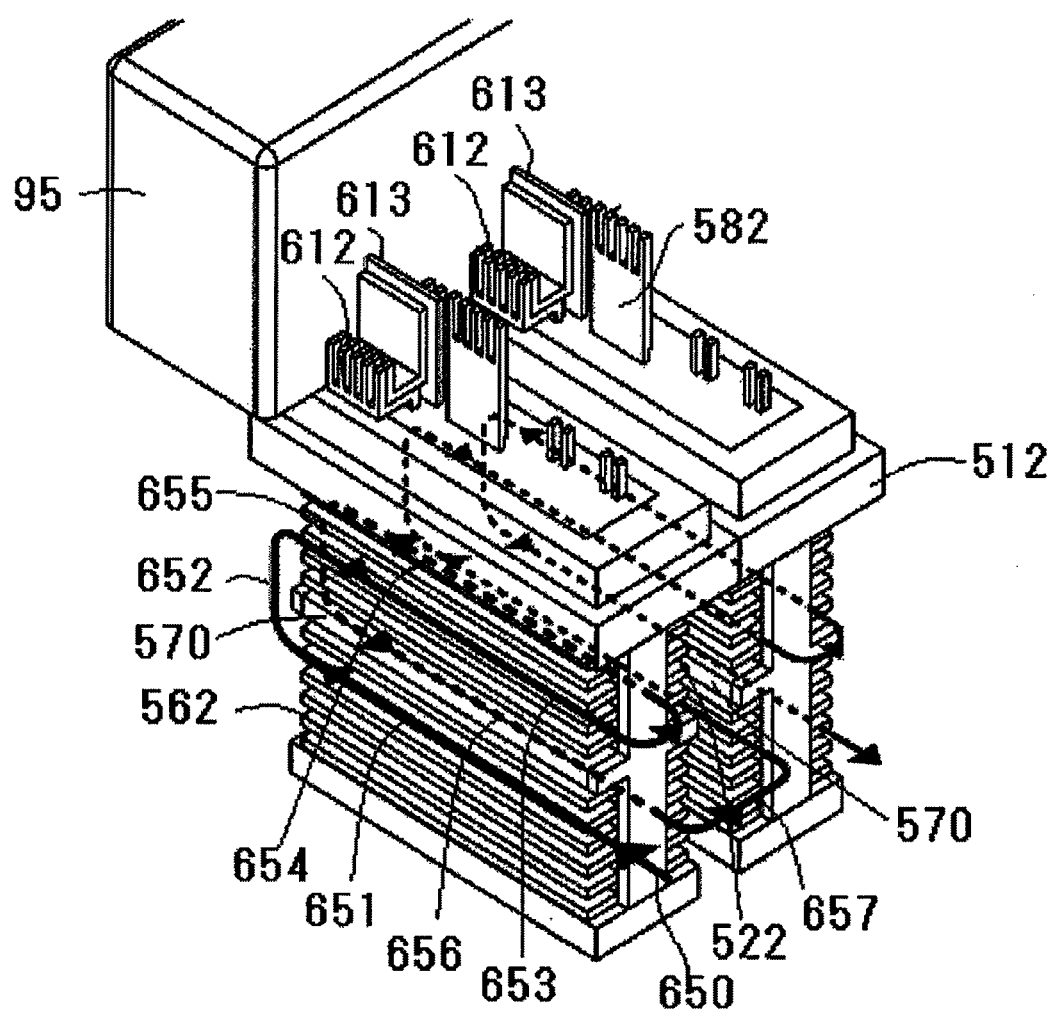
FIG. 38 is an oblique perspective view that illustrates the flow of cooling water in another configuration example of the semiconductor module relating to the present embodiment.
Figure 39:
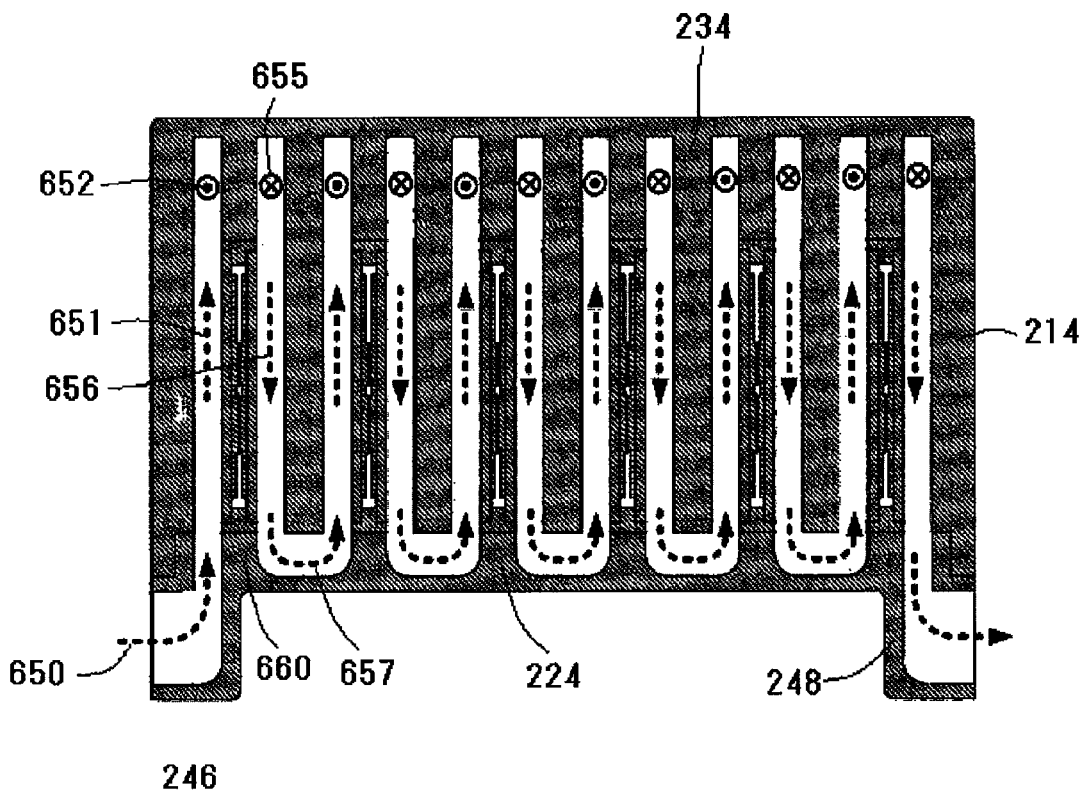
FIG. 39 is a sectional view that illustrates the flow of cooling water in a case in which another configuration example of the semiconductor module relating to the present embodiment is loaded in a water-cooled case.
Figure 40:
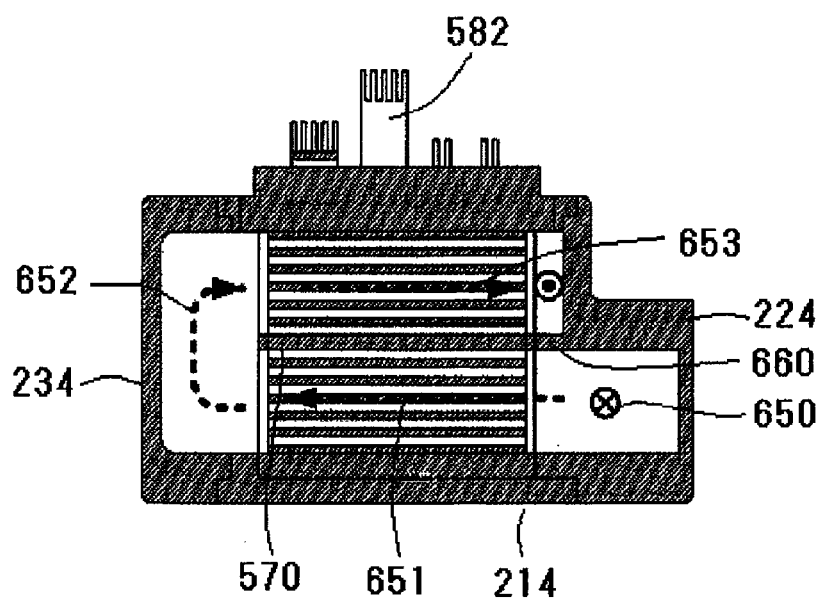
FIG. 40 is another sectional view showing the flow of cooling water of two upper and lower tiers in a case in which another configuration example of the semiconductor module relating to the present embodiment is loaded in a water-cooled case.

Another configuration example and cooling structure of the semiconductor module relating to the present embodiment will now be described referring to FIG. 36 to FIG. 40. FIG. 36 is an oblique perspective view that shows another configuration example of the semiconductor module relating to the present embodiment. FIG. 37 is a sectional view that shows the other configuration example of the semiconductor module relating to the present embodiment, which is a view seen from the dotted-line arrows that are shown in FIG. 36. FIG. 38 is an oblique perspective view that illustrates the flow of cooling water in the other configuration example of the semiconductor module relating to the present embodiment. FIG. 39 is a sectional view that illustrates the flow of cooling water in a case in which the other configuration example of the semiconductor module relating to the present embodiment is loaded in a water-cooled case. FIG. 40 is another sectional view showing the flow of cooling water of two upper and lower tiers when the other configuration example of the semiconductor module relating to the present embodiment is loaded in the water-cooled case.

The structure of the heat radiating fins in the semiconductor module 500 shown in FIG. 36 and FIG. 37 differs in comparison to the semiconductor module 500 shown in FIG. 18. More specifically, thick center fins 570 of a thickness d are provided in the center of the heat radiating fins (A side) 522 and the heat radiating fins (B side) 562. The position of the center fins 570 separates the upper arm chip 52 and 56 and the lower arm chips 62 and 66 into upper and lower, and by providing the center fins 570 a function is performed that separates the water flow into two upper and lower tiers (as an example, the thickness d is approximately 1.5 to 2 times the thickness of the other fins).

FIG. 38 schematically shows the flow of cooling water in the heat radiating fins of two semiconductor modules 500. A water flow 650 from a channel inlet portion 246 (see FIG. 39) only flows into a lower tier portion (lower half from the center fins 570) of the heat radiating fins (B side) 562 of the first semiconductor module to form a water flow 651. Next, it becomes an upward water flow 652 on the channel case rear surface portion 234 to form a water flow 653 on an upper tier portion (upper half from the center fins 570) on the side of the same heat radiating fins (B side) 562. Subsequently, the direction of the water flow at the channel case front portion 224 is changed to form a water flow 654 on the upper tier portion of the heat radiating fins (A side) 522. Thereafter, the flow becomes a downward flow 655 at the rear surface portion 234 to form a water flow 656 of a lower tier portion of the same heat radiating fins (A side) 522, and then the direction of the water flow 57 is changed at the front portion 224 to perform cooling of the next semiconductor module 500.

As will be understood from the structure illustrated in FIG. 39 and FIG. 40, the reason the water flow 651 is only formed on the lower tier portion of the heat radiating fins (B side) of the semiconductor module at the channel inlet portion 246 and does not flow into the upper tier portion is because a guide portion 660 is provided in an extended condition in the inlet portion 246 of the channel case front portion 224. Further, isolation of the water flows flowing through the lower tier portion and the upper tier portion is achieved because of the tightness between the thickness d of the center fins 570 and, the wall surface of the main unit 214 or the partition wall 271 (see FIG. 17).

The cooling effect achieved in a case in which the other configuration example of the semiconductor module 500 that is shown in FIG. 36 is loaded into the channel case shown in FIG. 39 and FIG. 40 to constitute a power conversion apparatus is described below. The cooling effect will be described in comparison with the flow path of cooling water in the channel case shown in FIG. 14 (flow path formed in correspondence with the total height of the heat radiating fins of the semiconductor module). As shown in FIG. 38, the flow path sectional area is substantially halved by causing the cooling water to flow separately on the upper tier portion and the lower tier portion of the heat radiating fins. Assuming that the inflow amount of cooling water that flows into the inlet portion 246 of the channel case 212 is constant (because of the large capacity of the inflow source of the cooling water), the flow rate of the cooling water that passes through the upper tier portion or lower tier portion of the heat radiating fins substantially doubles. When the flow rate quickens, the amount of heat absorbed from the heat radiating fins by the cooling water also increases in correspondence to the flow rate (the amount of heat absorbed by the cooling water increases almost proportionally to the side of the flow rate in a certain flow rate range). More specifically, by employing a semiconductor module having the center fins 570 shown in FIG. 36 and forming a flow path of cooling water by temporally separating the upper tier portion and the lower tier portion, the semiconductor module cooling effect increases substantially.

Since the channel case is separated into the main unit 214, the front portion 224, and the rear surface portion 234 as described in FIG. 39, production can be carried out using a die casting manufacturing process and thus productivity increases.

Figure 42:
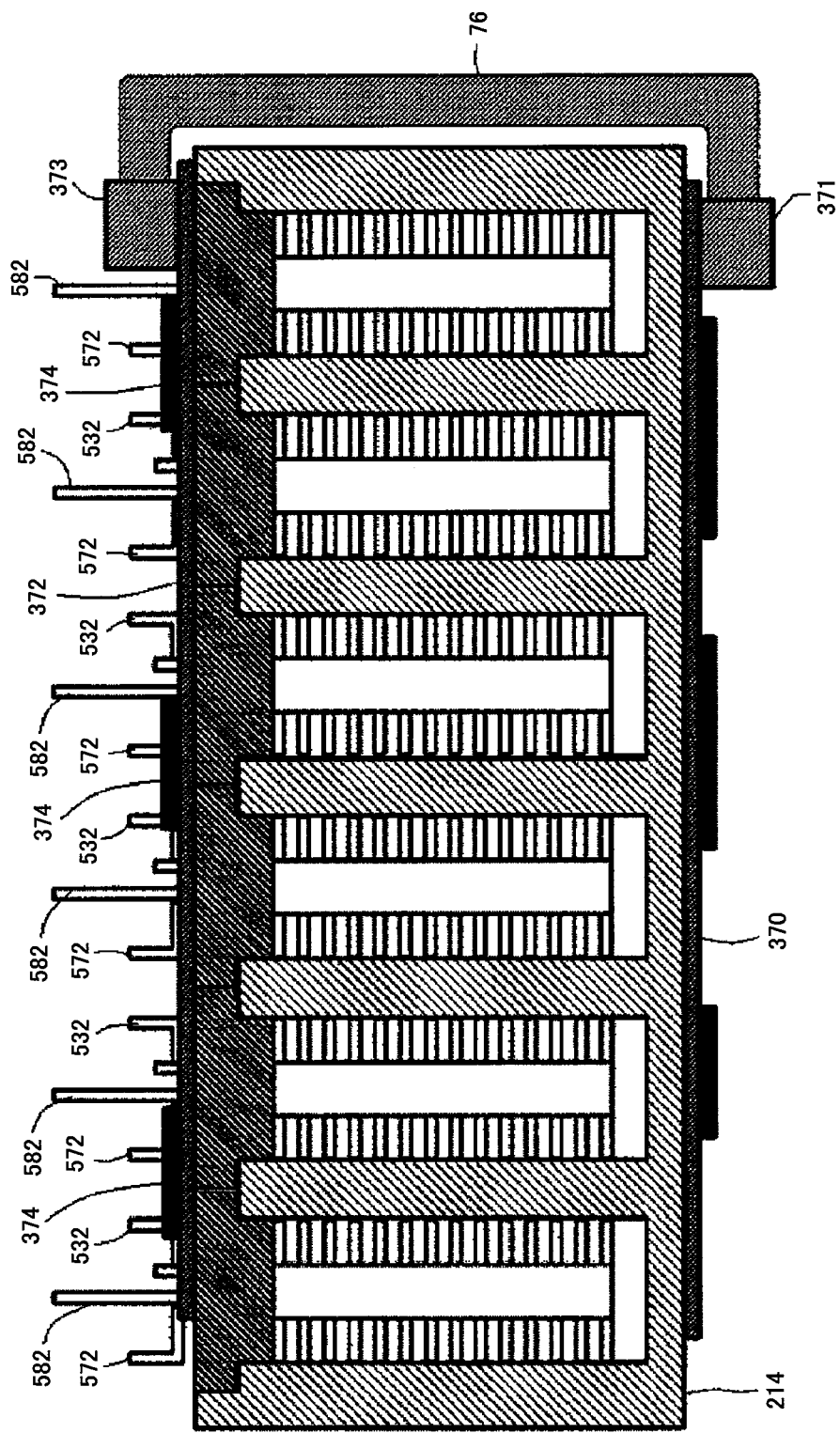
FIG. 42 is a view that shows a configuration in which a control board having a control circuit shown in FIG. 5 is disposed at the bottom of a channel case.

FIG. 42 is another embodiment of the structure shown in FIG. 5, in which the control board 370 shown in FIG. 5 is disposed at the bottom of the channel case. In FIG. 5, the control board 370 having the control circuit 72 is disposed under the cover 132 and a signal is sent from the connector 371 through the signal wire 76 to the control board 372 having the driver circuit 74. The control board 370 is cooled in the upper case.

In FIG. 42, the control board 370 having the control circuit 72 is disposed on the bottom of the channel case 214. By fixing the control board 370 to the bottom of the channel case, the arrangement cools the control board 370 while also utilizing the bottom space, and achieves a size reduction effect in addition to enhancing the cooling effect. Further, by disposing the control board 370 that is susceptible to noise since it has the control circuit 72, on the bottom of the channel case 214, a structure with high reliability with respect to noise also can be provided by disposing the terminals of the semiconductor modules 500 on one side of the channel case 214 and disposing the control board 370 on the other side thereof to sandwich the channel case 214 therebetween.

What is claimed is:

1. A power conversion apparatus, having:
a channel case having cooling channels;
a plurality of semiconductor modules having a DC positive electrode terminal, a DC negative electrode terminal, and an alternating current terminal; and
a capacitor module having a capacitor built therein, wherein:
in the channel case, a plurality of openings that respectively communicate with the cooling channels are formed;
the plurality of semiconductor modules are respectively inserted into the plurality of openings and disposed in the channel case;
the capacitor module is disposed on one side of the plurality of semiconductor modules such that a longitudinal side of the capacitor module becomes parallel to the arrangement direction of the plurality of semiconductor modules;
the capacitor module has a plurality of capacitor terminals disposed along the longitudinal side of the capacitor module; and
the DC positive electrode terminal and the DC negative electrode terminal of the semiconductor module are disposed closer to the capacitor module than the alternating current terminal and electrically connected, respectively, with the plurality of capacitor terminals.

2. The power conversion apparatus according to claim 1, wherein
the capacitor module is fixed in the channel case.

3. The power conversion apparatus according to claim 1, wherein;
the semiconductor module has built therein an upper and lower arm series circuit of an inverter circuit;
the semiconductor module further has a first heat radiating metal having a heat radiating surface that contacts with cooling water and radiates heat, a second heat radiating metal having a heat radiating surface that contacts with cooling water and radiates heat, an upper arm semiconductor chip and a lower arm semiconductor chip that constitute the upper and lower arm series circuit, and a plurality of conductor plates that face the first heat radiating metal or the second heat radiating metal via insulating members and transfer an electric current to the upper arm semiconductor chip and the lower arm semiconductor chip;
the DC positive electrode terminal is disposed on one side of the first heat radiating metal; and
the DC negative electrode terminal is disposed on the one side of the first heat radiating metal.

4. The power conversion apparatus according to claim 3, wherein
the cooling channel is formed such that flow directions of cooling water that comes into contact with the one surface of the first heat radiating metal and the one surface of the second heat radiating metal, respectively, are inverse directions.

\* \* \* \* \*